United States Patent
Hirukawa

(10) Patent No.: US 7,639,343 B2
(45) Date of Patent: Dec. 29, 2009

(54) EXPOSURE APPARATUS AND DEVICE MANUFACTURING METHOD

(75) Inventor: Shigeru Hirukawa, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/655,083

(22) Filed: Jan. 19, 2007

(65) Prior Publication Data

US 2007/0115447 A1    May 24, 2007

Related U.S. Application Data

(60) Division of application No. 11/147,285, filed on Jun. 8, 2005, which is a continuation of application No. PCT/JP03/15675, filed on Dec. 8, 2003.

(30) Foreign Application Priority Data

Dec. 10, 2002 (JP) ............................. 2002-358556

(51) Int. Cl.
G03B 27/42 (2006.01)
G03B 27/52 (2006.01)
G03B 27/58 (2006.01)
G03B 27/32 (2006.01)

(52) U.S. Cl. .............................. 355/53; 355/30; 355/72; 355/77

(58) Field of Classification Search .................. 355/30, 355/53, 72, 77
See application file for complete search history.

(56) References Cited

U.S. PATENT DOCUMENTS

| | | | |
|---|---|---|---|
| 3,648,587 A * | 3/1972 | Stevens | ......................... 355/44 |
| 4,346,164 A | 8/1982 | Tabarelli et al. | |
| 4,480,910 A | 11/1984 | Takanashi et al. | |
| 4,650,983 A * | 3/1987 | Suwa | ......................... 250/204 |
| 5,610,683 A | 3/1997 | Takahashi | |
| 5,715,039 A | 2/1998 | Fukuda et al. | |
| 5,825,043 A | 10/1998 | Suwa | |
| 7,075,616 B2 | 7/2006 | Derksen et al. | |
| 7,098,991 B2 | 8/2006 | Nagasaka et al. | |
| 2002/0020821 A1 * | 2/2002 | Van Santen et al. | ...... 250/492.2 |
| 2002/0163629 A1 | 11/2002 | Switkes et al. | |
| 2003/0030916 A1 | 2/2003 | Suenaga | |
| 2003/0174408 A1 | 9/2003 | Rostalski et al. | |

(Continued)

FOREIGN PATENT DOCUMENTS

DE    221 563 A1    4/1985

(Continued)

OTHER PUBLICATIONS

Emerging Lithographic Technologies VI, Proceedings of SPIE, vol. 4688 (2002), "Semiconductor Foundry, Lithography, and Partners", B.J. Lin, pp. 11-24.

(Continued)

*Primary Examiner*—Alan A Mathews
(74) *Attorney, Agent, or Firm*—Oliff & Berridge, PLC

(57) ABSTRACT

An exposure apparatus illuminates a pattern with an energy beam and transfers the pattern onto a substrate via a projection optical system. The exposure apparatus includes a substrate stage on which the substrate is mounted and that moves within a two-dimensional plane holding the substrate. In addition, a supply mechanism supplies liquid to locally fill a space between the projection optical system and the substrate on the substrate stage with the liquid, and a recovery mechanism recovers the liquid. A plate is provided in at least a part of the periphery of a mounted area of the substrate on the substrate stage. The plate has a surface arranged at substantially the same height as a surface of the substrate mounted on the substrate stage.

46 Claims, 17 Drawing Sheets

U.S. PATENT DOCUMENTS

| | | |
|---|---|---|
| 2004/0000627 A1 | 1/2004 | Schuster |
| 2004/0075895 A1 | 4/2004 | Lin |
| 2004/0109237 A1 | 6/2004 | Epple et al. |
| 2004/0114117 A1 | 6/2004 | Bleeker |
| 2004/0118184 A1 | 6/2004 | Violette |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2005/0018156 A1 | 1/2005 | Mulkens et al. |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0046934 A1 | 3/2005 | Ho et al. |
| 2005/0048223 A1 | 3/2005 | Pawloski et al. |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0094116 A1 | 5/2005 | Flagello et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0141098 A1 | 6/2005 | Schuster |
| 2005/0190455 A1 | 9/2005 | Rostalski et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2006/0114445 A1 | 6/2006 | Ebihara |
| 2006/0209414 A1 | 9/2006 | Van Santen et al. |

FOREIGN PATENT DOCUMENTS

| | | |
|---|---|---|
| DE | 224 448 A1 | 7/1985 |
| EP | 0 605 103 A1 | 7/1994 |
| EP | 0 834 773 A2 | 4/1998 |
| JP | A-57-153433 | 9/1982 |
| JP | A-58-202448 | 11/1983 |
| JP | A-59-19912 | 2/1984 |
| JP | A-62-65326 | 3/1987 |
| JP | A-63-157419 | 6/1988 |
| JP | A-4-305915 | 10/1992 |
| JP | A-4-305917 | 10/1992 |
| JP | A-5-62877 | 3/1993 |
| JP | A-5-304072 | 11/1993 |
| JP | A-6-124873 | 5/1994 |
| JP | A-6-168866 | 6/1994 |
| JP | A-7-220990 | 8/1995 |
| JP | A-8-316125 | 11/1996 |
| JP | A-10-255319 | 9/1998 |
| JP | A-10-303114 | 11/1998 |
| JP | A-10-340846 | 12/1998 |
| JP | A-11-176727 | 7/1999 |
| JP | A-2000-58436 | 2/2000 |
| WO | WO99/49504 | 9/1999 |
| WO | WO 02/091078 A1 | 11/2002 |
| WO | WO 03/077037 A1 | 9/2003 |
| WO | WO 03/085708 A1 | 10/2003 |
| WO | WO 2004/019128 A2 | 3/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/054953 A2 | 6/2005 |
| WO | WO 2005/054955 A2 | 6/2005 |
| WO | WO 2005/062128 A2 | 7/2005 |

OTHER PUBLICATIONS

Optical Microlithography XV, Proceedings of SPIE, vol. 4691 (2002), "Resolution Enhancement of 157 nm Lithography by Liquid Immersion", M. Switkes et al., pp. 459-465.

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

Nikon Corporation, Litho Forum, Jan. 28, 2004, "Update on 193 nm immersion exposure tool", S. Owa et al., 51 pages (slides 1-51).

Nikon Corporation, Immersion Lithography Workshop, Dec. 11, 2002, 24 pages (slides 1-24).

Nikon Corporation, Immersion Workshop, Jan. 27, 2004, "Update on 193 nm immersion exposure tool", S. Owa et al., 38 pages (slides 1-38).

Nikon Corporation, 3rd 157 nm symposium, Sep. 4, 2002, "Nikon F2 Exposure Tool", Soichi Owa et al., 25 pages (slides 1-25).

Optical Microlithography XVI, Proceedings of SPIE vol. 5040 (2003), "Immersion lithography; its potential performance and issues", Soichi Owa et al., pages 724-733.

Nikon Corporation, NGL Workshop, Jul. 10, 2003, :Potential performance and feasibility of immersion lithography, Soichi Owa et al., 33 pages, slides 1-33.

* cited by examiner

EXPOSURE APPARATUS AND DEVICE MANUFACTURING METHOD

CROSS-REFERENCE TO RELATED APPLICATIONS

This is a divisional of U.S. patent application Ser. No. 11/147,285 filed Jun. 8, 2005, which in turn is a continuation of International Application PCT/JP2003/015675, with an international filing date of Dec. 8, 2003. The disclosures of these applications are hereby incorporated herein by reference in their entireties.

BACKGROUND OF THE INVENTION

1. Field of the Invention

The present invention relates to exposure apparatus and device manufacturing methods, and more particularly to an exposure apparatus that is used in a lithographic process when manufacturing electronic devices such as a semiconductor or a liquid crystal display device, and a device manufacturing method that uses such an exposure apparatus.

2. Description of the Related Art

In a lithographic process to produce electronic devices such as a semiconductor (integrated circuit) or a liquid crystal display device, projection exposure apparatus are used that transfer an image of a pattern of a mask or a reticle (hereinafter generally referred to as a 'reticle') via a projection optical system onto shot areas on a wafer coated with a resist (photosensitive agent) or a photosensitive substrate such as a glass plate (hereinafter referred to as a 'glass plate' or a 'wafer'). Conventionally, the reduction projection exposure apparatus based on a step-and-repeat method (the so-called stepper) has been widely used as such a projection exposure apparatus; however, recently, the type of projection exposure apparatus that performs exposure while the reticle and the wafer are synchronously scanned (the so-called scanning stepper) is also drawing attention.

The resolution of the projection optical system installed in the projection exposure apparatus becomes higher when the exposure wavelength used is shorter or when the numerical aperture (NA) of the projection optical system is higher. Therefore, in order to cope with finer integrated circuits, the exposure wavelength used in a projection exposure apparatus is becoming shorter year by year and the numerical aperture of the projection optical system becoming higher. The wavelength widely used for exposure at present is 248 nm generated by the KrF excimer laser; however, the wavelength generated by the ArF excimer laser, 193 nm, which is shorter, has also been put to practical use.

In addition, when exposure is performed, depth of focus (DOF) is also equally important as resolution. Resolution R and depth of focus $\delta$ can be expressed as the following equations.

$$R = k_1 \cdot \lambda / NA$$

$$\delta = k_2 \cdot \lambda / NA^2$$

In this case, $\lambda$ is the exposure wavelength, NA is the numerical aperture of the projection optical system, and $k_1$ and $k_2$ are process coefficients. From equations (1) and (2), it can be seen that when exposure wavelength k is shortened and numerical aperture NA increased for a higher resolution R, depth of focus $\delta$ becomes narrower. In a projection exposure apparatus, however, because exposure is performed in an auto-focus method where the surface of the wafer is adjusted so that it matches the image plane of the projection optical system, a wide depth of focus $\delta$ is preferable to some extent. Therefore, proposals for substantially widening the depth of focus have been made in the past, such as the phase shift reticle method, the modified illumination method, and the multiplayer resist method.

As is described above, in the conventional projection exposure apparatus, depth of focus is becoming narrower due to shorter wavelength of the exposure light and larger numerical aperture of the projection optical system. And, in order to cope with higher integration of the integrated circuits, it is certain that the exposure wavelength will become much shorter in the future; however, in such a case, the depth of focus may become too narrow so that there may not be enough margin during the exposure operations.

Accordingly, a proposal on an immersion method has been made as a method for substantially shortening the exposure wavelength while enlarging (widening) the depth of focus more than the depth of focus in the air. In this immersion method, resolution is improved by filling a space between the lower surface of the projection optical system and the surface of the wafer with liquid such as water or an organic solvent to make use of the fact that the wavelength of the exposure light in the liquid becomes 1/n of the wavelength in the air (n is the refractive index of the liquid which is normally around 1.2 to 1.6). In addition, when this immersion method is applied, the depth of focus is substantially enlarged n times when comparing it with the case when the same resolution is obtained without applying the immersion method to the projection optical system (supposing that such a projection optical system can be made). That is, the depth of focus is enlarged n times than in the atmosphere (for example, refer to the pamphlet of International Publication Number WO99/49504 or the like).

According to the projection exposure method and the apparatus disclosed in International Publication Number WO99/49504 referred to above (hereinafter referred to as 'conventional art'), the immersion method allows exposure to be performed with high resolution as well as a greater depth of focus than in the air, and also allows the liquid to be filled stably between the projection optical system and the substrate, that is, allows the liquid to be held, even when the projection optical system and the wafer are relatively moved.

In the conventional art, however, it was difficult to recover the liquid completely, and it was highly probable for the liquid used for immersion to remain on the wafer. In such a case, the heat of vaporization when the remaining liquid vaporizes was likely to cause a temperature distribution or a refractive index change in the atmosphere, and such phenomena could cause a measurement error in the laser interferometer used for measuring the position of the stage on which the wafer is mounted. Furthermore, the remaining liquid on the wafer could flow to the back of the wafer, making the wafer stick to the carrier arm and difficult to separate. In addition, the gas (air) flow of the atmosphere around the liquid could be distorted with the liquid-recovery operation, which could cause a temperature distribution or a refractive index change in the atmosphere.

In addition, in the conventional art, when exposing an edge shot on the wafer, in the case the projection area of the projection optical system was located near the edge of the wafer, the liquid could leak outside the wafer which would interfere with the favorable image forming of the projected image of the pattern. Furthermore, when the wafer was not available underneath the projection optical system, it was difficult to hold the liquid referred to above; therefore, when exposure was to begin after wafer exchange on a wafer that has been exchanged, the start had to be delayed until the wafer was moved under the projection optical system and the liquid has been supplied to a space between the projection optical system and the wafer.

In addition, peripheral units such as a sensor like a focus sensor or an-alignment sensor have to be arranged in the vicinity of the projection optical system. In the conventional art, however, because the supply piping, the recovery piping, and the like were arranged on the outer side of the projection optical system, the degree of freedom was limited when such peripheral units were disposed.

In addition, in the conventional art, bubbles could be found or formed in the supplied liquid, and when such bubbles come in the space between the projection optical system and the substrate, not only did they decrease the transmittance of the exposure light and cause uneven exposure but could also cause defective imaging when the projected image of the pattern is formed.

Furthermore, because the exposure light irradiates the liquid between the projection optical system and the substrate, a temperature change (a refractive index change) could occur in the liquid, which may degrade the imaging quality of the pattern. In addition, the pressure of the liquid between the projection optical system and the substrate may cause the wafer stage that holds the projection optical system and the wafer to vibrate or to incline, which would degrade the transfer accuracy of the pattern onto the wafer. Moreover, when the liquid flows with respect to the projection optical system in the projection area of the pattern, temperature inclination or pressure inclination related to the direction of the flow may occur, which may be the cause of aberration of the projection optical system such as inclination of the image plane or the cause of partial degrading in transfer accuracy of the pattern, which deteriorates the line width uniformity of the transferred image of the pattern.

Accordingly, various improvements can be made to the examples of the conventional art referred to above.

SUMMARY OF THE INVENTION

The present invention was made under such circumstances, and according to a first aspect of the present invention, there is provided a first exposure apparatus that illuminates a pattern with an energy beam and transfers the pattern onto a substrate via a projection optical system, the exposure apparatus comprising: a substrate stage on which the substrate is mounted that moves within a two-dimensional plane holding the substrate; a supply mechanism that supplies liquid to a space between the projection optical system and the substrate on the substrate stage; a recovery mechanism that recovers the liquid; and an auxiliary recovery mechanism that recovers the liquid which could not be recovered by the recovery mechanism.

In this exposure apparatus, the supply mechanism supplies liquid to the space between the projection optical system and the substrate on the substrate stage, and the recovery mechanism recovers the liquid. In this case, a predetermined amount of liquid is held (filled) between (the tip of) the projection optical system and the substrate on the substrate stage. Accordingly, by performing exposure (pattern transfer on the substrate) in this state, the immersion method is applied, and the wavelength of the exposure light on the surface of the substrate can be shortened 1/n times (n is the refractive index of the liquid) the wavelength in the air and furthermore the depth of focus is broadened around n times the depth of focus in the air. In addition, when the liquid supply by the supply mechanism and the liquid recovery by the recovery mechanism are performed in parallel, the liquid between the projection optical system and the substrate is exchanged constantly, therefore, in the case when a foreign matter adheres on the wafer, the foreign matter is removed by the liquid flow. This allows exposure with high resolution and a wider depth of focus compared with when exposure is performed in the air. In addition, for example, in the case a situation where the liquid could not be completely recovered by the recovery mechanism occurs, the auxiliary recovery mechanism collects the liquid that could not be recovered. Accordingly, the liquid does not remain on the substrate, which keeps the various inconveniences referred to earlier that occur due to the remaining (residual) liquid from occurring. Therefore, with the exposure apparatus in the present invention, the pattern can be transferred on the substrate with good precision, and the liquid remaining on the substrate can also be prevented. With the exposure apparatus in the present invention, the liquid supply by the supply mechanism and the liquid recovery by the recovery mechanism do not necessarily have to be performed at the same time.

In this case, the exposure apparatus can further comprise: a plate provided in at least a part of the periphery of a mounted area of the substrate on the substrate stage, the plate having a surface arranged at substantially the same height as a surface of the substrate mounted on the substrate stage. In such a case, even when the substrate stage moves to a position where the projection optical system is away from the substrate in a state where the liquid is locally held between the projection optical system and the substrate, the liquid can be held between the projection optical system and the plate, therefore, it becomes possible to prevent the liquid from flowing out.

In the first exposure apparatus of the present invention, the auxiliary recovery mechanism can recover remaining liquid at the rear side of the projection optical system in a moving direction of the substrate, or the auxiliary recovery mechanism can recover remaining liquid at the front side of the projection optical system in a moving direction of the substrate.

In the first exposure apparatus of the present invention, the auxiliary recovery mechanism can include a suction mechanism that sucks fluid.

In this case, the exposure apparatus can further comprise: a gas supply mechanism that suppresses an environmental change in the periphery of the liquid caused by suction operation of the suction mechanism.

According to a second aspect of the present invention, there is provided a second exposure apparatus that illuminates a pattern with an energy beam and transfers the pattern onto a substrate via a projection optical system, the exposure apparatus comprising: a substrate stage on which the substrate is mounted that moves within a two-dimensional plane holding the substrate; a supply mechanism that supplies liquid to locally fill a space between the projection optical system and the substrate on the substrate stage with the liquid; a recovery mechanism that recovers the liquid; and a plate provided in at least a part of the periphery of a mounted area of the substrate on the substrate stage, the plate having a surface arranged at substantially the same height as a surface of the substrate mounted on the substrate stage.

In this exposure apparatus, the supply mechanism supplies liquid to the space between the projection optical system and the substrate on the substrate stage, and the recovery mechanism recovers the liquid. The liquid supply by the supply mechanism and the liquid recovery by the recovery mechanism do not necessarily have to be performed during exposure, however, at least during exposure, a predetermined amount of liquid is locally held between the projection optical system and the substrate on the substrate stage. Accordingly, by the immersion method, exposure is performed with high resolution and a wider depth of focus compared with when exposure is performed in the air. And, for example, even when the substrate stage moves to a position where the projection optical system is away from the substrate in a state where the liquid is locally held between the projection optical system and the substrate, such as when exposing the periphery on the substrate, or when exchanging the substrate on the substrate stage after exposure has been completed, the liquid can be held between the projection optical system and the plate, which makes it possible to prevent the liquid from flowing out. In addition, for example, because the liquid can be held between the projection optical system and the plate while the substrate is being exchanged, it becomes possible to start exposure operation of the substrate without taking any time to supply the liquid. Accordingly, with the exposure apparatus in the present invention, the pattern can be transferred with good accuracy on the substrate, and the throughput also can be improved, especially because the time required for liquid supply after wafer exchange will not be necessary.

In this case, a gap formed between the plate and the substrate can be set to 3 mm and under. In such a case, even when the immersion section on the image plane side of the projection system is on the border of the substrate and the plate, such as when the substrate stage moves to a position where the substrate is away from the projection optical system from being located under the projection optical system, the liquid between the substrate and the plate is kept from flowing out into the gap, due to the surface tension of the liquid.

In the second exposure apparatus in the present invention, the exposure apparatus can further comprise: an interferometer that measures a position of the substrate stage; and an air conditioning mechanism that performs air conditioning in the periphery of the liquid between the projection optical system and the substrate.

In the second exposure apparatus in the present invention, liquid supply by the supply mechanism can begin on the plate.

According to a third aspect of the present invention, there is provided a third exposure apparatus that illuminates a pattern with an energy beam and transfers the pattern onto a substrate via a projection optical system, the exposure apparatus comprising: a substrate stage on which the substrate is mounted that moves within a two-dimensional plane holding the substrate; an interferometer that measures a position of the substrate stage; a supply mechanism that supplies liquid to a space between the projection optical system and the substrate on the substrate stage; a recovery mechanism that recovers the liquid; and an air conditioning mechanism that performs air conditioning in the periphery of the liquid between the projection optical system and the substrate.

In this exposure apparatus, the supply mechanism supplies liquid to the space between the projection optical system and the substrate on the substrate stage, and the recovery mechanism recovers the liquid. In this case, the liquid supply by the supply mechanism and the liquid recovery by the recovery mechanism do not necessarily have to be performed during exposure, however, a predetermined amount of liquid is held locally between the projection optical system and the substrate on the substrate stage at least during exposure. Accordingly, by the immersion method, exposure is performed with high resolution and a wider depth of focus compared with when exposure is performed in the air. In addition, because the air conditioning mechanism performs air conditioning in the periphery of the liquid, turbulence of the gas flow can be prevented in the atmosphere in the periphery of the liquid when recovering the liquid by the recovery mechanism, which can prevent measurement errors of the interferometers that may occur due to the turbulence of the gas flow (including temperature fluctuation of the gas, refractive index change, and the like), and allows the position of wafer stage WST to be measured with good accuracy. Therefore, with the exposure apparatus in the present invention, the pattern can be transferred with good accuracy on the substrate.

In this case, the air conditioning mechanism can include a suction mechanism that sucks fluid.

In this case, the suction mechanism can also perform the function of recovering the liquid which could not be recovered by the recovery mechanism. In such a case, for example, when a situation where the liquid could not be completely recovered by the recovery mechanism occurs, the suction mechanism collects the liquid that could not be recovered. Accordingly, the liquid does not remain on the substrate, which keeps the various inconveniences referred to earlier that occur due to the remaining (residual) liquid from occurring.

In the third exposure apparatus in the present invention, the air conditioning mechanism can locally air-condition the periphery of the liquid, independent from the air-conditioning inside the chamber where the exposure apparatus is housed.

In each of the first to third exposure apparatus in the present invention, the projection optical system can include a plurality of optical elements in which an optical element located closest to the substrate has a hole formed in a section excluding a portion used for exposure, and at least one operation of supplying the liquid, recovering the liquid, and recovering bubbles (bubbles in the liquid) is performed via the hole.

According to a fourth aspect of the present invention, there is provided a fourth exposure apparatus that illuminates a pattern with an energy beam and transfers the pattern onto a substrate via a projection optical system, the exposure apparatus comprising: a substrate stage on which the substrate is mounted that moves within a two-dimensional plane holding the substrate; a supply mechanism that supplies liquid to a space between the projection optical system and the substrate on the substrate stage; and a recovery mechanism that recovers the liquid, wherein the projection optical system includes a plurality of optical elements in which an optical element located closest to the substrate has a hole formed in a section excluding a portion used for exposure, and at least one operation of supplying the liquid, recovering the liquid, and recovering bubbles is performed via the hole.

In this exposure apparatus, in the optical element that structures the projection optical system located closest to the substrate side, a hole is formed in a section that is not used for exposure, and through the hole an operation of supplying the liquid, recovering the liquid, or recovering bubbles in the liquid is performed. Therefore, space saving is possible compared with the case when the supply mechanism and the recovery mechanism are disposed exterior to the projection optical system. In addition, also in this case, the supply mechanism supplies liquid to the space between the projection optical system and the substrate on the substrate stage, and the recovery mechanism recovers the liquid. In this case, the liquid supply by the supply mechanism and the liquid recovery by the recovery mechanism do not necessarily have to be performed during exposure, however, a predetermined amount of liquid is held between the projection optical system and the substrate on the substrate stage at least during exposure. Accordingly, by the immersion method, exposure is performed with high resolution and a wider depth of focus compared with when exposure is performed in the air. Therefore, with the exposure apparatus in the present invention, the pattern can be transferred with good accuracy on the substrate, and the degree of freedom of each section arranged in the periphery of the projection optical system also increases.

In each of the first to fourth exposure apparatus in the present invention, the exposure apparatus can further comprise: a control unit that stops both liquid supply operation by the supply mechanism and liquid recovery operation by the recovery mechanism when the substrate stage remains stationary.

According to a fifth aspect of the present invention, there is provided a fifth exposure apparatus that illuminates a pattern with an energy beam and transfers the pattern onto a substrate via a projection optical system, the exposure apparatus comprising: a substrate stage on which the substrate is mounted that moves within a two-dimensional plane holding the substrate; a supply mechanism that supplies liquid to a apace between the projection optical system and the substrate on the substrate stage; and a recovery mechanism that recovers the liquid, wherein when the substrate stage remains stationary, both liquid supply operation by the supply mechanism and liquid recovery operation by the recovery mechanism are stopped.

In this exposure apparatus, when the substrate stage is stationary, both the liquid supply operation by the supply mechanism and the liquid recovery operation by the recovery mechanism are stopped. In this case, for example, when a projection optical system with a high resolution (a projection optical system that has a large numerical aperture) whose distance between the projection optical system and the substrate (working distance) is small is used, the liquid is held between the projection optical system and the substrate by its surface tension. Because the necessity to exchange the liquid is low in most cases while the substrate stage is stationary, the amount of liquid used can be reduced when compared with the case when both liquid supply operation by the supply mechanism and liquid recovery operation by the recovery mechanism are performed in parallel at all times (not only when the substrate stage is moving, but also when the substrate stage is stationary). In this case as well, a predetermined amount of liquid is held between the projection optical system and the substrate on the substrate stage at least during exposure. Accordingly, by the immersion method, exposure is performed with high resolution and a wider depth of focus compared with when exposure is performed in the air. Therefore, with the exposure apparatus in the present invention, the pattern can be transferred with good accuracy on the substrate, and the amount of liquid used can be reduced. This is especially suitable in the case when the liquid used is costly.

In each of the first to fifth exposure apparatus in the present invention, the supply mechanism can supply liquid to the space between the projection optical system and the substrate on the substrate stage from the front side in a moving direction of the substrate, or the supply mechanism can supply liquid to the space between the projection optical system and the substrate on the substrate stage from the rear side in a moving direction of the substrate.

In each of the first to fifth exposure apparatus in the present invention, the exposure apparatus can further comprise: a drive system that drives the substrate stage in a predetermined scanning direction with respect to the energy beam to transfer the pattern onto the substrate in a scanning exposure method.

In this case, the supply mechanism can have a plurality of supply ports arranged spaced apart in a non-scanning direction perpendicular to the scanning direction, and the supply mechanism can supply the liquid from at least one supply port selected from the plurality of supply ports in accordance with the size of a divided area subject to exposure on the substrate.

According to a sixth aspect of the present invention, there is provided a sixth exposure apparatus that illuminates a pattern with an energy beam and transfers the pattern onto a plurality of divided areas on a substrate respectively, via a projection optical system, the exposure apparatus comprising: a substrate stage on which the substrate is mounted that moves within a two-dimensional plane holding the substrate; a peripheral wall that surrounds at least an optical element arranged closest to the substrate constituting the projection optical system, and also forms a predetermined clearance with respect to a surface of the substrate on the substrate stage; and at least one supply mechanism that supplies liquid inside the peripheral wall from the rear side in a moving direction of the substrate.

In this exposure apparatus, when the substrate is moving, that is, during the movement of the substrate stage holding the substrate, the supply mechanism supplies the liquid inside the peripheral wall, which includes the space between the projection optical system and the substrate on the substrate stage, from the rear side in the moving direction of the substrate, and the liquid is filled in the space between the projection optical system and the substrate when the substrate is moved. In this case, when the predetermined divided area on the substrate moves under the projection optical system, the liquid is supplied to the upper side of the divided area without fail before it reaches the space below the projection optical system. That is, when the substrate is moved in the predetermined direction, the space between the projection optical system and the surface of the substrate is filled with the liquid. Accordingly, by performing exposure (pattern transfer on the substrate) for the divided area serving as the area subject to exposure, the immersion method is applied and exposure is performed with high resolution and a wider depth of focus compared with when exposure is performed in the air. And, in this way, the pattern can be transferred onto each of the plurality of divided areas on the substrate with good precision.

In this case, the exposure apparatus can further comprise: a recovery mechanism that recovers the liquid at the front side of the projection optical system in a moving direction of the substrate. In such a case, the supply mechanism supplies the liquid inside the peripheral wall from the rear side in the moving direction of the substrate, and the recovery mechanism collects the liquid at the front side of the projection optical system in the moving direction of the substrate. In this case, the liquid supplied flows between the projection optical system and the substrate along the moving direction of the substrate. Therefore, in the case foreign matters adhere on the substrate, they are removed by the flow of the liquid.

In the sixth exposure apparatus in the present invention, the supply mechanism can have a plurality of supply ports in the periphery of an irradiation area on the substrate where the energy beam is irradiated via the pattern and the projection optical system on exposure, and can switch the supply port used for supplying the liquid in accordance with the moving direction of the substrate.

In the sixth exposure apparatus in the present invention, the exposure apparatus can further comprise: a drive system that drives the substrate stage in a predetermined scanning direction with respect to the energy beam to transfer the pattern onto the substrate in a scanning exposure method.

In this case, the supply mechanism can be provided on one side and the other side of the irradiation area in the scanning direction, respectively, and the supply mechanism that supplies the liquid can be switched in accordance with the scanning direction of the substrate.

In the sixth exposure apparatus in the present invention, the supply mechanism can have a plurality of supply ports arranged spaced apart in a non-scanning direction perpendicular to the scanning direction, and the supply mechanism can supply the liquid from at least one supply port selected from the plurality of supply ports in accordance with the size of a divided area subject to exposure on the substrate.

In the sixth exposure apparatus in the present invention, the exposure apparatus can further comprise: a plate provided in at least a part of the periphery of a mounted area of the substrate on the substrate stage, the plate having a surface arranged at substantially the same height as a surface of the substrate mounted on the substrate stage.

In each of the first to sixth exposure apparatus in the present invention, the exposure apparatus can further comprise: at least one bubble recovery mechanism that recovers bubbles in the liquid at the rear side of the projection optical system in a moving direction of the substrate.

In each of the first to sixth exposure apparatus in the present invention, the exposure apparatus can further comprise: an adjustment unit that adjusts exposure conditions based on at least one of actual measurement values and prediction values of temperature information on the liquid between said projection optical system and said substrate.

According to a seventh aspect of the present invention, there is provided a seventh exposure apparatus that illuminates a pattern with an energy beam, moves a substrate in a predetermined scanning direction, and transfers the pattern onto a plurality of divided areas on the substrate via a projection optical system in a scanning exposure method, the exposure apparatus comprising: a substrate stage on which the substrate is mounted that moves within a two-dimensional plane holding the substrate; a supply mechanism that supplies liquid to a space between the projection optical system and the substrate on the substrate stage; and a recovery mechanism that recovers the liquid, wherein liquid supply by the supply mechanism and liquid recovery by the recovery mechanism are performed in sync with exposure operations for each of the divided areas on the substrate.

In this exposure apparatus, because liquid supply by the supply mechanism and liquid recovery by the recovery mechanism are performed in sync with exposure operations for each of the divided areas on the substrate, when the pattern is transferred onto the divided area subject to exposure on the substrate in a scanning exposure method, a predetermined amount of liquid (exchanged constantly) can be filled in the space between the projection optical system and the substrate while the divided area passes through the irradiation area of the energy beam via the projection optical system, and by the immersion method, exposure is performed with high resolution and a wider depth of focus compared with when exposure is performed in the air. Meanwhile, a state can be made where there is no liquid on the substrate during a period other than the irradiation period when the divided area subject to exposure passes through the irradiation area of the energy beam, or other than a period including the irradiation period and a slight length of time after the irradiation period. That is, on sequentially exposing the plurality of divided areas on the substrate, each time a divided area is exposed, liquid supply to the space between the projection optical system and the substrate and full liquid recovery are repeatedly performed, which can shorten the period in which the liquid exists on the substrate, which can also suppress degrading of substances in the photosensitive agent (resist) on the substrate as well as suppress the environmental degradation of the atmosphere in the periphery of the substrate. In addition, the liquid heated by the irradiation of exposure light during exposure of the preceding divided area does not affect the exposure of the following divided area.

In this case, each time exposure of each of the divided areas is performed, the liquid supply by the supply mechanism and full recovery of the liquid by the recovery mechanism can be performed.

In this case, on transferring the pattern, due to the substrate stage moving in the scanning direction, the liquid supply by the supply mechanism can begin at some point before the front edge of a divided area subject to exposure enters an irradiation area on the substrate on which the energy beam is irradiated via the pattern and the projection optical system on exposure.

In this case, the liquid supply by the supply mechanism can begin after moving operation of the substrate stage between divided areas, which is performed between pattern transfer on the divided area subject to exposure and pattern transfer on a preceding divided area, has been completed, or, as in the exposure apparatus of Claim 36, the liquid supply by the supply mechanism can begin when the front edge of the divided area subject to exposure reaches a supply position.

In the seventh exposure apparatus in the present invention, on transferring the pattern, due to the substrate stage moving in the scanning direction, the liquid supply by the supply mechanism can stop at a point when the rear edge of a divided area subject to exposure comes off an irradiation area on the substrate on which the energy beam is irradiated via the pattern and the projection optical system on exposure.

In this case, the liquid recovery by the recovery mechanism can end after the pattern is transferred onto the divided area subject to exposure and before moving operation of the substrate stage between divided areas performed prior to pattern transfer on a succeeding divided area begins.

In the seventh exposure apparatus in the present invention, on transferring the pattern, due to the substrate stage moving in the scanning direction, the liquid supply by the supply mechanism can stop at a point before the rear edge of a divided area subject to exposure comes completely off an irradiation area on the substrate on which the energy beam is irradiated via the pattern and the projection optical system on exposure.

In this case, the liquid supply by the supply mechanism can stop when the rear edge of the divided area subject to exposure reaches a supply position. In addition, the liquid recovery by the recovery mechanism can end after the pattern is transferred onto the divided area subject to exposure and before moving operation of the substrate stage between divided areas performed prior to pattern transfer on a succeeding divided area begins.

In each of the fifth and seventh exposure apparatus in the present invention, the exposure apparatus can further comprise: a peripheral wall that surrounds at least an optical element closest to the substrate constituting the projection optical system, and also forms a predetermined clearance with respect to a surface of the substrate on the substrate stage, wherein the supply mechanism supplies the liquid inside the peripheral wall where an end section of the projection optical system on the side of the substrate fronts.

According to an eighth aspect of the present invention, there is provided an eighth exposure apparatus that illuminates a pattern with an energy beam, moves a substrate in a predetermined scanning direction, and transfers the pattern onto a plurality of divided areas on the substrate via a projection optical system in a scanning exposure method, the exposure apparatus comprising: a substrate stage on which the substrate is mounted that moves within a two-dimensional plane holding the substrate; a peripheral wall that surrounds at least an optical element arranged closest to the substrate constituting the projection optical system, and also forms a predetermined clearance with respect to a surface of the substrate on the substrate stage; a supply mechanism that supplies liquid inside the peripheral wall; and a recovery mechanism that recovers the liquid.

In this exposure apparatus, the supply mechanism supplies the liquid inside the peripheral wall, which includes the space between the projection optical system and the substrate on the substrate stage, and the recovery mechanism collects the liquid. Accordingly, when the liquid supply by the supply mechanism and the liquid recovery by the recovery mechanism are performed in parallel, a predetermined amount of liquid (exchanged at all times) is held inside the peripheral wall including the space between the projection optical system and the substrate. Therefore, when exposure (pattern transfer on the substrate) is performed for the divided areas on the substrate serving as the areas subject to exposure, by performing the liquid supply and recovery described above in parallel, the immersion method previously described is applied, and exposure with high resolution and a wider depth of focus compared with when exposure is performed in the air is performed. In addition, in this case, because the exposure apparatus comprises a peripheral wall that surrounds at least an optical element arranged closest to the substrate constituting the projection optical system and also forms a predetermined clearance with respect to a surface of the substrate on the substrate stage, by setting the clearance small, the contact area of the liquid and the outer air is set extremely small, and the surface tension of the liquid prevents the liquid from leaking outside the peripheral wall via the clearance. Therefore, for example, it becomes possible to recover the liquid used for immersion without fail after the completion of exposure. Accordingly, with the exposure apparatus in the present invention, the pattern can be transferred onto each of the plurality of divided areas on the substrate with good precision, and various adverse effects caused by the liquid remaining on the substrate can be avoided.

In this case, the inside of the peripheral wall can be in a negative pressure state. In such a case, leakage of the liquid outside the peripheral wall due to its own weight can be prevented with more certainty.

In the eighth exposure apparatus in the present invention, when the substrate stage holding the substrate is moving, the liquid supply by the supply mechanism and the liquid recovery by the recovery mechanism can be performed.

In the eighth exposure apparatus in the present invention, when the substrate stage holding the substrate is stationary, liquid supply operation by the supply mechanism and liquid recovery operation by the recovery mechanism can be suspended, and a state where the liquid is held within the peripheral wall can be maintained.

In the eighth exposure apparatus in the present invention, the predetermined clearance can be set to 3 mm and under.

According to a ninth aspect of the present invention, there is provided a ninth exposure apparatus that illuminates a pattern with an energy beam, moves a substrate in a predetermined scanning direction, and transfers the pattern onto a plurality of divided areas on the substrate via a projection optical system in a scanning exposure method, the exposure apparatus comprising: a substrate stage on which the substrate is mounted that moves within a two-dimensional plane holding the substrate; and the supply mechanism that has a plurality of supply ports arranged spaced apart in a non-scanning direction perpendicular to the scanning direction, and the supply mechanism supplies the liquid along the scanning direction from at least one supply port selected from the plurality of supply ports in accordance with the position of a divided area subject to exposure on the substrate to a predetermined spatial area, which includes at least a space between the substrate on the substrate stage and the projection optical system.

For example, in the case at least the size of the divided area subject to exposure in the non-scanning direction differs depending on the position of the divided area subject to exposure on the substrate, the supply mechanism selecting the supply port according to the position of the divided area subject to exposure on the substrate consequently is equivalent to selecting the supply port according to the size of the divided area subject to exposure in the non-scanning direction. Accordingly, with the present invention, it becomes possible to select the supply port corresponding the range of the divided area subject to exposure in the non-scanning direction, and by performing scanning exposure using the immersion method while supplying the liquid to the space between the divided area subject to exposure on the substrate and the projection optical system along in the scanning direction without spilling the liquid on areas other than the divided area, the pattern can be transferred onto the divided area subject to exposure with good accuracy. In this case, the size of a part of the divided areas on the substrate in the non-scanning direction may be different from that of the remaining divided areas, or in the case chipped divided areas are found in the periphery of the substrate, the size of all the remaining divided areas in the non-scanning direction may be the same.

In this case, when the divided area subject to exposure is a divided area in the periphery on the substrate, the supply mechanism can supply the liquid only from a part of the plurality of supply ports spaced apart in the non-scanning direction.

According to a tenth aspect of the present invention, there is provided a tenth exposure apparatus that illuminates a pattern with an energy beam, moves a substrate in a predetermined scanning direction, and transfers the pattern onto a plurality of divided areas on the substrate via a projection optical system in a scanning exposure method, the exposure apparatus comprising: a substrate stage on which the substrate is mounted that moves within a two-dimensional plane holding the substrate; and a supply mechanism that has a plurality of supply ports arranged spaced apart in a non-scanning direction perpendicular to the scanning direction, the supply mechanism supplying the liquid along the scanning direction to a predetermined spatial area, which includes at least a space between the substrate on the substrate stage and the projection optical system, from at least one supply port selected from the plurality of supply ports in accordance with the size of a divided area subject to exposure on the substrate in the non-scanning direction.

In this exposure apparatus, according to the size of the divided area subject to exposure in the non-scanning direction, the supply mechanism is able to select the supply port corresponding the range of the divided area subject to exposure in the non-scanning direction, and by performing scanning exposure using the immersion method while supplying the liquid to the space between the divided area subject to exposure on the substrate and the projection optical system along the scanning direction without spilling the liquid on areas other than the divided area, the pattern can be transferred onto the divided area subject to exposure with good accuracy. In this case, the size of a part of the divided areas on the substrate in the non-scanning direction may be different from that of the remaining divided areas, or the size of all divided areas in the non-scanning direction may be the same. In addition, when scanning exposure is performed on the divided areas in the periphery of the substrate, the size in the non-scanning direction may gradually change, however, even in such a case, the supply port can be selected according to the size change.

In each of the ninth and tenth exposure apparatus in the present invention, the exposure apparatus can further comprise: at least one bubble recovery mechanism that recovers bubbles in the liquid in the upstream side of the liquid flowing along the scanning direction with respect to the projection optical system.

In each of the ninth and tenth exposure apparatus in the present invention, the supply mechanism can supply liquid from the rear side in a moving direction of the substrate.

According to an eleventh aspect of the present invention, there is provided an eleventh exposure apparatus that illuminates a pattern with an energy beam and transfers the pattern onto a substrate via a projection optical system, the exposure apparatus comprising: a substrate stage on which the substrate is mounted that moves within a two-dimensional plane holding the substrate; a supply mechanism that supplies liquid to a space between the projection optical system and the substrate on the substrate stage; and at least one bubble recovery mechanism that recovers bubbles in the liquid in the upstream side of the liquid flow with respect to the projection optical system.

In this exposure apparatus, when exposure (pattern transfer on the substrate) is performed in a state where there is liquid in a predetermined spatial area that includes the space between the projection optical system and the substrate on the substrate stage, the immersion method is applied and exposure with high resolution and a wider depth of focus compared with when exposure is performed in the air is performed. The bubbles found in the liquid are recovered by the bubble recovery mechanism in the upstream side of the liquid flow with respect to the projection optical system. That is, the bubbles in the liquid are recovered by the bubble recovery mechanism before they reach the optical path of the energy beam between the projection optical system and the substrate. This can prevent the transmittance of the energy beam (exposure light) from partly decreasing, deterioration of the projected image, or the like, which are caused by the bubbles entering the space between the projection optical system and the substrate.

In this case, the bubble recovery mechanism can exhaust bubbles along with the liquid (which has been recovered).

In the eleventh exposure apparatus in the present invention, the bubble recovery mechanism can be provided in plurals, and the bubble recovery mechanism used for recovering bubbles is switched in accordance with a moving direction of the substrate. In such a case, the bubbles can be kept from entering the space between the projection optical system and the substrate while the substrate is moving, whichever direction the substrate moves.

In each of the ninth to eleventh exposure apparatus in the present invention, the exposure apparatus can further comprise: an adjustment unit that adjusts exposure conditions based on at least one of actual measurement values and prediction values of temperature information on the liquid between the projection optical system and the substrate.

According to a twelfth aspect of the present invention, there is provided a twelfth exposure apparatus that illuminates a pattern with an energy beam and transfers the pattern onto a substrate via a projection optical system, the exposure apparatus comprising: a substrate stage on which the substrate is mounted that moves within a two-dimensional plane holding the substrate; a supply mechanism that supplies liquid to a predetermined spatial area which includes a space between the projection optical system and the substrate on the substrate stage; and an adjustment unit that adjusts exposure conditions based on temperature information on the liquid between the projection optical system and the substrate.

In this exposure apparatus, the supply mechanism supplies the liquid to the predetermined spatial area that includes at least the space between the projection optical system and the substrate on the substrate stage. When exposure (pattern transfer on the substrate) is performed in this state, the immersion method is applied and exposure with high resolution and a wider depth of focus compared with when exposure is performed in the air is performed. In this case, the adjustment unit adjusts exposure conditions based on at least one of the actual measurement values and the prediction values of temperature information on the liquid between the projection optical system and the substrate. Therefore, this allows an appropriate adjustment of exposure conditions, taking into account degrading factors of the exposure accuracy that goes with the temperature distribution of the liquid used for immersion, such as the aberration (for example, focus) distribution within the projection area (the area on the substrate where the energy beam via the pattern and the projection optical system is irradiated) of the pattern, or in other words, the change in the image plane shape. Accordingly, with the exposure apparatus in the present invention, it becomes possible to transfer the pattern onto the substrate with good precision.

In this case, the exposure apparatus can further comprise: a drive system that drives the substrate stage in a predetermined scanning direction with respect to the energy beam to transfer the pattern onto the substrate in a scanning exposure method; and at least two temperature sensors, at least each one of which is arranged on one side and the other side of the projection optical system in the scanning direction.

In this case, the exposure apparatus can further comprise: a prediction unit that predicts temperature change of the liquid occurring while the liquid passes through an area on the substrate where the energy beam is irradiated via the pattern and the projection optical system, based on detection results of at least two temperature sensors arranged on one side and the other side respectively.

In the twelfth exposure apparatus in the present invention, the exposure apparatus can further comprise: a drive system that drives the substrate stage in a predetermined scanning direction with respect to the energy beam to transfer the pattern onto the substrate in a scanning exposure method, wherein the adjustment unit adjusts exposure conditions taking into consideration temperature distribution of the liquid between the projection optical system and the substrate in the scanning direction.

In this case, the adjustment unit can adjust a positional relationship between an image plane and a surface of the substrate taking into consideration inclination of the image plane caused by the temperature distribution in the scanning direction.

In this case, the adjustment unit can incline the substrate according to the inclination of the image plane caused by the temperature distribution in the scanning direction and can also scan the substrate in a direction of the inclination.

In each of the eleventh and twelfth exposure apparatus in the present invention, the supply mechanism can make a flow of the liquid along a moving direction of the substrate.

In this case, the supply mechanism can make a flow of the liquid from the rear side in a moving direction of the substrate.

In the twelfth exposure apparatus in the present invention, the temperature information can include at least one of actual measurement values and prediction values.

In the twelfth exposure apparatus in the present invention, the exposure apparatus can further comprise: a temperature sensor that can detect the temperature of the liquid between the projection optical system and the substrate, wherein the exposure conditions are adjusted based on detection results of the temperature sensor.

In the twelfth exposure apparatus in the present invention, focus control in which a positional relationship between an image plane formed by the projection optical system and a surface of the substrate can be adjusted, based on the temperature information.

According to a thirteenth aspect of the present invention, there is provided a thirteenth exposure apparatus that transfers a predetermined pattern on a substrate via a projection optical system in a state where liquid is filled in between the projection optical system and the substrate, wherein in the case multiple exposure is performed, a first pattern is transferred onto a divided area on the substrate, and then a second pattern is also transferred on the divided area on the substrate while the liquid is being held between the projection optical system and the substrate.

In this exposure apparatus, when multiple exposure is performed, after the first pattern is transferred onto the divided area on the substrate in a state where the liquid is filled in a space between the projection optical system and the substrate, the second pattern is transferred onto the divided area on the substrate with the liquid being held between the projection optical system and the substrate. Therefore, multiple exposure to which the immersion method is applied is performed, and exposure with high resolution and high accuracy due to a substantially wider depth of focus is performed. In this case, because the liquid is held between the projection optical system and the substrate at the point when the transfer of the second pattern begins, the transfer operation of the second pattern can start without waiting for the liquid to be supplied.

According to a fourteenth aspect of the present invention, there is provided a fourteenth exposure apparatus that exposes a substrate by projecting an image of a pattern on the substrate via a projection optical system, the exposure apparatus comprising: a substrate stage on which the substrate is mounted that moves within a two-dimensional plane holding the substrate; a supply mechanism that supplies liquid to a predetermined spatial area which includes a space between the projection optical system and the substrate on the substrate stage; and an adjustment unit that adjusts exposure conditions based on pressure information on the liquid between the projection optical system and the substrate.

In this exposure apparatus, the supply mechanism supplies the liquid to the space between the substrate on the substrate stage and the projection optical system. When exposure (pattern transfer on the substrate) of the substrate is performed in this state, the immersion method is applied, and exposure with high resolution and a wider depth of focus compared with when exposure is performed in the air is performed. In this case, the adjustment unit adjusts exposure conditions based on pressure information on the liquid between the projection optical system and the substrate. Therefore, this allows an appropriate adjustment of exposure conditions, taking into account degrading factors of the exposure accuracy that goes with the pressure distribution between the projection optical system and the substrate due to the liquid flow, such as the change in the aberration (for example, focus) within the projection area (the area on the substrate where the energy beam via the pattern and the projection optical system is irradiated) of the pattern, the change in the image plane shape, or the control error of the surface position of the substrate surface. The pressure distribution between the projection optical system and the substrate may be actual measurement values, which are directly measured using a pressure sensor or the like, or prediction values based on information obtained in advance by experiment or the like. In either case, the pattern can be transferred onto the substrate with good precision.

In this case, the substrate can be exposed while being moved in a predetermined scanning direction, the liquid supplied to the space between the projection optical system and the substrate can flow in parallel with the scanning direction, and the adjustment unit can adjust the exposure conditions based on pressure distribution in the scanning direction.

In the fourteenth exposure apparatus in the present invention, the substrate can be exposed while being moved in the same direction as a flow direction of the liquid.

In the fourteenth exposure apparatus in the present invention, the adjustment unit can adjust the exposure conditions based on adjustment information on exposure conditions corresponding to a scanning speed of the substrate.

In the fourteenth exposure apparatus in the present invention, the adjustment unit can adjust the exposure conditions based on adjustment information on exposure conditions corresponding to a supply amount of the liquid by the supply mechanism.

According to a fifteenth aspect of the present invention, there is provided a fifteenth exposure apparatus that illuminates a pattern with an energy beam and transfers the pattern onto a substrate via a projection optical system, the exposure apparatus comprising: a substrate stage on which the substrate is mounted that moves within a two-dimensional plane holding the substrate; a supply mechanism that supplies liquid to a space between the projection optical system and the substrate on the substrate stage; a recovery mechanism that recovers the liquid; and a liquid removal mechanism that removes the liquid which could not be recovered by the recovery mechanism.

In this exposure apparatus, the supply mechanism supplies the liquid to the space between the projection optical system and the substrate on the substrate stage, and the recovery mechanism recovers the liquid. In this case, a predetermined amount of liquid is held (filled) between (the tip of) the projection optical system and the substrate on the substrate stage. Accordingly, when exposure (pattern transfer on the substrate) is performed in this state, the immersion method is applied, and the wavelength of the exposure light on the surface of the substrate can be shortened 1/n times (n is the refractive index of the liquid) the wavelength in the air and furthermore the depth of focus is broadened around n times the depth of focus in the air. In addition, when the liquid supply by the supply mechanism and the liquid recovery by the recovery mechanism are performed in parallel, the liquid between the projection optical system and the substrate is exchanged constantly. In addition, for example, in the case a situation occurs where the liquid could not be completely recovered by the recovery mechanism, the liquid removal mechanism removes the liquid that could not be recovered.

According to a sixteenth aspect of the present invention, there is provided a sixteenth exposure apparatus that illuminates a pattern with an energy beam and transfers the pattern onto a substrate via a projection optical system and liquid while locally holding the liquid on an image plane side of the projection optical system, the exposure apparatus comprising: a substrate stage on which the substrate is mounted that moves within a two-dimensional plane holding the substrate; a supply mechanism that supplies the liquid to an image plane side of the projection optical system; a first recovery mechanism that recovers the liquid outside a projection area of the projection optical system; and a second recovery mechanism that recovers the liquid outside the first recovery mechanism with respect to the projection area.

The projection area of the projection optical system, in this case, means a projection area of an object such as a pattern image projected by the projection optical system.

In this exposure apparatus, the supply mechanism supplies the liquid to the image plane side of the projection optical system, and the first recovery mechanism recovers the liquid. In this case, the energy beam irradiates the pattern in a state where the liquid is held locally on the image plane side of the projection optical system, and the pattern is transferred on the substrate via the projection optical system and the liquid. That is, immersion exposure is performed. Accordingly, the wavelength of the exposure light on the surface of the substrate can be shortened 1/n times (n is the refractive index of the liquid) the wavelength in the air and furthermore the depth of focus is broadened around n times the depth of focus in the air. In addition, in the case a situation occurs where the liquid could not be completely recovered by the first recovery mechanism, the second recovery mechanism, which is located on the outer side of the first recovery mechanism, collects the liquid that could not be recovered.

According to a seventeenth aspect of the present invention, there is provided a seventeenth exposure apparatus that illuminates a pattern with an energy beam and transfers the pattern onto a substrate via a projection optical system and liquid while locally holding the liquid on an image plane side of the projection optical system, the exposure apparatus comprising: a substrate stage on which the substrate is mounted that moves within a two-dimensional plane holding the substrate, wherein the substrate stage has a flat section which is substantially flush with a surface of the substrate in the periphery of the substrate held on the substrate stage.

In this exposure apparatus, the energy beam illuminates the pattern in a state where the liquid is held locally on the image plane side of the projection optical system, and the pattern is transferred on the substrate via the projection optical system and the liquid. That is, immersion exposure is performed. In addition, for example, even when the substrate stage moves to a position where the substrate is away from the projection area of the projection optical system in a state where the liquid is held between the projection optical system and the substrate on the image plane side of the projection optical system, such as when exposing the periphery on the substrate, or when the substrate on the substrate stage is exchanged after exposure has been completed, the liquid can be held between the projection optical system and the flat section provided around the substrate held on the substrate stage, and the liquid can be kept from flowing out.

According to an eighteenth aspect of the present invention, there is provided an eighteenth exposure apparatus that illuminates a pattern with an energy beam and transfers the pattern onto a substrate via a projection optical system and liquid while locally holding the liquid on an image plane side of the projection optical system, the exposure apparatus comprising: a substrate stage on which the substrate is mounted that moves within a two-dimensional plane holding the substrate, wherein the substrate stage has a flat section substantially flush with a surface of the substrate held on the substrate stage, and when exposure operation on the substrate is suspended, the projection optical system and the flat section face each other to keep on holding the liquid on the image plane side of the projection optical system.

In this exposure apparatus, the energy beam illuminates the pattern in a state where the liquid is held locally on the image plane side of the projection optical system, and the pattern is transferred on the substrate via the projection optical system and the liquid. That is, immersion exposure is performed. In addition, when exposure operation of the substrate is not performed, the projection optical system and the flat section provided on the substrate stage can be arranged to face each other to keep on holding the liquid on the image plane side of the projection optical system, so that for example, when a plurality of substrates are continuously exposed, the liquid can be held on the image plane side of the projection optical system while the substrate is exchanged and exposure can begin as soon as the substrate exchange is completed, without waiting for the liquid to be supplied. In addition, because the liquid is held on the image plane side of the projection optical system, it can prevent water marks or the like from being generated on the tip surface on the image plane side of the projection optical system due to the tip surface drying up.

According to a nineteenth aspect of the present invention, there is provided a nineteenth exposure apparatus that illuminates a pattern with an energy beam and transfers the pattern onto a substrate via a projection optical system and liquid while locally holding the liquid on an image plane side of the projection optical system, the exposure apparatus comprising: a substrate stage on which the substrate is mounted that moves within a two-dimensional plane holding the substrate, wherein the substrate stage has a flat section substantially flush with a surface of the substrate held on the substrate stage, and after exposure of the substrate held on the substrate stage has been completed, the substrate stage is moved to a predetermined position where the liquid on an image plane side of the projection optical system is recovered, and the substrate on which exposure has been completed is unloaded from the substrate stage, after recovery of the liquid has been completed.

In this exposure apparatus, the energy beam illuminates the pattern in a state where the liquid is held locally on the image plane side of the projection optical system, and the pattern is transferred on the substrate via the projection optical system and the liquid. That is, immersion exposure is performed. In addition, after the exposure of the substrate held on the substrate stage has been completed, the substrate stage is moved to the predetermined position, and the liquid on the image plane side of the projection optical system is recovered. When the substrate stage is moved to the predetermined position, even in the case when the substrate stage moves to a position where the substrate is away from the projection area of the projection optical system, the liquid can be held between the projection optical system and the flat section provided on the substrate stage. In addition, the predetermined position may be set to a position where the liquid is held with the projection optical system and the flat section provided on the substrate stage facing each other. In any case, the liquid is recovered after the substrate stage moves to the predetermined position, and when the liquid recovery is completed, then the substrate for which the exposure has been finished is unloaded from the substrate stage.

According to a twentieth aspect of the present invention, there is provided a twentieth exposure apparatus that illuminates a pattern with an energy beam and transfers the pattern onto a substrate via a projection optical system and liquid while locally holding the liquid on an image plane side of the projection optical system, the exposure apparatus comprising: a supply mechanism that supplies the liquid to an image plane side of the projection optical system; and an exhaust mechanism that exhausts gas on an image plane side of the projection optical system, wherein the supply mechanism begins supplying the liquid in parallel with exhausting operation of the exhaust mechanism.

In this exposure apparatus, the energy beam illuminates the pattern in a state where the liquid is held locally on the image plane side of the projection optical system, and the pattern is transferred on the substrate via the projection optical system and the liquid. That is, immersion exposure is performed. In addition, because the liquid supply by the supply mechanism to the image plane side of the projection optical system begins in parallel with the exhaust of gas within the space on the image plane side of the projection optical system, the space can be filled smoothly with the liquid, and such an operation can also prevent inconvenient bubbles and gas voids from remaining on the image plane side of projection optical system.

According to a twenty-first aspect of the present invention, there is provided a twenty-first exposure apparatus that irradiates an energy beam on a substrate via a projection optical system and liquid and exposes the substrate, the exposure apparatus comprising: a substrate stage that is movable within a two-dimensional plane holding the substrate; and a control unit that controls movement of the substrate stage based on at least one of temperature information of the liquid and pressure information of the liquid.

In this exposure apparatus, the energy beam is irradiated on the substrate via the projection optical system and the liquid, and the substrate is exposed. That is, immersion exposure is performed. In addition, because the control unit controls the movement of the substrate stage based on at least one of temperature information of the liquid and pressure information of the liquid, defocus or the like, which is generated during exposure due to temperature change of the water in between the projection optical system and the substrate as well as pressure of the water, can be effectively suppressed, and degrading in the transfer accuracy can be prevented.

In addition, in a lithographic process, by transferring a device pattern on a substrate using any one of the first to the twenty-first exposure apparatus in the present invention, the pattern can be formed on the substrate with good accuracy, which allows production of a higher integrated microdevices with good yield. Accordingly, further from another aspect of the present invention, it can be said that the present invention is a device manufacturing method that uses any one of the first to the twenty-first exposure apparatus in the present invention.

BRIEF DESCRIPTION OF THE DRAWINGS

In the accompanying drawings.

DESCRIPTION OF THE EMBODIMENTS

First Embodiment

A first embodiment of the present invention is described below, referring to FIGS. 1 to 10B.

Figure 1:
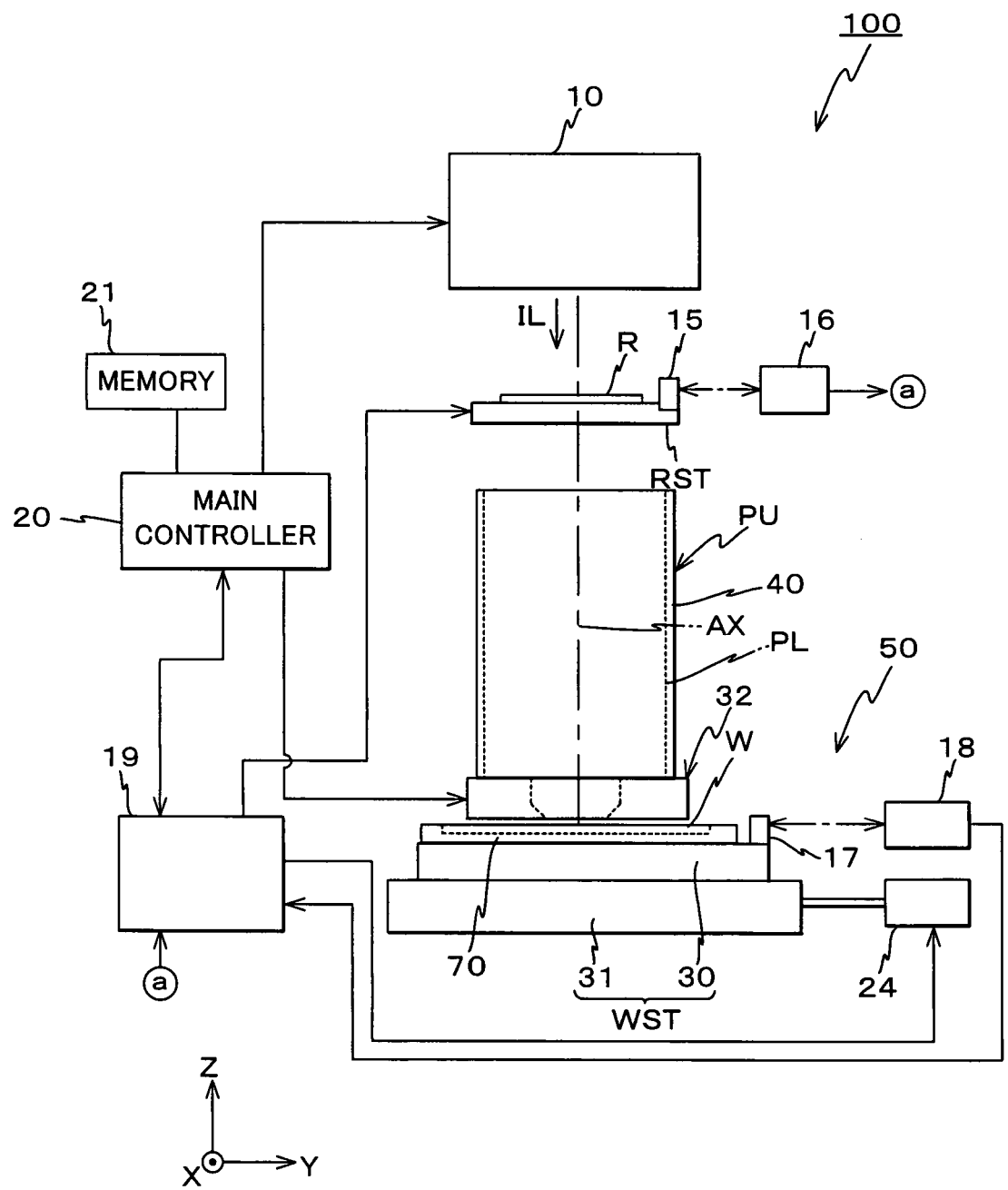
FIG. 1 is an entire view of an arrangement of an exposure apparatus related to a first embodiment in the present invention.

FIG. 1 is an entire view of an arrangement of an exposure apparatus 100 related to the first embodiment. Exposure apparatus 100 is a projection exposure apparatus, based on a step-and-scan method (the so-called scanning stepper). Exposure apparatus 100 comprises an illumination system 10, a reticle stage RST that holds a reticle R serving as a mask, a projection unit PU, a stage unit 50 that includes a Z tilt stage 30 on which a wafer W serving as a substrate is mounted, a control system for such parts, and the like.

As is disclosed in, for example, Japanese Patent Application Laid-open No. H06-349701 and its corresponding U.S. Pat. No. 5,534,970, the arrangement of illumination system 10 includes parts such as a light source, an illuminance uniformity optical system that includes an optical integrator or the like, abeam splitter, a relay lens, a variable ND filter, a reticle blind (none of which are shown). In illumination system 10, an illumination light (exposure light) IL serving as an energy beam illuminates a slit-shaped illumination area set by the reticle blind on reticle R where the circuit pattern or the like is fabricated with substantially uniform illuminance. As illumination light IL, the ArF excimer laser beam (wavelength: 193 nm) is used as an example. As illumination light IL, far ultraviolet light such as the KrF excimer laser beam (wavelength: 248 nm) or bright lines in the ultraviolet region generated by an ultra high-pressure mercury lamp (such as the g-line or the i-line) can also be used. In addition, as the optical integrator, parts such as a fly-eye lens, a rod integrator (an internal reflection type integrator), or a diffraction optical element can be used. As long as the national laws in designated states or elected states, to which this international application is applied, permit, the disclosure of U.S. Patent cited above is fully incorporated herein by reference.

Figure 6:
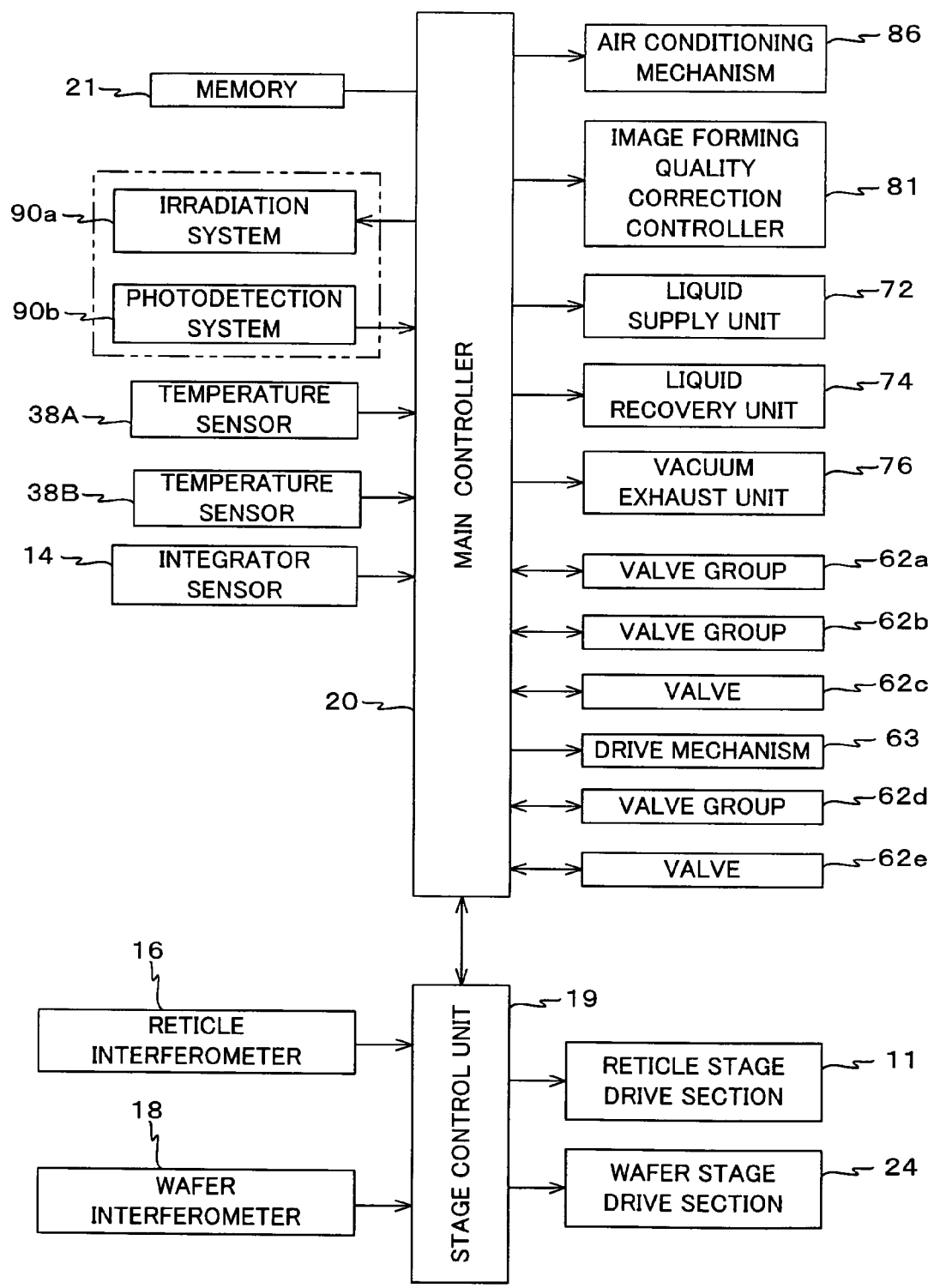
FIG. 6 is a block diagram that shows a partly omitted arrangement of a control system of the exposure apparatus in the first embodiment.

In addition, on the optical path of illumination light IL within illumination system 10, a beam splitter is disposed that has a high transmittance and a fairly low reflectivity, and on the optical path of the light reflected off the beam splitter, an integrator senor (optical sensor) 14 is disposed, which is made up of a photoelectric conversion element (not shown in FIG. 1, refer to FIG. 6). The photoelectric conversion signals of integrator sensor 14 are supplied to a main controller 20 (refer to FIG. 6).

On reticle stage RST, reticle R is fixed, for example, by vacuum suction. Reticle stage RST is structured finely drivable in an XY plane perpendicular to the optical axis of illumination system 10 (coinciding with an optical axis AX of a projection optical system PL, which will be described later) by a reticle stage drive section 11 (not shown in FIG. 1, refer to FIG. 6) that comprises parts such as a linear motor. It is structured also drivable in a predetermined scanning direction (in this case, a Y-axis direction) at a designated scanning speed.

The position of reticle stage RST within the moving plane of the stage is detected at all times with a reticle laser interferometer (hereinafter referred to as a 'reticle interferometer') 16 via a movable mirror 15, at a resolution, for example, around 0.5 to 1 nm. In actual, on reticle stage RST, a movable mirror that has a reflection surface orthogonal to the Y-axis direction and a movable mirror that has a reflection surface orthogonal to an X-axis direction are provided, and corresponding to these movable mirrors, a reticle Y interferometer and a reticle X interferometer are provided; however in FIG. 1, such details are representatively shown as movable mirror 15 and reticle interferometer 16. Incidentally, for example, the edge surface of reticle stage RST may be polished in order to form a reflection surface (corresponds to the reflection surface of movable mirror 15). In addition, instead of the reflection surface that extends in the X-axis direction used for detecting the position of reticle stage RST in the scanning direction (the Y-axis direction in this embodiment), at least one corner cubic mirror (such as a retroreflector) may be used. Of the interferometers reticle Y interferometer and reticle X interferometer, one of them, such as reticle Y interferometer, is a dual-axis interferometer that has two measurement axes, and based on the measurement values of reticle Y interferometer, the rotation of reticle stage RST in a θz direction (the rotational direction around a Z-axis) can be measured in addition to the Y position of reticle stage RST.

The positional information on reticle stage RST from reticle interferometer 16 is sent to main controller 20, via a stage control unit 19. Stage control unit 19 drives and controls reticle stage RST via reticle stage drive section 11, based on the positional information of reticle stage RST, in response to instructions from main controller 20.

Projection unit PU is disposed below reticle stage RST, as in FIG. 1. Projection unit PU comprises a barrel 40, and projection optical system PL, which is made up of a plurality of optical elements, or to be more specific, a plurality of lenses (lens elements) that share the same optical axis AX in the Z-axis direction, held at a predetermined positional relationship within the barrel. As projection optical system PL, for example, a both-side telecentric dioptric system that has a predetermined projection magnification (such as ¼ or ⅕ times) is used. Therefore, when illumination light IL from illumination system 10 illuminates the illumination area on reticle R, illumination light IL that has passed through reticle R forms a reduced image of the circuit pattern within the illumination area on reticle R (a partial reduced image of the circuit pattern) on wafer W whose surface is coated with a resist (photosensitive agent), via projection unit PU (projection optical system PL).

In addition, although it is omitted in the drawings, among the plurality of lenses making up projection optical system PL, a plurality of specific lenses operate under the control of an image forming quality correction controller 81 (refer to FIG. 6) based on instructions from main controller 20, so that optical properties (including image forming quality) such as magnification, distortion, coma, and curvature of image plane (including inclination of image plane), and the image plane position can be adjusted.

Image forming quality correction controller 81 may adjust the quality of the image projected via projection optical system PL by moving reticle R or by finely adjusting the wavelength of illumination light IL, or by combining both ways as appropriate.

In addition, because exposure is performed using exposure apparatus 100 of the embodiment to which the immersion method (to be described later) is applied, in the vicinity of a lens 42 (refer to FIG. 3) serving as an optical element that constitutes projection optical system PL located closest to the image plane (wafer W), a liquid supply/drainage unit 32 is attached so that it surrounds the tip of barrel 40, which holds the lens. Details on liquid supply/drainage unit 32 and the arrangement of the piping system connected to the unit and the like will be described, later in the description.

Stage unit 50 comprises parts such as a wafer stage WST serving as a substrate stage, a wafer holder 70 provided on wafer stage WST, and a wafer stage drive section 24 which drives wafer stage WST and wafer holder 70. As is shown in FIG. 1, wafer stage WST is disposed below projection optical system PL on a base (not shown). Wafer stage WST comprises an XY stage 31, which is driven in the XY direction by linear motors or the like (not shown) constituting wafer stage drive section 24, and Z tilt stage 30, which is mounted on XY stage 31 and is finely driven in the Z-axis direction and in an inclination direction with respect to the XY plane (the rotational direction around the X-axis (θx direction) and the rotational direction around the Y-axis (θy direction)) by a Z tilt drive mechanism (not shown) that also constitutes wafer stage drive section 24. And, on Z tilt stage 30, wafer holder 70, which holds wafer W, is mounted.

Figure 2:
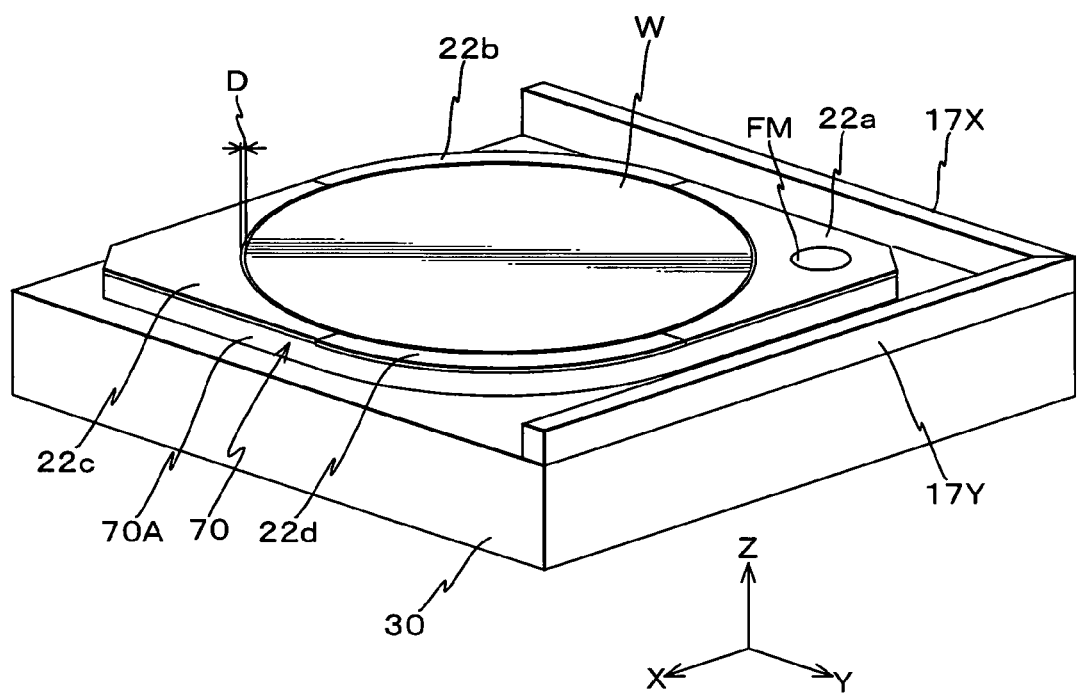
FIG. 2 is a perspective view of a Z tilt stage and a wafer holder.

As is shown in the perspective view in FIG. 2, in the peripheral portion of the area where wafer W is mounted (the circular area in the center), wafer holder 70 comprises a main body section 70A that has a specific shape where two corners located on one of the diagonal lines of a square-shaped Z tilt stage 30 are projecting and the remaining two corners located on the remaining diagonal line are shaped in quarter arcs of a circle one size larger that the circular area described above, and four auxiliary plates 22a to 22d arranged in the periphery of the area where wafer W is to be mounted so that they substantially match the shape of main body section 70A. The surface (flat portion) of such auxiliary plates 22a to 22d are arranged so that they are substantially the same height as the surface of wafer W (the height difference between the auxiliary plates and the wafer is to be around 1 mm or under).

As is shown in FIG. 2, a gap D is formed between auxiliary plates 22a to 22d and wafer W, respectively, and the size of gap D is set at around 3 mm or under. In addition, wafer W also has a notch (a V-shaped notch); however, since the size of the notch is around 1 mm, which is smaller than gap D, it is omitted in the drawings.

In addition, a circular opening is formed in auxiliary plate 22a, and a fiducial mark plate FM is tightly embedded in the opening. Fiducial mark plate FM is arranged so that its surface is co-planar with auxiliary plate 22a. On the surface of fiducial mark plate FM, various types of fiducial marks (none of which are shown) are formed that are used for measurement operations such as reticle alignment or baseline measurement by the alignment detection system (to be described later). Auxiliary plates 22a to 22d do not necessarily have to be plate-shaped, and the upper surface of Z tilt stage 30 may be arranged so that it becomes almost the same height as wafer W. The point is to form a flat portion in the periphery of wafer W at substantially the same height as the surface of wafer W.

Referring back to FIG. 1, XY stage 31 is structured movable not only in the scanning direction (the Y-axis direction) but also in a non-scanning direction (the X-axis direction) perpendicular to the scanning direction so that the shot areas serving as a plurality of divided areas on wafer W can be positioned at an exposure area conjugate with the illumination area. And, XY stage 31 performs a step-and-scan operation in which an operation for scanning exposure of each shot area on wafer W and an operation (movement operation performed between divided areas) for moving wafer W to the acceleration starting position (scanning starting position) to expose the next shot are repeated.

The position of wafer stage WST within the XY plane (including rotation around the Z-axis ($\theta z$ rotation)) is detected at all times by a wafer laser interferometer (hereinafter referred to as 'wafer interferometer') 18 via a movable mirror 17 provided on the upper surface of Z tilt stage 30, at a resolution, for example, around 0.5 to 1 nm. In actual, on Z tilt stage 30, for example, as is shown in FIG. 2, a Y movable mirror 17Y that has a reflection surface orthogonal to the scanning direction (the Y-axis direction) and an X movable mirror that has a reflection surface orthogonal to the non-scanning direction (the X-axis direction) are provided, and corresponding to these movable mirrors, as the wafer interferometers, an X interferometer that irradiates an interferometer beam perpendicularly on X movable mirror 17X and a Y interferometer that irradiates an interferometer beam perpendicularly on Y movable mirror 17Y are provided; however, such details are representatively shown as movable mirror 17 and wafer interferometer 18 in FIG. 1. Incidentally, the X interferometer and the Y interferometer of wafer interferometer 18 are both multi-axis interferometers that have a plurality of measurement axes, and with these interferometers, other than the X and Y positions of wafer stage WST (or to be more precise, z tilt stage 30), rotation (yawing ($\theta z$ rotation, which is rotation around the Z-axis), pitching ($\theta x$ rotation, which is rotation around the X-axis), and rolling ($\theta y$ rotation, which is rotation around the Y-axis) can also be measured. And, for example, the edge surface of Z tilt stage 30 may be polished in order to form a reflection surface (corresponds to the reflection surface of movable mirrors 17X and 17Y). In addition, the multi-axis interferometers may detect positional information related to the optical axis direction (the Z-axis direction) of projection optical system PL, by irradiating a laser beam on a reflection surface provided on the frame on which projection optical system PL is mounted (not shown), via a reflection surface arranged on Z tilt stage 30 at an inclination of 45°.

Positional information (or velocity information) on wafer stage WST is sent to stage control unit 19, and then to main controller 20 via stage control unit 19. Stage control unit 19 controls wafer stage WST via wafer stage drive section 24 based on the positional information (or velocity information) on wafer stage WST referred to above, in response to instructions from main controller 20.

Figure 3:
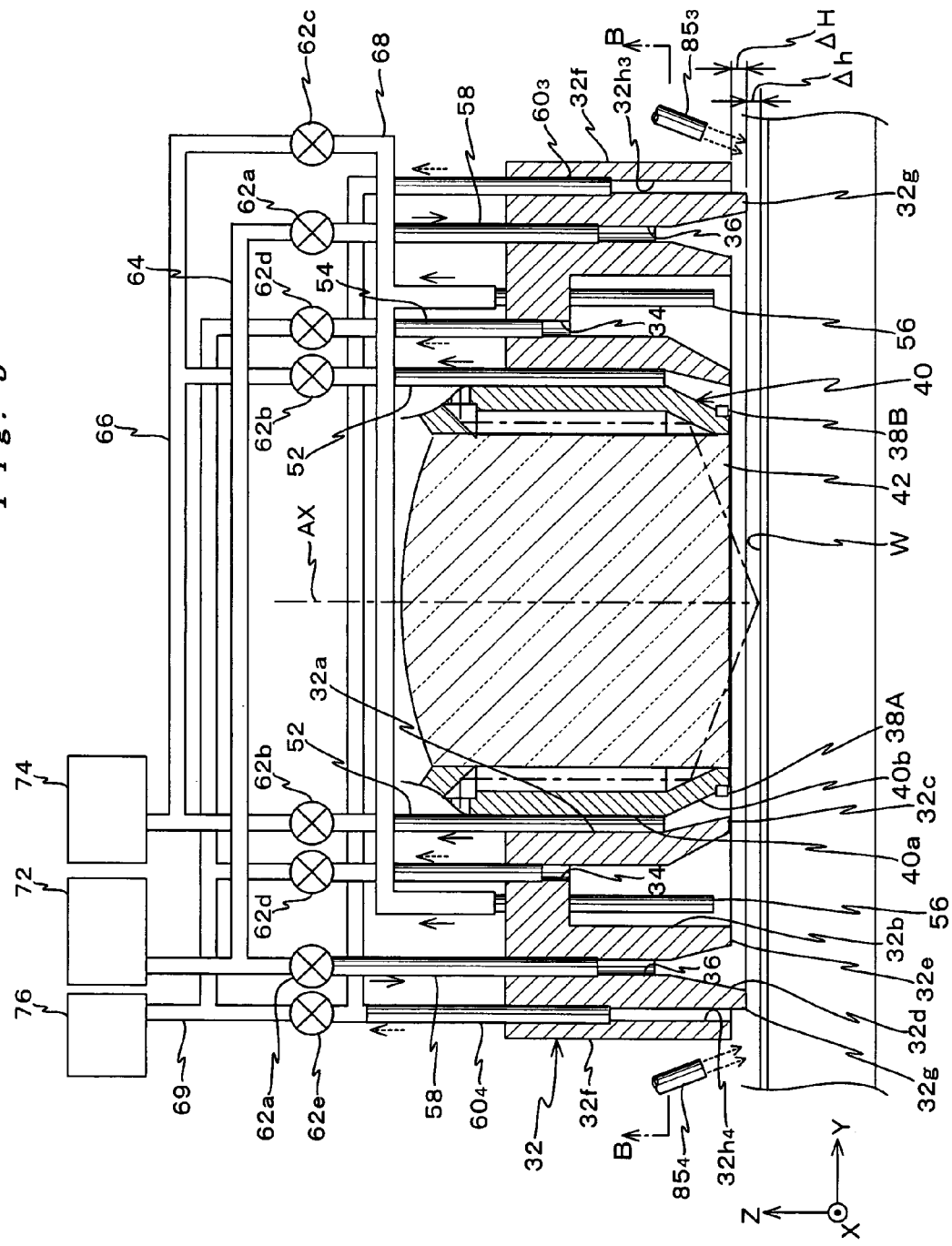
FIG. 3 is a sectional view of a liquid supply/drainage unit shown along with the lower end section of a barrel and a piping system.
Figure 4:
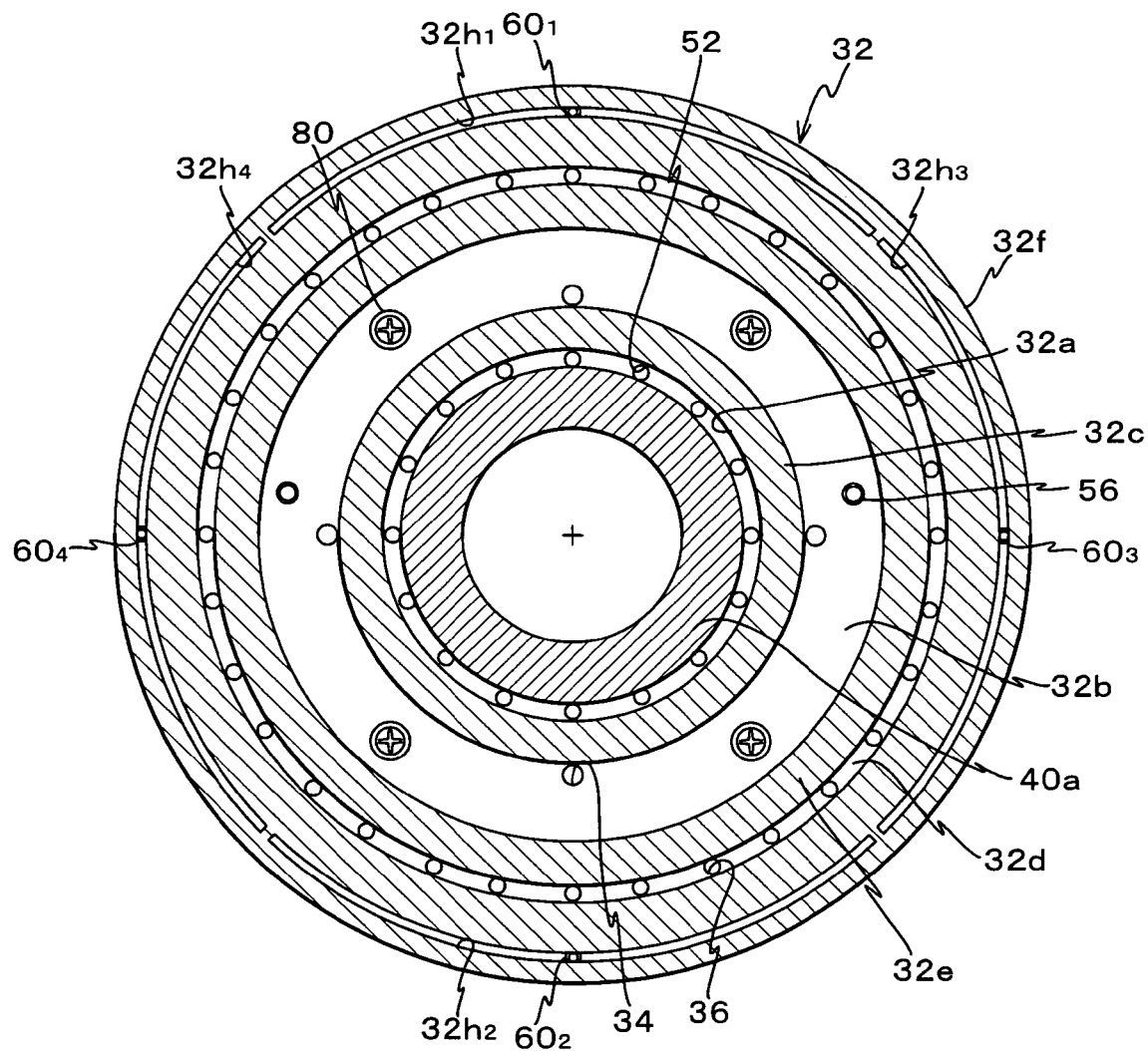
FIG. 4 is a section view of line B-B in FIG. 3.

Next, details on liquid supply/drainage unit 32 will be described, referring to FIGS. 3 and 4. FIG. 3 shows a sectional view of liquid supply/drainage unit 32, along with the lower end section of barrel 40 and the piping system. In addition, FIG. 4 shows a sectional view of line B-B in FIG. 3. Liquid supply/drainage unit 32 is configured to be detachable to barrel 40; therefore, in the case inconveniences such as malfunction or damage occur, it can be exchanged.

As is shown in FIG. 3, on the end of the image plane side of barrel 40 of projection unit PU (the lower end section), a small diameter section 40a is formed whose diameter is smaller than other sections, and the tip of small diameter section 40a is shown as tapered section 40b whose diameter becomes smaller the lower it becomes. In this case, within small diameter section 40a, lens 42 is held, which is one of the lenses structuring projection optical system PL located closest to the image plane. The lower surface of lens 42 is to be parallel to the XY plane orthogonal to optical axis AX.

Liquid supply/drainage unit 32 has a stepped cylindrical shape when viewed from the front (and the side), and in the center, an opening 32a that has a circular section into which small diameter section 40a of barrel 40 can be inserted from above is formed in a vertical direction. The diameter of opening 32a (the diameter of the inner circumferential surface of a ring-shaped side wall 32c, which makes the aperture on the outer side) is constant from the upper end to the vicinity of the lower end, and when it becomes lower it is tapered, or in other words, the diameter becomes smaller. As a consequence, with the outer surface of tapered section 40b of barrel 40a and the inner surface of ring-shaped side wall 32c, a kind of a nozzle (hereinafter referred to as a 'tapered nozzle section' for the sake of convenience) is formed that widens when viewed from above (narrows when viewed from below).

On the lower end surface of liquid supply/drainage unit 32, a depressed section 32b in the shape of a ring when viewed from below is formed on the outer side of opening 32a. In this case, ring-shaped side wall 32c that has a predetermined wall thickness is formed between depressed section 32b and opening 32a. The lower end surface of ring-shaped side wall 32c is arranged to be co-planar with the lower surface of lens 42 (the lowest end surface of barrel 40). The diameter of the outer periphery surface of ring-shaped side wall 32c is constant from the upper end to the vicinity of the lower end, and below the vicinity of the lower end, it has a tapered shape that narrows when it nears the bottom.

As is obvious from FIGS. 3 and 4, between ring-shaped side wall 32c and small diameter section 40a of barrel 40, a space is formed that is shaped in a ring in a planar view (when viewed from above or below). In this space, one end of a plurality of recovery pipes 52 is inserted in the vertical direction spaced almost equally apart around the entire circumference.

On the bottom (upper) surface of depressed section 32b referred to above of liquid supply/drainage unit 32, through holes 34 are formed, respectively, in the vertical direction, on both sides of ring-shaped side wall 32c in the X-axis direction and the Y-axis direction, and into each through hole 34, one end of exhaust pipes 54 is inserted (through hole 54 located on both sides in the X-axis direction are not shown in FIG. 3, refer to FIG. 4). In addition, on the bottom (upper) surface of depressed section 32b of liquid supply/drainage unit 32, circular holes are formed at a plurality of places (for example, two places), and the lower end section of full recovery nozzles 56 are inserted into the circular holes, respectively.

Furthermore, on the lower end of liquid supply/drainage unit 32, on the outer side of depressed section 32b, a depressed groove 32d, which has a ring shape when viewed from below, is formed. In this case, a ring-shaped side wall 32e that has a predetermined wall thickness is formed between depressed groove 32d and depressed section 32b. The lower end surface of ring-shaped side wall 32e is arranged to be co-planar with the lower surface of lens 42 (the lowest end surface of barrel 40). The diameter of the inner periphery surface of ring-shaped side wall 32e is constant from the upper end to the lower end while the outer periphery surface is constant from the upper end to the vicinity of the lower end, and below the vicinity of the lower end, it has a tapered shape that narrows when it nears the bottom.

The depth of depressed groove 32d is configured to be somewhat smaller (a predetermined distance) than depressed section 32b, and on the bottom (upper) surface of depressed groove 32d of liquid supply/drainage unit 32, a plurality of stepped through holes are formed arranged at a predetermined spacing. Into each of the through holes, one end of each of supply pipes 58 is inserted from above, and the small diameter section at the lower end of each of the through holes is referred to as a supply nozzle 36.

The wall on the outer side of depressed groove 32d referred to above of liquid supply/drainage unit 32, or in other words, a peripheral wall 32f may be referred to as a projected section 32g, since a portion of the inner periphery of peripheral wall 32f projects downward a predetermined distance $\Delta H$ when compared with the remaining portion. The lower end surface of projected section 32g is parallel to the lower surface of lens 42, and the clearance between wafer W and its surface, that is clearance $\Delta h$ is 3 mm and under, for example, around 1 to 2 mm. In addition, in this case, the surface of the tip of projected section 32g is positioned approximately $\Delta H$ lower than that of lens 42.

The diameter of the lower end of inner periphery of peripheral wall 32f (the vicinity of projected section 32g) becomes larger as it nears the bottom, having a tapered shape. As a consequence, by the walls (32e and 32f (32g)) on both sides that constitute depressed groove 32d, a kind of a nozzle (hereinafter referred to as a 'widened nozzle section' for the sake of convenience) is formed that widens when viewed from above (narrows when viewed from below).

In a ring shaped area on the outer side of projected section 32g of peripheral wall 32f, on both sides in the X-axis direction as well as the Y-axis direction, two pairs of arcuate slits that have a predetermined depth, slits 32h1 and 32h2, and slits 32h3 and 32h4 are formed. The width of each slit is considerably small compared with depressed groove 32d, so that a capillary phenomenon could occur within the slit. Intake holes that communicate with the slits $32h_1$ and $32h_2$, and slits $32h_3$ and $32h_4$, respectively, which are circular holes whose diameter is slightly larger than that of the slits $32h_1$ and $32h_2$, and slits $32h_3$ and $32h_4$, are formed on the upper surface of liquid supply/drainage unit 32, with at least one intake hole corresponding to each slit, and to each intake hole, one end of auxiliary recovery pipes 60 is inserted (in FIG. 3, however, auxiliary recovery pipes $60_1$ and $60_2$ that communicate with slits $32h_1$ and $32h_2$ located on both sides in the X-axis direction are not shown (refer to FIG. 4), and only auxiliary recovery pipes $60_3$ and $60_4$ that communicate with slits $32h_3$ and $32h_4$ located on both sides in the Y-axis direction are shown).

The other end of each of the supply pipes 58 connects to a supply pipe line 64, which has one end connecting to a liquid supply unit 72 and the other end connecting to supply pipes 58, respectively, via valves 62a. Liquid supply unit 72 includes parts such as a liquid tank, a pressure pump, and a temperature control unit, and operates under the control of main controller 20. In this case, when liquid supply unit 72 is operated in a state where the corresponding valve 62a is open, for example, a predetermined liquid used for immersion whose temperature is controlled so that it is about the same temperature as that in a chamber (drawing omitted) where (the main body of) exposure apparatus 100 is housed is supplied via supply nozzle 36, to a substantially closed space partitioned by liquid supply/drainage unit 32 and the surface of wafer W. Hereinafter, valves 62a provided in each of the supply pipes 58 may also be considered together and referred to as a valve group 62a (refer to FIG. 6).

As the liquid referred to above, in this case, ultra pure water (hereinafter, it will simply be referred to as 'water' besides the case when specifying is necessary) that transmits the ArF excimer laser beam (light with a wavelength of 193.3 nm) is to be used. Ultra pure water can be obtained in large quantities at a semiconductor manufacturing plant or the like, and it also has an advantage of having no adverse effect on the photoresist on the wafer or to the optical lenses. In addition, ultra pure water has no adverse effect on the environment as well as an extremely low concentration of impurities, therefore, cleaning action on the surface of the wafer and the surface of lens 42 can be anticipated.

Refractive index n of the water is said to be around 1.44 to 1.47, and in the water the wavelength of illumination light IL shortens to 193 nm×1/n=around 131 to 134 nm.

The other end of each of the recovery pipes 52 connects to a recovery pipe line 66, which has one end connecting to a liquid recovery unit 74 and the other end connecting to recovery pipes 52, respectively, via valves 62b. Liquid recovery unit 74 includes parts such as a liquid tank, and a suction pump, and operates under the control of main controller 20. In this case, when the corresponding valve 62b is in an opened state, liquid recovery unit 74 recovers the water in the substantially closed space referred to earlier via each of the recovery pipes 52. Hereinafter, valves 62b provided in each of the recovery pipes 52 may also be considered together and referred to as a valve group 62b (refer to FIG. 6).

The upper end of each of the full recovery nozzles 56 referred to earlier connect to recovery pipe line 66 referred to above, via a joint recovery pipe line 68 and a shared valve 62c. In this case, each full recovery nozzle 56 is configured to be vertically movable by a drive mechanism 63 (not shown in FIG. 3, refer to FIG. 6), which operates under the control of main controller 20. And, each full recovery nozzle 56 is configured to be movable by a predetermined distance lower than the surface of wafer W. Therefore, when valve 62c is in an opened state, by lowering all the full recovery nozzles 56 to a position substantially the same height as the wafer surface, liquid recovery unit 74 completely recovers the water on the wafer (or the auxiliary plates 22a to 22d referred to earlier) via all the full recovery nozzles 56.

The other end of each of the exhaust pipes 54 connects to a vacuum piping system 69, which has one end connecting to a vacuum exhaust unit 76 that incorporates a vacuum pump as a suction mechanism and the other end connecting to exhaust pipes 54, respectively, via valves 62d. Vacuum exhaust unit 76 operates under the control of main controller 20. Hereinafter, valves 62d provided in each of the exhaust pipes 54 may also be considered together and referred to as a valve group 62d (refer to FIG. 6).

In addition, auxiliary recovery pipes $60_1$ to $60_4$ referred to earlier connect to vacuum piping system 69, respectively, via a shared valve 62e. In this case, in the situation where all the valves 62d are open and vacuum exhaust unit 76 is operating, when the water is filled up (refer to FIG. 8) to a position above the lower end surface of lens 42 on wafer W (or the auxiliary plates 22a to 22d referred to earlier), it creates negative pressure in the upper space of depressed section 32b, which raises the water level.

In addition, in the case where valve 62e is in an opened state and vacuum exhaust unit 76 is operating, for example, when the water leaks (flows out) outside peripheral wall 32f referred to earlier, the water is sucked up into the slits (any of slits $32h_1$ to $32h_4$) due to capillary phenomenon as well as by the vacuum suction force of vacuum exhaust unit 76, and exhausted outside.

As the valves referred to above, adjustment valves (such as a flow control valve) or the like that open and close, and whose opening can also be adjusted are used. These valves operate under the control of main controller 20 (refer to FIG. 6).

On the upper surface of liquid supply/drainage unit 32, holes are formed in a vertical direction toward the bottom (upper) surface of depressed section 32b at a plurality of points, and liquid supply/drainage unit 32 is fixed to the bottom section of barrel 40 with screws 80 via such holes, respectively (refer to FIG. 4).

In addition, on both sides of tapered section 40b of barrel 40 in the Y-axis direction, a pair of temperature sensors 38A and 38B is fixed, respectively. The output of these temperature sensors is sent to main controller 20 (refer to FIG. 6).

In addition, as is shown in FIG. 3, in the vicinity of slits $32h_3$ and $32h_4$, gas supply nozzles 853 and 854 are provided, respectively. Furthermore, although it is omitted in the drawings, in the vicinity of slits 32h1 and 32h2, gas supply nozzles are also provided, respectively. The gas supply nozzles each connect to an air conditioning mechanism 86 (not shown in FIG. 3, refer to FIG. 6), which operates under the control of main controller 20.

In exposure apparatus 100 in the embodiment, a focal point detection system is provided for the so-called auto-focusing and auto-leveling of wafer W. The focal point detection system will be described below, referring to FIG. 5.

Figure 5:
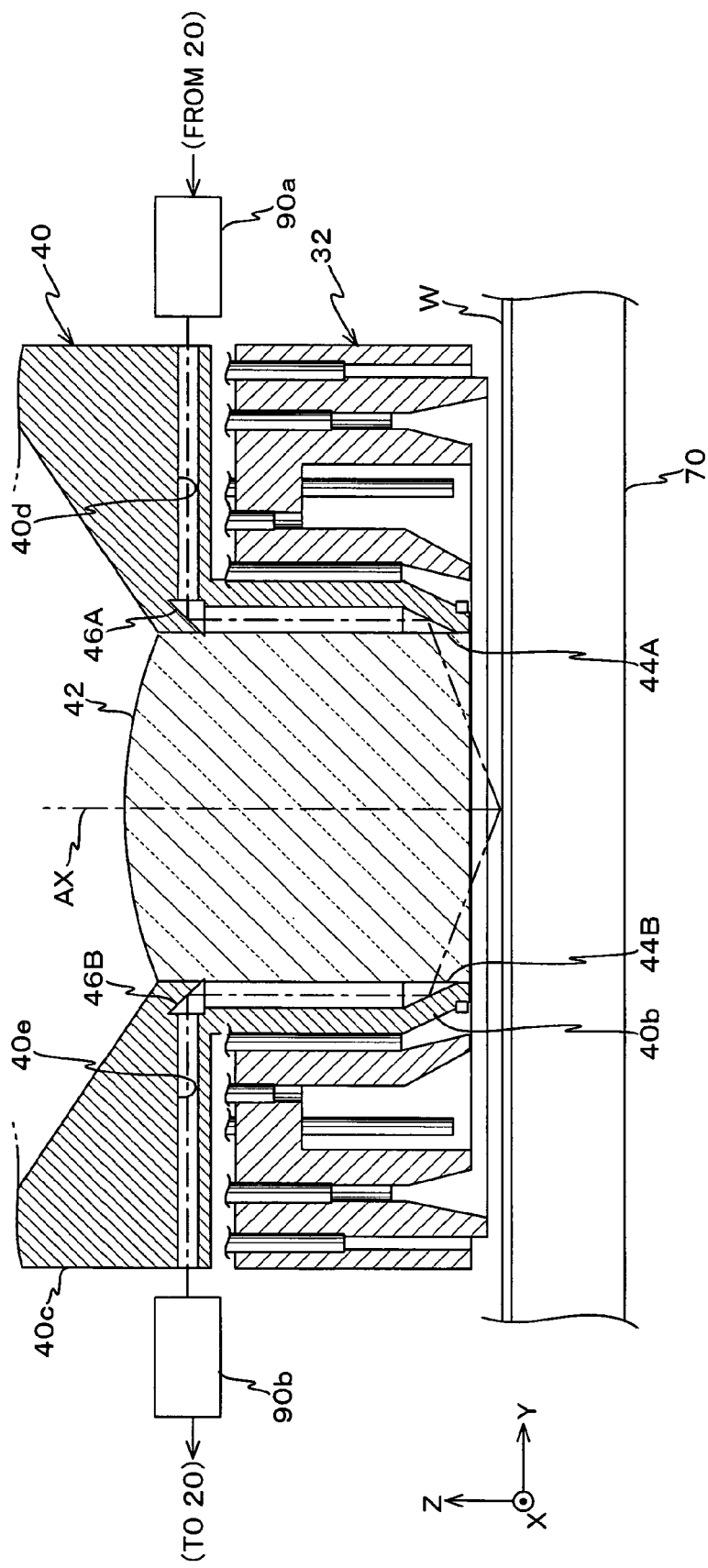
FIG. 5 is a view for describing a focal position detection system.

In FIG. 5, a pair of prisms 44A and 44B, which is made of the same material as lens 42 and arranged in close contact with lens 42, is provided between lens 42 and tapered section 40b of barrel 40.

Furthermore, in the vicinity of the lower end of a large diameter section 40c, which is the section excluding small diameter section 40a of barrel 40, a pair of through holes 40d and 40e is formed that extends in the horizontal direction and communicates the inside of barrel 40 with the outside. On the inner side (the space side referred to earlier) end of such through holes 40d and 40e, right angle prisms 46A and 46B are disposed, respectively, and fixed to barrel 40.

On the outside of barrel 40, an irradiation system 90a is disposed facing one of the through holes, 40d. In addition, on the outside of barrel 40, a photodetection system 90b that constitutes the focal point detection system with irradiation system 90a is disposed, facing the other through hole, 40e. Irradiation system 90a has a light source whose on/off is controlled by main controller 20 in FIG. 1, and emits imaging beams in the horizontal direction so as to form a large number of pinhole or slit images toward the imaging plane of projection optical system PL. The emitted imaging beams are reflected off right angle prism 46A vertically downward, and are irradiated on the surface of wafer W from an oblique direction against optical axis AX by prism 44A referred to earlier. Meanwhile, the beams of the imaging beams reflected off the surface of wafer W are reflected vertically upward by prism 44B referred to earlier, and furthermore, reflected in the horizontal direction by right angle prism 46B, and then received by photodetection system 90b. As is described above, in the embodiment, the focal position detection system is formed consisting of a multiple point focal position detection system based on an oblique method similar to the one disclosed in, for example, Japanese Patent Application Laid-open 06-283403 and the corresponding U.S. Pat. No. 5,448, 332, and the system includes irradiation system 90a, photodetection system 90b, prisms 44A and 44B, and right angle prisms 46A and 46B. The focal position detection system will be referred to as focal position detection system (90a, 90b) in the following description. As long as the national laws in designated states or elected states, to which this international application is applied, permit, the disclosures of the above publication and U.S. patent are fully incorporated herein by reference.

Defocus signals, which are an output of photodetection system 90b of focal position detection system (90a, 90b), are sent to main controller 20.

Main controller 20 controls the movement of Z tilt stage 30 and wafer holder 70 in the Z-axis direction and the inclination in a two-dimensional direction (that is, rotation in the θx and θy direction) via stage control unit 19 and wafer stage drive section 24 when scanning exposure (to be described later) or the like is performed, based on defocus signals such as the S-curve signal from photodetection system 90b so that defocus equals zero. That is, main controller 20 performs autofocusing (automatic focusing) and auto-leveling in which the imaging plane of projection optical system PL and the surface of wafer W are made to substantially coincide with each other within the irradiation area (the area optically conjugate with the illumination area described earlier) of illumination light IL, by controlling the movement of Z tilt stage 30 and wafer holder 70 using focal position detection system (90a, 90b). Details on this operation will be described, later in the description.

FIG. 6 is a block diagram of an arrangement of a control system of exposure apparatus 100, with the arrangement partially omitted. The control system is mainly composed of main controller 20, which is made up of a workstation (or a microcomputer) or the like, and stage control unit 19, which operates under the control of main controller 20.

Other than the sections described so far, main controller 20 connects to a memory 21. Within memory 21, the following information is stored: information for calculating water temperature distribution (for example, computation formula or table data) within the projection area of the pattern on wafer W referred to earlier optically conjugate with the illumination area of reticle R where illumination light IL is irradiated, or in other words, within the irradiation area on the wafer where illumination light IL is irradiated via the pattern and projection optical system PL on exposure, based on temperature difference obtained from the measurement results of temperature sensors 38A and 38B and information on the flow of water (flow speed and flow rate) under lens 42 while scanning exposure is performed (to be described later); information (for example, computation formula or table data) for calculating temperature change coefficients that corresponds to the change in aberration (for example, best focus position, curvature of image plane(including inclination of image plane), spherical aberration, and the like) of the pattern image projected within the irradiation area, and measurement errors of the focal position detection system (90a, 90b) occurring due to the temperature distribution; and other information. Such information is obtained in advance, based on simulation results or the like.

The reason why an aberration change occurs in the pattern image projected on the irradiation area on wafer W by irradiating illumination light IL will be briefly described below with the inclination of the image plane in the scanning direction as an example, referring to FIGS. 7A and 7B.

Figure 7A:
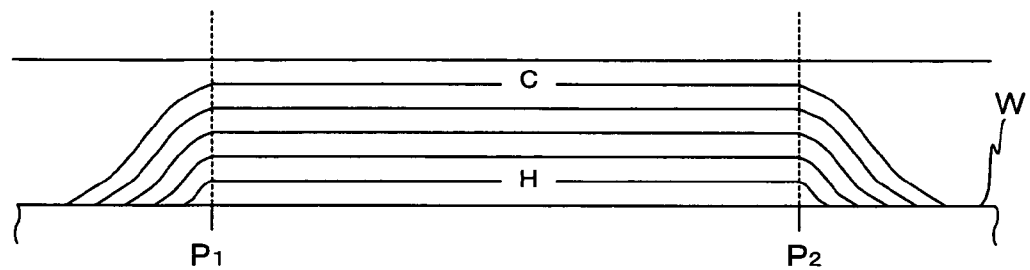
FIGS. 7A and 7B are views for describing the reasons why aberrations occur in an irradiation area on a wafer by irradiation of an illumination light.

FIG. 7A shows the temperature distribution (temperature contour) of the water on wafer W when the water exists on wafer W and the relative speed between projection optical system PL and the water is zero, that is, in a state where wafer W rests and no water flow occurs, and wafer W is heated due to illumination light IL irradiating the irradiation area on wafer W. In FIG. 7A, reference letter C indicates a low temperature section and reference letter H indicates a high temperature section. As is shown, when the temperature distribution of the water changes by the irradiation of illumination light IL, it becomes the cause of a change in the best focus position, and the cause of changes such as spherical aberration, astigmatism, distortion, and the like in the pattern image projected within the irradiation area on wafer W. In this case, because the temperature distribution in the vicinity of the irradiation area is symmetrical, the best focus position of a point on one end in the scanning direction (the lateral direction of the page surface of FIG. 7A), point $P_1$, and the best focus position of a point on the other end in the scanning direction, point P2, are at the same position, therefore, inclination of the image plane does not occur in the scanning direction. The temperature distribution of the water is not limited to the one shown in FIG. 7A, and there maybe a case where a temperature change occurs when illumination light IL is absorbed by the water, and the temperature of the water near the tip of projection optical system PL becomes higher than the temperature of the water close to the surface of wafer W.

Figure 7B:
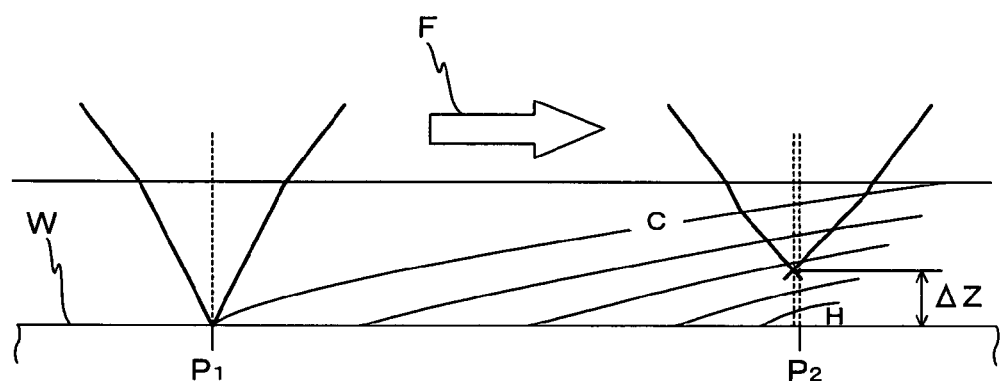

Meanwhile, in a state where the relative speed between projection optical system PL and the water is not zero, for example, in the case the water flows at a predetermined speed in a direction indicated by an arrow F in FIG. 7B, when the wafer is heated by illumination light IL irradiating the irradiation area on wafer W, the temperature distribution of the water on wafer W results as is shown in FIG. 7B. And, also in FIG. 7B, reference letter C indicates a low temperature section and reference letter H indicates a high temperature section. In this case, the temperature distribution of the water in the vicinity of the irradiation area is obviously asymmetrical. Therefore, when this asymmetry of the temperature distribution is ignored, the best focus position of the point P2 on the other end in the scanning direction (the lateral direction of the page surface of FIG. 7A) deviates to a point ΔZ upward from the surface of wafer W, while the best focus position of point P1 on the one end in the scanning direction coincides with the surface of wafer W. The reason why the best focus position of point P2 does not coincide with the surface of wafer W is because the water heated by the heat from the wafer moves from point $P_1$ to point $P_2$. In this case, the closer it is to the upstream side (a position near point $P_1$), cold water flowing from upstream is more dominant, whereas, the closer it is to the downstream side (a position near point $P_2$), heated water is more dominant. When the temperature distribution is as shown in FIG. 7B, a difference occurs in the best focus position of point $P_1$ and point $P_2$ because temperature change (temperature distribution) corresponds to the change (distribution) in refractive index. Accordingly, in this sense, changes may also occur in other aberrations, spherical aberration, astigmatism, distortion, and the like, corresponding to the temperature distribution. As is previously described, because there may be a case where a temperature change occurs when illumination light IL is absorbed by the water, and the temperature of the water near the tip of projection optical system PL becomes higher than the temperature of the water close to the surface of wafer W, the temperature distribution of the water is not limited to the one shown in FIG. 7B.

As is obvious from the description above, aberration distribution (such as, focus distribution) caused by the temperature distribution of the water within the illumination area depends on the direction of the water flow.

In addition, when there is a water flow between lens 42 and wafer W previously described, pressure difference occurs between the upstream and downstream sides. In other words, the pressure on the downstream side is more negative compared with that on the upstream side. That is, the pressure of the water between projection optical system PL and wafer W changes, and such pressure changes the position of lens 42 and wafer W1 which then causes aberration corresponding to the position within the illumination area such as the change in the best focus position, or causes control error in the auto-focus and auto-leveling. In addition, the pressure distribution in the scanning direction relates closely with the speed of the water referred to above, and changes in accordance with the scanning speed of wafer W, the supply quantity of the water (liquid), and the like.

Accordingly, within memory 21, table data (or computation formulas) is stored that include the scanning speed of the wafer and the supply quantity of the water as data (or parameters), for calculating a pressure change coefficient that corresponds to the change in aberration (such as best focus position, curvature of field (including inclination of field), spherical aberration, and the like) within the irradiation area. Such table data (or computation formulas) is obtained, based on the results of simulation that has been performed in advance. The pressure change coefficient also includes aberration change component, which corresponds to control error in the surface position of wafer W.

Within memory 21, formulas or the like for calculating the aberrations referred to above, which include temperature change coefficient and pressure change coefficient as parameters, are also stored.

A series of operations in the exposure process of exposure apparatus 100 in the embodiment having the arrangement described above will be described next, referring to FIGS. 8A to 10B.

As a premise, reticle R is to be loaded on reticle stage RST. In addition, wafer stage WST is to be positioned at the wafer exchange position, and wafer W is to be loaded on wafer holder 70.

Then, in the same manner as in a typical scanning stepper, preparatory operations, which are predetermined, are performed, such as reticle alignment, using a reticle alignment system (not shown), the alignment detection system, and fiducial mark plate FM previously described, and wafer alignment, as in baseline measurement of an alignment system (not shown) and EGA (Enhanced Global Alignment).

Figure 8A:
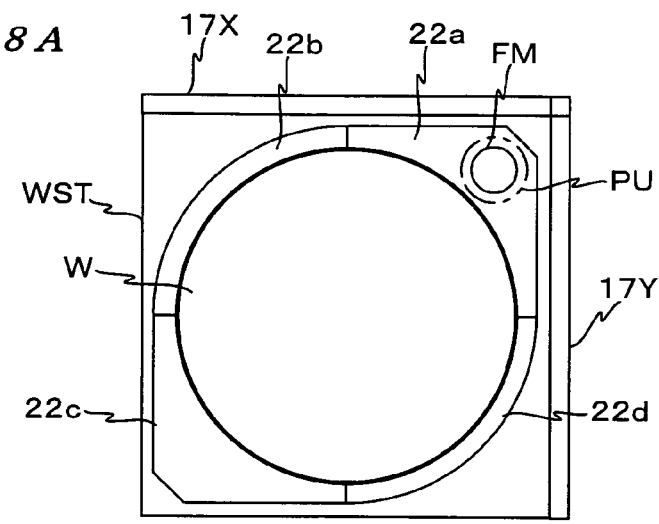
FIG. 8A is a view showing a state of a wafer stage when it has moved to a liquid supply position.

Then, when wafer alignment has been completed, main controller 20 then gives instructions to stage control unit 19, and moves wafer stage WST to a predetermined water supply position. FIG. 8A shows a state where wafer stage WST has been moved to the water supply position. In FIG. 8A, reference letter PU indicates the position of the tip of barrel 40 of projection unit PU. In the embodiment, the water supply position is set to a position where projection unit PU is positioned directly above fiducial mark plate FM.

Next, main controller 20 starts the operation of liquid supply unit 72 as well as opens valve group 62a to a predetermined level, and begins to supply water from all the supply nozzles 34. Then, immediately afterwards, main controller 20 starts the operation of vacuum exhaust unit 76 as well as completely open valve groups 62d and 62e, and begins vacuum exhaust via each of the exhaust pipes 54 and auxiliary recovery pipes 60₁ to 60₄. In addition, during such operations, main controller 20 begins local air conditioning in the vicinity of liquid supply/drainage unit 32, by controlling air conditioning mechanism 86. In this manner, by supplying the water into the space on the image plane side of projection optical system PL while exhausting the gas in the space, not only can the water be filled smoothly in the space, but it can also prevent inconvenient bubbles and gas voids from remaining on the image plane side of projection optical system PL.

And, when a predetermined period of time elapses, the substantially closed space partitioned by liquid supply/drainage unit 32 and the surface of fiducial mark plate FM is filled with a predetermined amount of water. The water supply amount immediately after the water supply starts is set to a low level so that the water does not leak outside from a clearance (gap) formed between projected section 32*g* of peripheral wall 32*f* and fiducial mark plate FM due to the force of water, and at the stage where the water is filled up to the height Δh and the inside of liquid supply/drainage unit 32 becomes a completely closed space, the water supply amount is set to a high level. Main controller 20 may perform such a setting of water supply amount by adjusting the degree of opening of each valve in valve group 62*a*, or by controlling the water supply amount itself from liquid supply unit 72. Immediately after the water supply starts, the water supply amount may be gradually increased, or increased step by step.

In any case, when the water supply reaches depth Δh, the space partitioned by liquid supply/drainage unit 32 and the surface of the water becomes under negative pressure, which supports the weight of the water, against the outside of liquid supply/drainage unit 32 due to the vacuum suction force of vacuum exhaust unit 76, that is, the negative pressure raises the water level. Accordingly, when the water supply amount is increased after the water supply reaches depth Δh, the water becomes difficult to leak from the clearance formed under projected section 32*g* of peripheral wall 32*f*. In addition, in this case, because the clearance is around 1 to 2 mm, the water is also held within peripheral wall 32*f* (projected section 32*g*) by its surface tension.

When the predetermined space between projection optical system PL and fiducial mark plate FM has been filled with liquid, main controller 20 then gives instructions to stage control unit 19, and moves wafer stage WST so that the tip of projection unit PU is positioned at a predetermined position above wafer W. In the case wafer stage WST moves from the starting position of water supply shown in FIG. 8A, an immersion area under projection unit PU will pass through the border of auxiliary plate 22*a* and wafer W, however, since the surface of auxiliary plate 22*a* and the surface of wafer W are almost the same height and the gap between auxiliary plate 22*a* and wafer W is around 1 mm, the water held under lens 42 can be maintained.

When peripheral air is drawn into each of slits 32*h*1 to 32*h*4 by vacuum suction via slits 32*h*1 to 32*h*4 referred to earlier, in the case no countermeasures are taken, it may cause air turbulence as well as lower the pressure of the space on the lower side of each slit to a negative pressure, and when such negative pressure occurs, the possibility of the water leaking from the clearance (gap) under projected section 32*g* of peripheral wall 32*f* becomes higher. In the embodiment, however, air conditioning mechanism 86 referred to earlier effectively suppresses such air turbulence and negative pressure from occurring in the vicinity of each slit, via gas supply nozzles 85₃ and 85₄ or the like.

Figure 9:
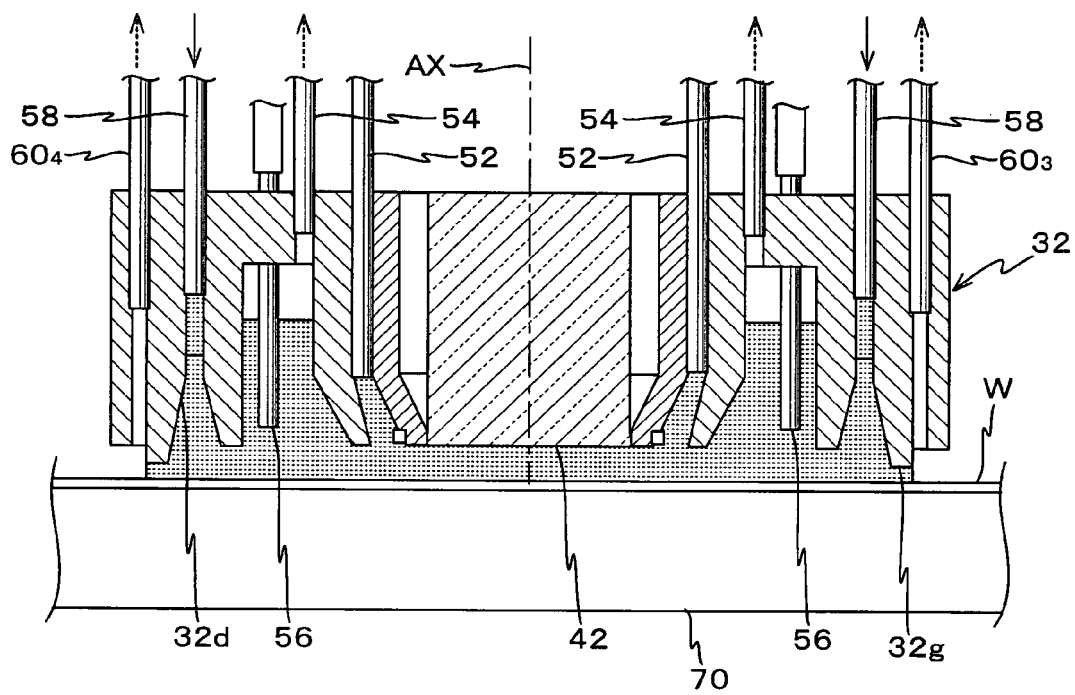
FIG. 9 is a view showing a state of the inside of the liquid supply/drainage unit filled with a desired depth of water.

FIG. 9 shows a state where the inside of liquid supply/drainage unit 32 is filled with the water reaching a desired depth on wafer W, and the immersion area is formed on a part of wafer W that includes the projection area of projection optical system PL. And, exposure operations based on a step-and-scan method are performed in the manner described below.

More specifically, under the instructions of main controller 20, stage control unit 19 moves wafer stage WST via wafer stage drive section 24, based on wafer alignment results, to the acceleration starting position for exposure of the first shot area (first shot), which serves as a first divided area on wafer W held on wafer holder 70. When wafer stage WST moves from the water supply position (liquid supply position) to the acceleration starting position referred to above, main controller 20 starts the operation of liquid recovery unit 74 as well as opens at least one valve 62 of valve group 62*b* to a predetermined degree of opening, and recovers the water inside liquid supply/drainage unit 32 via recovery pipes 52. And on such operation, selection of valve 62*b* used for the recovery of water and adjustment of the degree of opening in each valve 62*b* are performed, so that the inside of liquid supply/drainage unit 32 is filled with a constant amount of water at all times that makes the water surface higher than the lower surface of lens 42.

In this case, main controller 20 may completely close valves 62*a* that correspond to supply nozzle 36, which are located at a position besides the rear side of projection unit PU in the moving direction of wafer stage WST (wafer W) and open valves 62*b* that correspond to recovery pipes 52, which are located at a position on the front side of projection unit PU in the moving direction, at a predetermined degree of opening. This operation creates a water flow under lens 42 that moves from the rear side of projection unit PU to the front side, in the same direction as the moving direction of wafer stage WST, while wafer stage WST is moving. And, also in this case, it is preferable for main controller 20 to set the supply amount and the recovery amount of the water so that the inside of liquid supply/drainage unit 32 is always filled with a constant amount of water that makes the water surface higher than the lower surface of lens 42, while exchanging the water constantly.

When wafer W (wafer stage WST) has been moved to the acceleration starting position described above, stage control unit 19 begins relatively scanning reticle-stage RST and wafer stage WST in the Y-axis direction via reticle stage drive section 11 and wafer stage drive section 24, in response to the instructions from main controller 20. And, when both stages, RST and WST, reach their target scanning speed and move into a constant speed synchronous state, illumination light IL (ultraviolet pulse light) from illumination system 10 begins to illuminate the pattern area of reticle R, and scanning exposure begins. Stage control unit 19 performs the relative scanning referred to above, in response to the instructions from main controller 20, by controlling reticle stage drive section 11 and wafer stage drive section 24 while monitoring the measurement values of wafer interferometer 18 and reticle interferometer 16 previously described.

Stage control unit 19 performs synchronous control, especially during scanning exposure described above, so that the Y-axis direction moving speed Vr of reticle stage RST and the Y-axis direction moving speed Vw of wafer stage WST are maintained at a speed ratio corresponding to the projection magnification of projection optical system PL.

Then, different areas in the pattern area of reticle R are sequentially illuminated by illumination light IL, and when the entire pattern area has been illuminated, scanning exposure of the first shot is completed. By this operation, the pattern of reticle R is reduced and transferred onto the first shot via projection optical system PL.

On scanning exposure of the first shot on wafer W described above, in the same manner as when wafer stage WST moves from the water supply position to the acceleration starting position described above, main controller 20 adjusts the degree of opening (including a fully closed state and a fully opened state) of each valve constituting valve groups 62a and 62b, so that a water flow is created under lens 42, that moves from the rear side of projection unit PU to the front side in the scanning direction, that is, the moving direction of wafer W, in the same direction as the moving direction of wafer W (+Y direction).

Figure 10A:
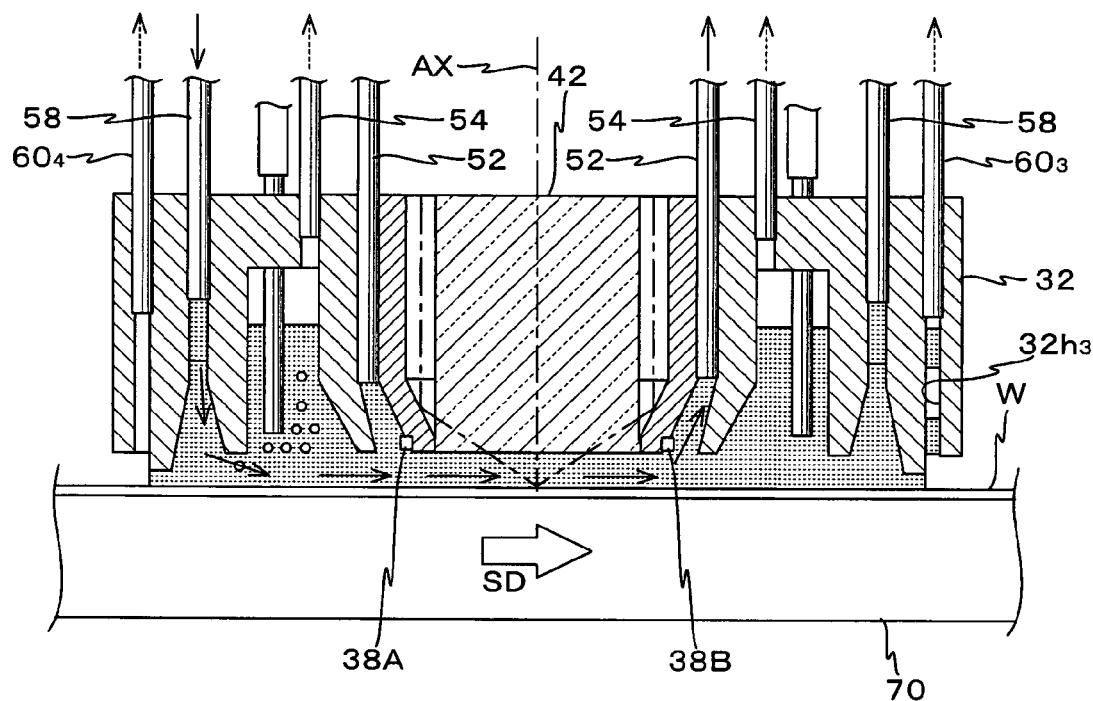
FIG. 10A is a simplified view of the vicinity of liquid supply/drainage unit upon exposure of a first shot.

FIG. 10A is a simplified view of the vicinity of liquid supply/drainage unit 32 at such a point. The direction of the water flow at this point is the same as scanning direction SD of wafer W (+Y direction), and the water flow speed is greater than the scanning speed of wafer W. Therefore, the water flows above wafer W from the left side to the right side of the drawing, and the illumination area of illumination light IL on the surface of the wafer (the projection area of the pattern on reticle R via projection optical system PL) is always filled with a predetermined amount of water during the scanning exposure (the water is exchanged at all times).

In this case, the water may leak outside from the front side of projected section 32g of peripheral wall 32f in the scanning direction, depending on the flow speed and flow rate of the water, however, the water that leaks out is sucked up into slit 32h3 due to capillary phenomenon as well vacuum sucked by vacuum exhaust unit 76 via auxiliary recovery pipes 60₃, and exhausted outside. That is, regarding the scanning direction of wafer W, the liquid that could not be recovered by recovery pipes 52 provided on the opposite side of supply pipes 58 and spilled outside peripheral wall 32g is recovered (removed) from wafer W by auxiliary recovery pipes 60₃.

In addition, as is shown in FIG. 10A, in the case bubbles are found in the water supplied, or supposing that bubbles are generated just after the water supply is performed, because the space (negative pressure space) described earlier is available on the upstream side of lens 42, bubbles are collected within the space so that they do not reach the area underneath lens 42 when the relative speed of the water with respect to wafer W does not exceed a certain value (normal usage state). That is, because bubbles in the water are collected between supply pipes and lens 42, they do not reach the area between lens 42 and wafer W, which means that the bubbles do not deteriorate the image of the pattern projected on wafer W.

Incidentally, a groove may be provided on the lower surface of lens 42 in an unused space, that is, the space where exposure light does not pass. In this case, even if bubbles reach the area between lens 42 and wafer W, because the groove captures the bubbles, it can prevent the bubbles from reaching the optical path of the exposure light in a more secure manner.

During the scanning exposure described above, because exposure needs to be performed in a state where the illumination area on wafer W substantially coincides with the imaging plane of projection optical system PL, main controller 20 performs auto-focusing and auto-leveling in the manner described below, from a. to f., based on the output of the focal position detection system (90a, 90b).

a. Main controller 20 takes in measurement values of temperature sensors 38A and 38B during scanning exposure, and calculates temperature difference ΔT, which is the temperature difference between the upstream side end and the downstream side end of the irradiation area on the wafer in the scanning direction. In addition, main controller 20 uses the information for calculating water temperature distribution within the irradiation area on the wafer (such as computation formula or table data) stored in memory 21, in order to obtain the water temperature distribution by computation, based on the calculated temperature difference ΔT and the flow amount of the water flowing under lens 42.

b. In addition, main controller 20 uses the information stored in memory 21 (such as computation formula or table data), and calculates the temperature change coefficient that corresponds to the change in best focus position, for example, at points on both sides within the irradiation area in the scanning direction, based on the water distribution obtained.

c. In addition, main controller 20 uses the table data or computation formula stored in memory 21, and calculates the pressure change coefficient that corresponds to the change in best focus position, for example, at points on both sides within the irradiation area in the scanning direction, based on the scanning speed of wafer W and the water supply amount.

d. In addition, main controller 20 substitutes the temperature change coefficient and pressure change coefficient obtained respectively in b. and c. above into a computation formula stored in memory 21 for calculating the aberration previously described, such as in the computation formula for calculating the best focus position, and calculates the best focus position, for example, at points on both sides within the irradiation area in the scanning direction.

e. In addition, main controller 20 calculates the shape of the image plane (inclination of the image plane) of the projection optical system based on the results calculated in d. above at this point, and sets the target position (sets the detection offset) at each detection point (irradiation pint of the imaging beams) of the focal position detection system based on the calculation results, and based on the target values, main controller 20 performs focus control and leveling control of wafer W. That is, main controller 20 controls the movement of Z tilt stage 30 and wafer holder 70 so that the surface of wafer W substantially coincides with the image plane.

f. Main controller 20 repeats the processing a. to e. described above during scanning exposure at a predetermined interval. As a result, each point on wafer W is driven along the image plane of projection optical system PL, and defocus, which is generated during exposure caused by the water temperature change of the water between lens 42 and wafer W or the pressure change due to the water flow, can be effectively suppressed.

When scanning exposure of the first shot on wafer W is completed in this manner, stage control unit 19 steps wafer stage WST via wafer stage drive section 24, for example, in the X-axis direction in response to the instructions from main controller 20, to the acceleration starting point for exposing the second shot (the shot area serving as a second divided area) on wafer W. And on the stepping operation (movement operation between divided areas) of wafer stage WST between shots as well, between the exposure of the first shot and the exposure of the second shot, main controller 20 performs the open/close operation of each valve in a similar manner as in the case when wafer stage WST moves for exposure from the water supply position to the acceleration starting position. With this operation, even when during the stepping operation between shots, the water is supplied to the space below lens 42 from the rear side to the front side of projection unit PU in the movement direction of wafer stage WST, and its amount is maintained at a constant amount at all times.

Figure 10B:
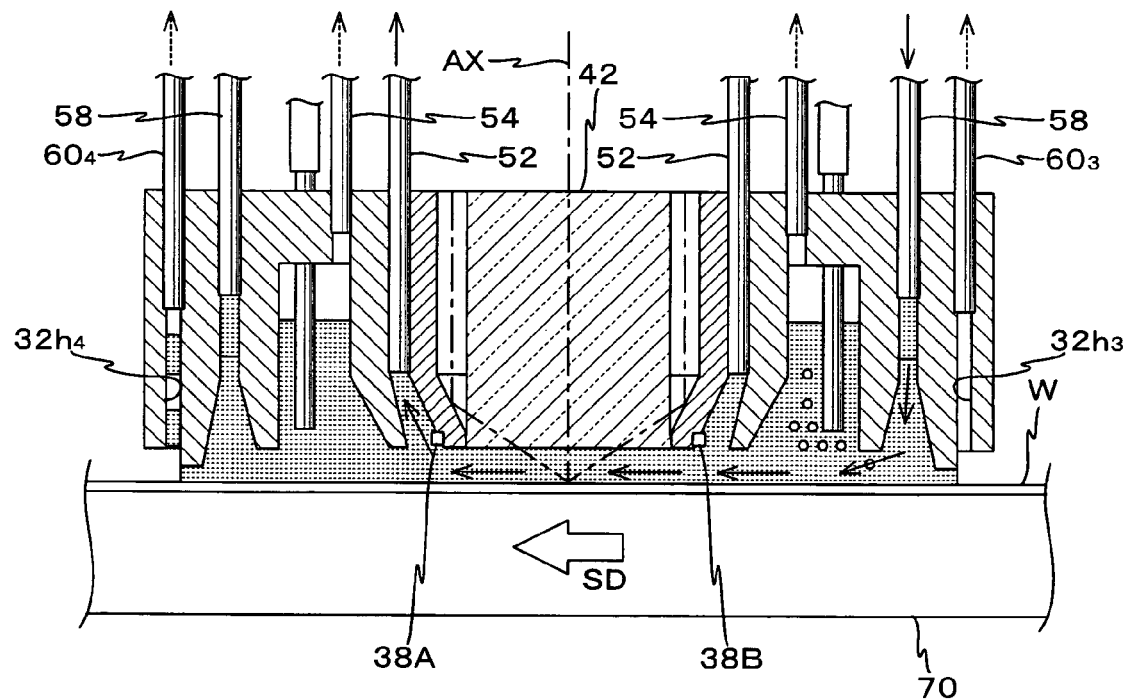
FIG. 10B is a simplified view of the vicinity of liquid supply/drainage unit when a wafer is scanned in a direction opposite to FIG. 10A.

Next, scanning exposure is performed for the second shot on wafer W in the manner similar to the description above under the control of main controller 20. In the embodiment, because the so-called alternate scanning method is employed, when the second shot is exposed, the scanning direction (moving direction) of reticle stage RST and wafer stage WST is the opposite of the first shot. The processing of main controller 20 and stage control unit 19 during the scanning exposure of the second shot is basically the same as the processing previously described. In this case as well, main controller 20 adjusts the degree of opening (including a fully closed state and a fully opened state) of each valve constituting valve groups 62a and 62b, so that in the moving direction of wafer W, which is opposite to the exposure of the first shot, a water flow is created under lens 42 that moves from the rear side of projection unit PU to the front side. FIG. 10B shows a simplified view of the vicinity of liquid supply/drainage unit 32 at such a point, and it shows that wafer W moves in the −Y direction when scanning exposure of the second shot is performed and that the water flows between lens 42 and wafer W in the same direction as wafer W (the −Y direction).

In this manner, scanning exposure of the shot area on wafer W and the stepping operation are repeatedly performed, and the circuit pattern of reticle R is sequentially transferred onto the shot areas of wafer W serving as a plurality of divided areas.

Figure 8B:
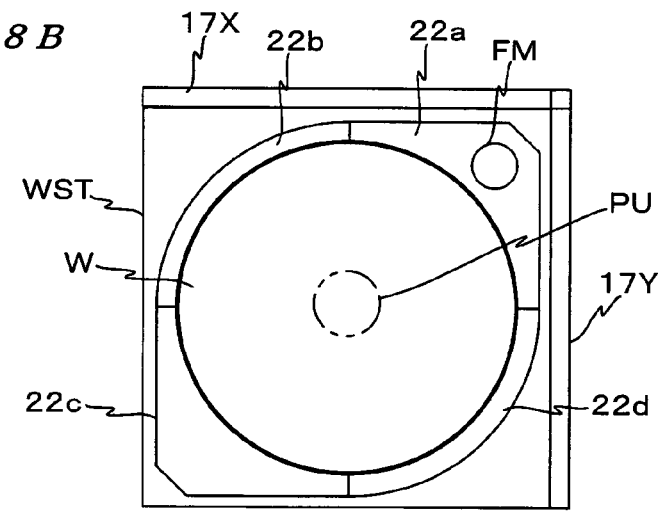
FIG. 8B is a view showing an example of a positional relation between a wafer stage and a projection unit in a step-and-scan exposure operation for a wafer.

FIG. 8B shows an example of a positional relationship between wafer stage WST and projection unit PU during while exposure based on the step-and-scan method is being performed for wafer W.

Figure 8C:
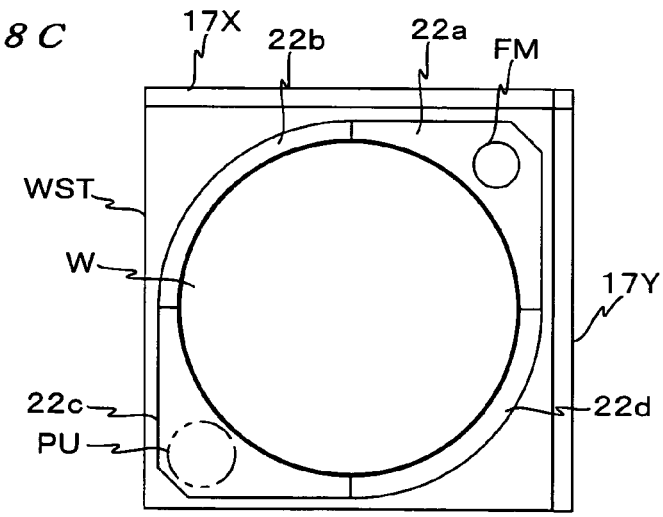
FIG. 8C is a view showing a state of a wafer stage when it has moved to a liquid drainage position.

When scanning exposure for the plurality of shot areas on wafer W is completed in the manner described above, main controller 20 gives instructions to stage control unit 19, and moves wafer stage WST to a predetermined water drainage position. FIG. 8C shows the state where wafer stage WST has been moved to the water drainage position. In FIG. 8C, reference letter PU indicates the position of the tip of barrel 40 of projection unit PU. In this case, the water drainage position is set to a position where the tip of barrel 40 is positioned directly above auxiliary plate 22c.

Next, main controller 20 fully closes all the valves in valve group 62a, while fully opening all the valves in valve group 62b. At the same time, main controller 20 lowers all the full recovery nozzles 56 via drive mechanism 63 so that the tip of full recovery nozzles 56 comes into contact with auxiliary plate 22b, and then opens valve 62c.

By such an operation, the water below lens 42 is completely collected by liquid recovery unit 74 after a predetermined period of time.

Then, wafer stage WST moves to the wafer exchange position, and wafer exchange is performed.

As is obvious from the description so far, in exposure apparatus 100 in the embodiment, a supply mechanism that supplies the liquid (water) to the space between projection optical system PL and wafer W on wafer stage WST, is made up of parts such as liquid supply unit 72, supply pipe line 64 connecting to liquid supply unit 72, the plurality of supply pipes 58 respectively connected to supply pipe line 64 via valves 62a, each supply nozzle 36 of liquid supply/drainage unit 32 respectively connecting to the plurality of supply pipes 58, the widened nozzle section communicating with each supply nozzle 36, and the like.

In addition, in exposure apparatus 100, a recovery mechanism, that collects the liquid (water), is made up of parts such as liquid recovery unit 74, recovery pipe line 66 connecting to liquid recovery unit 74, the plurality of recovery pipes 52 respectively connected to recovery pipe line 66 via valves 62b, the tapered nozzle section communicating with the tip of each recovery pipe 52, and the like.

In addition, in exposure apparatus 100, an auxiliary recovery mechanism is formed by parts such as vacuum exhaust unit 76, vacuum piping system 69 connecting to vacuum exhaust unit 76, auxiliary recovery pipes $60_1$ to $60_4$ connecting to vacuum piping system 69 via valves 62e, slits $32h_1$ to $32h_4$ of liquid supply/drainage unit 32 connecting to each of the auxiliary recovery pipes, respectively, and the like. This auxiliary recovery mechanism can remove (recover) the liquid on wafer W that the liquid recovery mechanism could not recover. In the embodiment, the auxiliary recovery mechanism removes (recovers) the remaining liquid on wafer W by suction; however, it also may be removed by blowing dry air to dry up the liquid, or blown and scattered.

In addition, in exposure apparatus 100, a supply mechanism, that suppresses the environmental change in the periphery of the water (liquid), which occurs due to suction by vacuum exhaust unit 76, is made up of parts such as air conditioning mechanism 86 and gas supply nozzles $85_3$ and $85_4$, and the like.

In addition, in exposure apparatus 100, a drive system, that drives reticle stage RST and wafer stage WST synchronously in the scanning direction with respect to illumination light IL in order to transfer the reticle pattern onto wafer W in a scanning exposure method, is constituted by reticle stage drive section 11, wafer stage drive section 24, and stage control unit 19.

In addition, ring-shaped side wall 32c is provided so as to partition opening 32a (lens 42 on the image plane side of projection optical system PL is disposed in the center of opening 32a) formed in the center of liquid supply/drainage unit 32, and ring-shaped depressed section 32b is also provided on the outer side of ring-shaped side wall 32c whose ceiling height is set higher than other sections, therefore, even when the water (liquid) is supplied into liquid supply/drainage unit 32, a void space remains within the inside of ring-shaped depressed section 32b. In this manner, in exposure apparatus 100, an bubble recovery mechanism is made up of parts such as ring-shaped side wall 32c, ring-shaped side wall 32e, exhaust pipes 54 connecting to the upper space of ring-shaped depressed section 32b formed by ring-shaped side wall 32c and ring-shaped side wall 32e, and the like. Furthermore, in this case, because ring-shaped side wall 32c and ring-shaped depressed section 32b are both formed surrounding projection unit PU covering the entire circumference, it is substantially equivalent to having a large number of bubble recovery mechanisms provided covering all directions.

In addition, in exposure apparatus 100, an adjustment unit is configured to adjust the exposure conditions, or more specifically, offset of the focal position detection system (90a, 90b), conditions related to focus leveling control of wafer W (imaging conditions), and the like, based on the actual measurement values (measured by temperature sensors 38A and 38B) of temperature information on the water between projection optical system PL (to be more precise, lens 42) and wafer W and pressure information on the water between projection optical system PL (to be more precise, lens 42) and wafer W, the unit being constituted by main controller 20. Furthermore, in exposure apparatus 100, a prediction unit is configured to predict the temperature change of the water that occurs when the water passes through the irradiation area of illumination light IL on the wafer, based on detection results of the two temperature sensors 38A and 38B disposed on one end and the other end in the scanning direction, respectively, the unit also being constituted by main controller 20.

The number of temperature sensors does not necessarily have to be two, and if the temperature change can be obtained by one sensor, only one may be necessary. Or, in order to obtain a more detailed temperature distribution, the exposure apparatus may comprise three or more temperature sensors.

As is described in detail, according to exposure apparatus 100 in the embodiment, when the reticle pattern is transferred onto each shot area on wafer W based on the scanning exposure method, the supply operation of supplying the water to the space between projection unit PU (projection optical system PL) and wafer W on wafer stage WST and its recovery operation are performed in parallel, by the supply mechanism and the recovery mechanism described above. That is, exposure (transferring the reticle pattern onto the wafer) is performed in a state where a predetermined amount of water (the water is exchanged at all times) is always filled (held) between lens 42, which constitutes projection optical system PL at its tip, and wafer W mounted on wafer stage WST. As a consequence, the immersion method is applied and the wavelength of illumination light IL on the surface of wafer W can be shortened to 1/n of the wavelength in the atmosphere (n is the refractive index of the water, which is 1.4), which improves the resolution of the projection optical system. In addition, because the water supplied is exchanged at all times, foreign matters found on wafer W can be removed by the flow of water.

In addition, the depth of focus of projection optical system PL is enlarged around n times when compared with that of the atmosphere; therefore, it is advantageous when focus leveling operation of wafer W is performed using the focal position detection system (90a, 90b), because it makes it more difficult for defocus to occur. And, in the case when the depth of focus has to be secured only around the same level as in the case of the air, the numerical aperture (NA) of projection optical system PL can be increased, which also improves the resolution.

In addition, when bubbles are found in the water (liquid) supplied from the supply mechanism, or when bubbles are generated just after the water has been supplied, such bubbles are collected at the upstream side of the flow with respect to projection unit PU (projection optical system PL), by the bubble recovery mechanism. That is, the bubbles in the water are collected by the bubble recovery mechanism, without reaching the space below lens 42. Therefore, such an operation can prevent the transmittance of illumination light IL from partially decreasing or the projected image of the pattern from degrading due to the bubbles that enter the space between lens 42 and wafer W.

In addition, as is obvious from FIGS. 10A and 10B, the bubble recovery position of the bubble recovery mechanism used for collecting bubbles is switched, in accordance with the moving direction of wafer W (for example, the moving direction in FIGS. 10A and 10B is the scanning direction). Therefore, regardless of the direction that wafer W moves in, the bubbles can be kept from entering the space between lens 42 and wafer W during such movement.

In addition, when the plurality of shot areas on wafer W are sequentially being exposed, for example, in the case a situation occurs where the water cannot be completely collected by the recovery mechanism referred to above, such as when the water leaks outside liquid supply/drainage unit 32, then the water that could not be collected, or in other words, the water that has leaked out, is removed (recovered) from wafer W by the auxiliary recovery mechanism described above. With this operation, the water does not remain on wafer W; therefore, various inconveniences that occur due to the remaining (residual) water can be avoided. That is, measurement errors of wafer interferometer 18, which measures the position of wafer stage WST, can be effectively suppressed by suppressing the occurrence of temperature distribution in the atmosphere or by suppressing the occurrence of a refractive index change in the atmosphere, caused by the heat of vaporization when the remaining water evaporates. Furthermore, such an operation can prevent the water remaining on the wafer from moving to the back of the wafer, so that the situation where the wafer sticks to the carrier arm and becomes difficult to separate from the carrier arm can be avoided.

In addition, exposure apparatus 100 comprises peripheral wall 32f (projected section 32g), which surrounds at least the periphery of lens 42 serving as an optical element of projection optical system PL closest to the wafer and also creates a predetermined clearance with respect to the surface of wafer W on wafer stage WST, and the clearance is set to a small value of around $\Delta h = 1$ to 2 mm. Therefore, the contact area between the water within peripheral wall 32f and the outside air is set extremely small, and by the surface tension of the water the liquid is kept from leaking outside peripheral wall 32f via the clearance. Therefore, it becomes possible, for example, to recover the liquid (water) used in the immersion method without fail after the completion of exposure.

In addition, according to exposure apparatus 100 in the embodiment, even when wafer stage WST moves to a position where projection unit PU (the projection area of projection optical system PL) is away from wafer W in a state where the water is held between projection optical system PL (lens 42) and wafer W, such as when a shot area in the periphery on wafer W is exposed, or when the wafer on wafer stage WST is exchanged after the exposure has been completed, the water can be kept from flowing outside by holding the water between the projection optical system and auxiliary plates (any of the plates from 22a to 22d). Such an arrangement can prevent various inconveniences caused by the outflow of water from occurring. Furthermore, because the gap between auxiliary plates 22a to 22d and wafer W is set to 3 mm and under, the surface tension of the water prevents the water from flowing into the gap between wafer W and the auxiliary plate in a case, such as when wafer stage WST moves from a state where wafer W is under projection unit PU (projection optical system PL) to a position where wafer W is away from projection unit PU. The inventors have confirmed that leakage hardly occurs due to the surface tension of the water even when there is a surface difference of around 1 mm between the surface of the wafer and the surface of the auxiliary plate.

In addition, for example, when exposure begins after wafer W has been exchanged, because the water is held between projection unit PU (lens 42 of projection optical system PL) and the auxiliary plate prior to the beginning of exposure, exposure can begin without waiting for the water to be supplied, which consequently improves the throughput.

In addition, because the water supply into liquid supply/drainage unit 32 begins on auxiliary plate 22a before the exposure begins, the risk of the resist being partly removed by water pressure or the like as is often the case when starting the water supply on wafer W can be avoided.

In addition, because air conditioning mechanism 86 (including gas supply nozzles) air conditions the periphery of liquid supply/drainage unit 32 where the water is held, turbulence of the gas flow in the atmosphere (such as the air within the chamber where the main body of the exposure apparatus is housed) around the water held inside liquid supply/drainage unit 32 can be prevented when the water is recovered by the recovery mechanism or by the auxiliary recovery mechanism, which in turn prevents measurement errors of wafer interferometer 18 that may occur due to the turbulence of the gas flow (including temperature fluctuation of the gas, refractive index change, and the like), and allows the position of wafer stage WST to be measured with good accuracy.

Accordingly, with exposure apparatus 100 in the embodiment, due to the various kind of effects as is described above, the pattern of reticle R can be transferred onto each of the plurality of shot areas on wafer W with an extremely good accuracy. In addition, exposure can be performed with a wider depth of focus when compared with that of the air.

The arrangement of each section described in the above first embodiment is a mere example, and it is a matter of course that the present invention is not limited to this. For example, in the embodiment above, while wafer stage WST is moving, main controller 20 adjusts the degree of opening (including a fully closed state and a fully opened state) of each valve constituting valve groups 62a and 62b so that a water flow is created under lens 42 that moves from the rear side of projection unit PU to the front side in the moving direction of wafer stage WST. On the contrary, while wafer stage WST is moving, main controller 20 may adjust the degree of opening (including a fully closed state and a fully opened state) of each valve constituting valve groups 62a and 62b so that a water flow is created under lens 42 that moves from the front side of projection unit PU to the rear side in the moving direction of wafer stage WST. In such a case, the auxiliary recovery mechanism referred to earlier is to recover the remaining liquid on the front side of projection unit PU (projection optical system PL) in the moving direction of wafer W. That is, the remaining liquid is recovered via slit $32h_i$ located on the front side in the moving direction of the wafer and auxiliary recovery pipe $60_i$ (i=any of 1 to 4) communicating with the slit.

In addition, in the first embodiment described above, an auxiliary recovery mechanism is constituted by parts such as slits $32h_1$ to $32h_4$ formed in a part of liquid supply/drainage unit 32, auxiliary recovery pipes $60_1$ to $60_4$ communicating with slits $32h_1$ to $32h_4$, respectively, vacuum exhaust unit 76, and the like, however, for example, air conditioning mechanism 86 may include a suction mechanism that suctions liquid (liquid and gas). That is, air conditioning mechanism 86 may incorporate a vacuum pump, and a suction nozzle connecting to the vacuum pump may be disposed in the vicinity of each gas supply nozzle previously described. By employing such an arrangement, the vacuum pump serving as a suction mechanism may also perform the function of recovering the water that the recovery mechanism previously described could not recover (the water that leaks outside liquid supply/drainage unit 32). In this case, slits $32h_1$ to $32h_4$ do not have to be formed in liquid supply/drainage unit 32, and in accordance with the position where the suction nozzle is disposed, the suction nozzle may be able to cope with water leakage in a slightly larger range. In addition, in the embodiment described above, the water supply and recovery are performed while wafer W is being exposed. In the case, however, the water can be held by surface tension, water supply and recovery operations do not have to be performed during exposure.

In addition, air conditioning mechanism 86 may remove the remaining water from wafer W that could not be recovered by the recovery mechanism outside peripheral wall 32g by providing dry air or hot air so as to dry the remaining water.

In the embodiment above, fiducial mark plate FM is disposed on a part of the auxiliary plate, however, instead of this arrangement, or along with fiducial mark plate FM, a reference reflecting plate used for calibration of the focal position detection system (90a, 90b) may be disposed on a part of the auxiliary plate. Or, the reference reflecting plate and fiducial mark plate FM may be combined in one plate. In addition, the auxiliary plate is provided covering the entire periphery of wafer W, however, it can be also disposed partially at required places, or it can be disposed spaced apart at a predetermined interval.

In addition, in the embodiment above, besides the stepping operation between shots and scanning exposure when wafer stage WST is standing still, main controller 20 may cease both the water (liquid) supply operation by the supply mechanism previously described and the water recovery operation by the recovery mechanism also previously described. Even in such a case, the water inside liquid supply/drainage unit 32 is held due to the action of negative pressure described earlier and the surface tension of the water. Because the need to exchange the water is lower in the case wafer stage WST is stationary when compared with the case of stepping operation between shots and scanning exposure, the amount of liquid to be used can be reduced compared with the case when both the liquid supply operation by the supply mechanism and the liquid recovery operation by the recovery mechanism are performed in parallel at all times (not only when wafer stage WST is moving, but also when it is still). However, by continuing the water supply and drainage while wafer stage WST is stationary, it may free the lower surface of lens 42 from contamination.

In addition, in the embodiment above, the case has been described where as a premise, the water supply position and the water drainage position shown in FIGS. 8A and 8C, respectively, do not have any relation with the wafer exchange position (wafer unload position and load position). The present invention, however, is not limited to this, and for example, the water supply position may serve as the wafer loading position and the water drainage position as the unload position. Such an arrangement may be realized by adjusting the relation between the area of the tip of projection unit PU and the area of wafer stage WST (to be more precise, the auxiliary plate) so that projection PU does not get in the way of wafer transportation. In this case, the water supply and the water drainage may be continued or sustained at the unload position and load position of the wafer. In such a case, the load position and the unload position of the wafer may be set at the same position (referred to as a waiting position) where fiducial mark plate FM is to be positioned directly below projection unit PU, and the area of wafer stage WST (or to be more precise, the auxiliary plate) may be set so that the tip of projection unit PU is located above any one of auxiliary plates 22a to 22d during wafer alignment.

In such a case, because it becomes possible to hold the water at all times under lens 42, the water supply and water drainage previously described may be continued during a period other than the exposure operation based on the step-and-scan method. In this case, once the water is supplied under lens 42, exposure of a plurality of wafers can be continuously performed without draining all the water under lens 42.

In addition, in the embodiment above, liquid supply/drainage unit 32 comprising peripheral wall 32f is used in order to hold the water under lens 42 of projection unit PU, however, the present invention is not limited to this. That is, for example, liquid supply/drainage unit 32 does not have to be used. Even in such a case, because the distance (working distance) between lens 42 of projection optical system PL and wafer W is around 3 mm, the water is held by surface tension between lens 42 and wafer W. In addition, in this case, for example, a mechanism similar to the liquid supply mechanism and liquid recovery mechanism, disclosed in the pamphlet of International Publication Number WO99/49504 or the like previously described, may be provided. In such an arrangement, due to the auxiliary plates described earlier, even when projection unit PU deviates from above wafer W such as when the wafer edge section is exposed, the water can be kept from leaking from under lens 42 unlike patent document 1. In this case, while wafer stage WST is standing still, the water supply and water drainage may also be stopped. In this case, due to the immersion method, exposure with high resolution (or exposure with a wider depth of focus compared with the case in the atmosphere) can be performed. Accordingly, the pattern can be transferred onto the wafer with good accuracy.

In the case, however, as in the embodiment above, a unit like liquid supply/drainage unit 32 whose nozzle section and the enclosure (peripheral wall 32*f*) around lens are integrated is used, the exchange operation can be done all at once, which simplifies the maintenance operation.

In the embodiment above, the valves for supplying and draining the water connect directly to the nozzle section of liquid supply/drainage unit 32 via piping, and as these piping, flexible tubes are preferably used. Furthermore, the tubes that connect to the valves and factory piping are preferably separated mechanically from the main body of the exposure apparatus and projection unit PU via springs, so that the vibration does not spread. And, such an arrangement can prevent vibration and water hammer that accompany the opening and closing of the valves from traveling and affecting the projection unit PU and the main body of the exposure apparatus, and becoming the cause of various errors.

In addition, in exposure apparatus 100 of the embodiment above, in the case multiple exposure such as double exposure is performed, after the first pattern is transferred onto a plurality of divided areas (shot areas) on wafer W based on the step-and-scan method in a state where the space between projection unit PU (lens 42 of projection optical system PL) and wafer W is filled with the liquid, the second pattern may be transferred on the plurality of shot areas on wafer W with the water being held between lens 42 and wafer W. In this case, as reticle stage RST, a stage that can hold two reticles based on the so-called double reticle holder method is preferably used, such as the one disclosed in, for example, Japanese Patent Application Laid-open No. H02-166717. With this arrangement, because reticle alignment and wafer alignment do not have to be performed between the first shot and the second shot, double exposure can be performed without any problems in a state where the space between projection unit PU (lens 42 of projection optical system PL) and wafer W is filled with the liquid between the exposure of the first pattern and the exposure of the second pattern. In this case, multiple exposure that uses the immersion method is applied, and a highly precise exposure with high resolution and a substantially enlarged depth of focus can be performed. In this case, since the liquid is held between lens 42 and wafer W at the point where exposure begins on the second pattern, the exposure of the second pattern can start without waiting for the liquid to be supplied.

In the embodiment above, reticle alignment may be performed in a state where the space between projection unit PU (lens 42 of projection optical system PL) and fiducial mark plate FM is filled with the water.

In addition, in the embodiment above, main controller 20 serving as an adjustment unit obtains the aberration within the irradiation area of illumination light IL, such as the temperature change coefficient that corresponds to the change in best focus position, based on the measurement results of temperature sensors 38A and 38B (the actual measurement values of temperature information on the water between projection optical system PL (lens 42) and wafer W), however, main controller 20 may obtain the temperature change coefficient based on prediction values of temperature information on the water between projection optical system PL (lens 42) and wafer W instead. In this case, information on the transmittance of reticle R and the reflectance of wafer W that have been measured is stored in advance in memory 21, and when exposure is performed, main controller 20 obtains the thermal absorption amount of the wafer by performing a predetermined calculation using the output of integrator sensor 14, the transmittance of reticle R and the reflectance of wafer W, and then predicts the temperature rise (temperature distribution) of the water in the irradiation area, based on the obtained thermal absorption amount and information on the water flow (flow speed and flow rate) under lens 42 due to water supply, water drainage, and scanning operation. Then, main controller 20 can obtain the temperature change coefficient based on the prediction results, in a manner similar to the one described in the embodiment above. As a matter of course, when obtaining the temperature change coefficient, main controller 20 may use the actual measurement values of temperature information on the water between projection optical system PL (lens 42) and wafer W and the predicted values based on the output of integrated sensor 14 and the like described above at the same time.

In addition, in the embodiment above, main controller 20 obtains the temperature change coefficient and the pressure change coefficient, and then obtains the best focus position within the irradiation area based on a formula or the like that includes both the coefficients as parameters. The present invention, however, is not limited to this, and main controller 20 may obtain either one of the temperature change coefficient and the pressure change coefficient, and then may obtain the best focus position within the irradiation area by using the formula referred to above but substituting zero as the remaining change coefficient. In this case, main controller may obtain the best focus position directly from a formula that does not include the temperature change coefficient and the pressure change coefficient as parameters, such as from the temperature distribution or the pressure distribution of the water within the irradiation area.

In addition, in the embodiment above, the case has been described where as the exposure condition, main controller 20 adjusts the offset of the focal position detection system and performs the focus leveling of wafer W, based on the best focus positions on both ends of the scanning direction within the irradiation area obtained in the manner described above. The present invention, however, is not limited to this, and the pattern surface of reticle R may be adjusted or the inclination of the image plane itself of projection optical system PL may be adjusted via image forming quality correction controller 81, as the exposure condition, based on the obtained best focus positions on both ends of the scanning direction within the irradiation area. Then, when the inclination of the image plane cannot be totally corrected, main controller 20 may perform the offset adjustment of the focal position detection system and perform the focus leveling of wafer W described in the embodiment above, based on the state of the image plane after correction.

In addition, in the case when it is predicted that the temperature change (temperature distribution) of the water will affect the measurement of the focal position detection system (90*a*, 90*b*), focus leveling control may be performed taking into consideration measurement errors due to the temperature change (temperature distribution) of the water, or the detection results of the focal position detection system (90a, 90b) may be corrected based on the output of temperature sensors 38A and 38B, and focus leveling control may be performed, based on the corrected detection results.

In addition, furthermore in the embodiment above, the pressure change (pressure distribution) of the water is obtained in advance by simulation or by experiment, and the movement of Z tilt stage 30 is controlled based on the results, however, the movement of Z tilt stage 30 may also be controlled, for example, based on the measurement results of the pressure of the water, which may be measured by a pressure sensor attached to the liquid supply/drainage unit.

In addition, the embodiment above focuses on the pressure change of the water due to the water flow. However, the movement of wafer stage WST may be controlled and the imaging operation may be corrected by taking into consideration the water pressure in the case no water flow exists (in the case the liquid supply/drainage unit does not perform the water supply/recovery).

In addition, the embodiment above describes the case where focus leveling control error due to the temperature change or pressure change does not occur, however, in the case changes occur in the various types of aberrations (such as spherical aberration, astigmatism, distortion, and magnification) of the image of the pattern projected within the irradiation area on wafer W due to the temperature change or pressure change as is described above, such changes may be corrected by operations such as adjusting projection optical system PL, adjusting the wavelength of illumination light IL, and moving reticle R, based on the temperature change (temperature information) and the pressure change (pressure information) of the water.

Depending on the type of resist on the wafer, resist substances may dissolve into the water and have an adverse effect on the image forming. In such a case, it is necessary to reduce the influence that the dissolved material of the resist, which seeps out when the previous shot area is exposed, has on the image forming of the next shot. The following second embodiment has been made from such an aspect.

Second Embodiment

A second embodiment of the present invention is described below, referring to FIGS. 11A to 11F. For parts that have the same or similar arrangement as the first embodiment previously described, the same reference numerals will be used, and the description thereabout will be brief, or entirely omitted. The arrangement of an exposure apparatus in the second embodiment is similar to that of the first embodiment, other than the supply/drainage method of the water via liquid supply/drainage unit 32 by main controller 20. Accordingly, from the viewpoint of avoiding any repetition, the following description will be made focusing on the points different from the first embodiment.

In the exposure apparatus of the second embodiment, when operations other than the exposure operation based on the step-and-scan method is performed, more specifically, when wafer exchange and predetermined preparatory operations (reticle alignment, baseline measurement of the alignment detection system, and wafer alignment) are performed, the wafer exchange and the predetermined preparatory operations are performed in the same manner as in the first embodiment except for the point that the supply and recovery (drainage) of the water on wafer W are not performed at all during such operations.

Accordingly, in the description below, operations when transferring a reticle pattern onto a plurality of shot areas on a wafer based on the step-and-scan method will be described, especially the operation during scanning exposure of shot areas and the stepping operation in between shots.

As a premise, liquid supply unit 72, liquid recovery unit 74, and vacuum exhaust unit 76 shown in FIG. 6 are to be operating, and the valves in valve groups 62a and 62b fully open, while valve 62c is fully closed, and the valves in valve groups 62d and 62e are opened to a predetermined degree.

FIGS. 11A to 11F show a water supply/drainage operation flow while wafer stage WST is scanned to expose a shot area of an exposure apparatus related to the second embodiment. The water supply/drainage method in the second embodiment will now be described below, referring to the drawings.

Figure 11A:
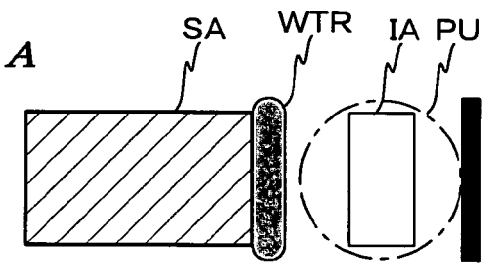
FIGS. 11A to 11F are views that show a flow of a supply/drainage operation in an exposure apparatus related to a second embodiment when a wafer stage is scanned to expose a shot area.

FIG. 11A shows a state where a shot area SA subject to exposure nears a projection area (an irradiation area on wafer W where illumination light IL is irradiated via reticle R and projection optical system PL) IA of projection unit PU by stage control unit 19 driving wafer stage WST (at this point, reticle stage RST is also driven in the opposite direction of wafer stage WST at a speed corresponding to the projection magnification) under the control of main controller 20. While wafer stage WST is moving, main controller 20 adjusts the degree of opening of each valve in valve group 62a of the water supply so that the water is supplied on wafer W via supply pipes 58 on the rear side of projection unit PU with respect to the moving direction (scanning direction). The gray area (WTR) in FIG. 11A shows the area on the surface of wafer W which is covered with water. In this state, each valve of valve group 62b of the water drainage (water recovery) is set at a fully closed state as is previously described.

Figure 11B:
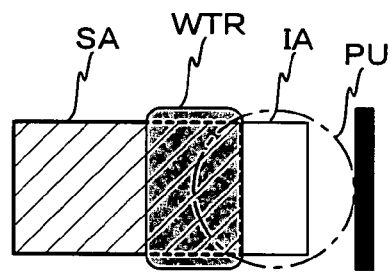

Then, wafer stage WST moves in the scanning direction while the water supply continues, and the area covered with water (WTR) spreads along with the movement of wafer stage WST (wafer W) as is shown in FIG. 11B. The state shown in FIG. 11B is the state immediately before shot area SA subject to exposure is about to be exposed.

Then, when shot area SA reaches the exposure area, exposure of shot area SA is performed in the same manner as is previously described.

Figure 11C:
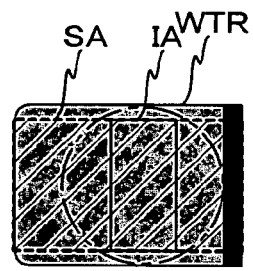

During exposure, as is shown in FIG. 11C, part of shot area SP that passes through projection area IA is in a state covered with water at all times.

From the point shown in FIG. 11C (or from before such a point), main controller 20 adjusts the degree of opening of each valve in valve group 62b of the water drainage so as to collect the water covering the part where exposure has been completed. In this case, the valves in valve group 62b, which are provided at a position substantially symmetrical to the valves in valve group 62a that are opened for water supply with respect to projection unit PU, are opened.

Figure 11D:
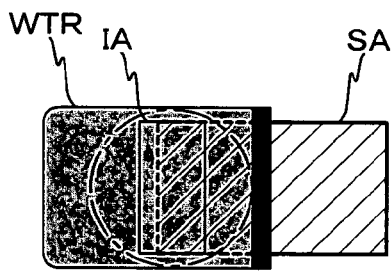
Figure 11E:
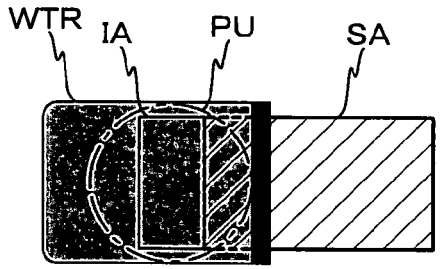

And, as is shown in FIG. 11D, stage control unit 19 drives wafer stage WST while exposure of shot area SA that passes through projection area IA is being performed and the water that covers the part where exposure has been completed is collected. Then, as is shown in FIG. 11E, exposure of shot area SA is completed.

Figure 11F:
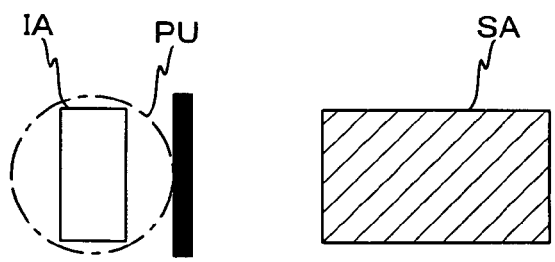

As soon as exposure is completed in the manner above, at the same time main controller 20 completely closes each of the valves in valve group 62a used for water supply. Then, at the stage where water on wafer W is completely drained as is shown in FIG. 11F, main controller 20 completely closes each of the valves of valve group 62b.

In the manner described above, exposure operation to a shot area SA, and the water supply/recovery operation, or in other words, the water supply/drainage operation performed synchronously with the exposure operation is completed.

Then, according to instructions given from main controller 20, stage control unit 19 performs the stepping operation between shots in the same manner as in the first embodiment. However, during the stepping operation, none of the water is supplied on wafer W.

Then, for the next shot area, scanning exposure (transfer of the reticle pattern) and the water supply/drainage operation synchronous to the exposure operation are performed in the same manner as is described above. In this case, main controller 20 controls each section so that the moving direction of wafer W and the flow direction of the water supplied on wafer W are in the opposite of the case described in FIGS. 11A to 11E.

And, in the manner described above, the scanning exposure of the shot area on wafer W and the stepping operation between shots are repeatedly performed, and the circuit pattern of reticle R is sequentially transferred onto the plurality of shot areas serving as divided areas on wafer W.

As is described above, according to the exposure apparatus in the second embodiment, the water supply by the supply mechanism previously described to the inside of peripheral wall 32f, which includes the space between projection unit PU (lens 42 of projection optical system PL) and wafer W on wafer stage WST) and the water recovery by the recovery mechanism are performed in sync with the exposure operation to each shot area on wafer W. Therefore, when a pattern is transferred onto the shot area on wafer W subject to exposure based on the step-and-scan method, while the shot area passes through irradiation area IA of illumination light IL via projection optical system PL, a predetermined amount of water (the water can be exchanged at all times) can be filled between lens 42 and wafer W, and by the immersion method, exposure with high resolution and a wider depth of focus can be performed when compared with the case when exposure is processed in air. On the other hand, besides the irradiation period while the shot area subject to exposure passes through irradiation area IA or the period including the irradiation period and a slight length of time after the irradiation period, wafer W can be in a state free of any water on its surface. That is, when the plurality of shot areas on wafer W is sequentially exposed, because the supply and the full recovery of the water between lens 42 of projection optical system PL and wafer W are repeatedly performed each time exposure of the shot area is performed, decrease in transmittance of illumination light IL, adverse effect on the image forming, and the like due to substances of the photosensitive agent (resist) on wafer W dissolving into the water can be suppressed.

In addition, in the exposure apparatus in the second embodiment, the supply mechanism has a plurality of supply nozzles 36 in the periphery of irradiation area IA, and supply nozzle 36 used for water supply switches in accordance with the scanning direction (moving direction) of wafer W. More specifically, each time a shot area is exposed, the water is supplied by the supply mechanism from the rear side in the scanning direction of wafer W, and corresponding to this operation, the water is fully recovered by the recovery mechanism on the front side in the scanning direction. Therefore, the immersion method is applied to each exposure of the shot area, regardless of the scanning direction.

In addition, the water supplied to the inside of peripheral wall 32f from the rear side in the scanning direction of wafer W by the supply mechanism previously described, is recovered by the recovery mechanism also previously described on the front side of projection unit PU in the scanning direction. In this case, the water supplied flows along in the scanning direction of wafer W in between lens 42 and wafer W. Therefore, in the case foreign matters are found on wafer W, the water flow removes such substances.

In addition, also in the second embodiment, bubbles found in the water are collected by the bubble recovery mechanism previously described as in the first embodiment, at the rear side of projection unit PU in the scanning direction of the wafer. In this case, when the scanning direction of wafer W is switched, then corresponding to such an operation, the bubble recovery mechanism used for collecting the bubbles is also switched.

In addition, in the exposure apparatus in the second embodiment, when the pattern is transferred, the water supply by the supply mechanism is stopped at the point where the rear end of the shot area subject to exposure moves off irradiation area IA due to the movement of the wafer stage in the scanning direction. Therefore, this effectively suppresses vibration caused by the drive of the valves and the water hammer accompanying the drive from traveling to projection unit PU and degrading the image forming quality of projection optical system PL. Furthermore, the amount of water supplied can be reduced as much as possible, so as to reduce the time required for recovery.

In addition, in the exposure apparatus in the second embodiment, when the pattern has been transferred on a shot area subject to exposure, the water is recovered by the recovery mechanism before the stepping operation of wafer stage WST between shots performed prior to the pattern transfer of the next shot area begins. Therefore, this frees the exposure of the next shot area from adverse effects due to substances of the photosensitive agent (resist) of wafer W dissolving into the water. Furthermore, the water supply and recovery mechanism in the stepping direction can be omitted.

In the second embodiment described above, the case has been described where the supply mechanism begins the water supply when the front end of the shot area subject to exposure in the scanning direction reaches the supply position (or immediately before) as is shown in FIG. 11A. The present invention, however, is not limited to this, and the supply mechanism may begin the water supply at either point; after the stepping operation of wafer stage WST between transferring the pattern onto the shot area subject to exposure and transferring the pattern onto the preceding shot area has been completed, after wafer stage WST has begun its movement for exposure of the succeeding shot area, and before the front end of the shot area subject to exposure in the scanning direction reaches the supply position. In this case, the supply mechanism supplies the water to the inside of peripheral wall 32f, which includes the space between projection unit PU (lens 42 of projection optical system PL) and wafer W on wafer stage WST, from the rear side in the moving direction (scanning direction) of wafer W, and fills the space between lens 42 and wafer W with the water upon the movement of wafer W. In this case, when shot area SA on wafer W subject to exposure moves to the position under lens 42, the water is supplied on shot area SA without fail before shot area SA reaches the position under lens 42. That is, when wafer W is moved in the scanning direction, water is supplied to the space between lens 42 and the surface of wafer W. Accordingly, by performing exposure (transfer of the pattern of reticle R onto wafer W) of shot area SA, which serves as the area subject to exposure, the immersion method previously described is applied, and exposure is performed with high resolution and a wider depth of focus compared with the case when exposure is processed in air.

In the second embodiment described above, as is shown in FIG. 12, for example, on the lower end section of liquid supply/drainage unit 32, a plurality of partitions 87a and 87b extending in the scanning direction may be provided, at positions on both sides in the non-scanning direction of a plurality of supply nozzles 36 (supply nozzles that are within a range corresponding to projection area (irradiation area) IA of the pattern in the non-scanning direction) arranged spaced apart in the non-scanning direction. In this case, within each area partitioned by partitions 87a and 87b where supply nozzles 36 are each disposed, recovery pipes 52 are disposed with each pipe corresponding to each of the supply nozzles 36. Then, main controller 20 may switch supply nozzle 36 used for water supply by the water supply mechanism in accordance with the position of the shot area on wafer W subject to exposure, and accordingly, recovery pipes 52 used for water recovery may also be switched. In this case, supply nozzles 36 and recovery pipes 52 may be switched by the selective open/close operation of each valve in valve groups 62a and 62b.

Figure 12:
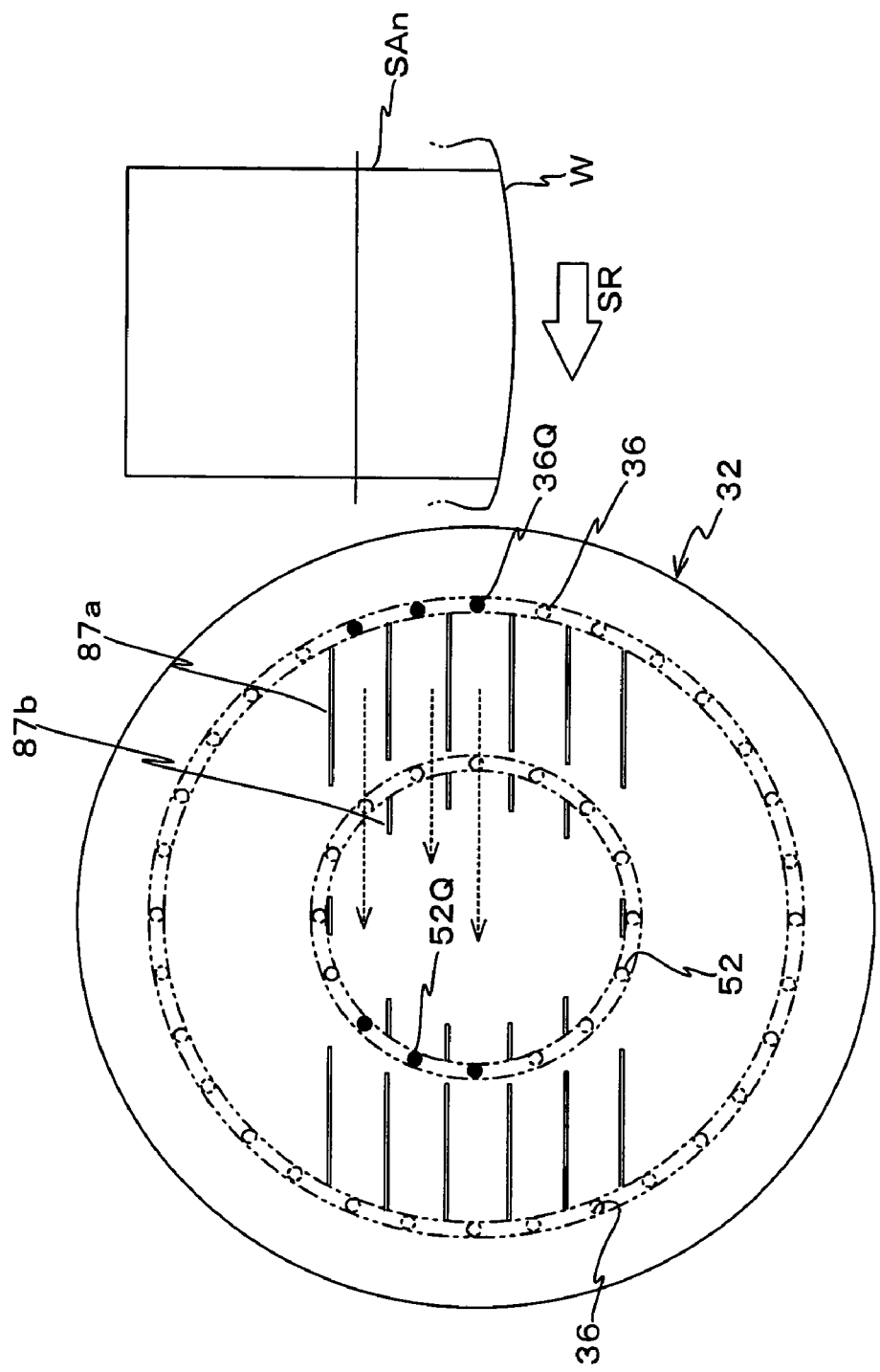
FIG. 12 is a view for describing the case when an edge shot on a wafer is exposed with the exposure apparatus in the second embodiment that employs a liquid supply/drainage unit related to a modified example in which a plurality of partitions are provided extending in parallel with a scanning direction.

Normally, a plurality of so-called chipped shots that are partly chipped is located in the periphery on wafer W, and in such chipped shots, there are some shots like shot area $SA_n$ in FIG. 12 whose size in the non-scanning direction is smaller than that of other shot areas (shot areas located in the inner section on wafer W). The position of chipped shot $SA_n$ on wafer W and the shape of the shot (including the size) is known. Therefore, when exposing $SA_n$, main controller 20 can perform the open/close control of each valve in valve groups 62a and 62b so that the water is supplied from, for example, supply nozzle 36Q indicated by a ● in FIG. 12, and recovered by recovery pipe 52Q also indicated by a ●. And, when such a control is performed, water supply/drainage is not performed in the chipped part in shot area $SA_n$. Accordingly, by completely draining the water from the area on wafer W other than the shot area subject to exposure before the exposure, it can prevent the water from leaking as much as possible when exposing the chipped area, even in the case where the size of auxiliary plates 22a to 22d of wafer holder 70 cannot be increased.

In this case, it is a matter of course that supply nozzle 36 used for water supply and recovery pipe 52 are switched, in accordance with the scanning direction of wafer W.

In addition, main controller 20 may switch supply nozzle 36 used for water supply by the water supply mechanism in accordance with the size of the shot area in the non-scanning direction instead of the position of the shot area subject to exposure on the wafer, as well as accordingly switch recovery pipe 52 used for collecting the water. In such a case, even when transferring a pattern of a different size onto the same or a different wafer, exposure can be performed smoothly.

In addition, in the second embodiment described above, the case has been described where the water supply is stopped when exposure of the shot area on wafer W has been completed (refer to FIG. 11E). The present invention, however, is not limited to this, and it is possible to employ an exposure sequence such as the one shown in FIGS. 13A to 13F.

Figure 13A:
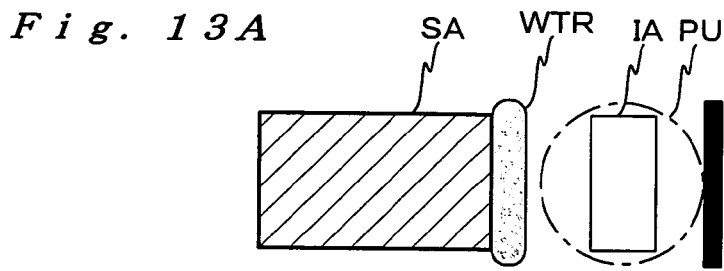
FIGS. 13A to 13F are views for describing a modified example of the second embodiment that show a flow of a supply/drainage operation when a wafer stage is scanned to expose a shot area.
Figure 13B:
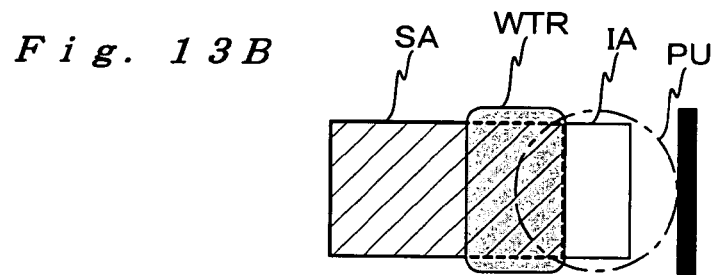
Figure 13C:
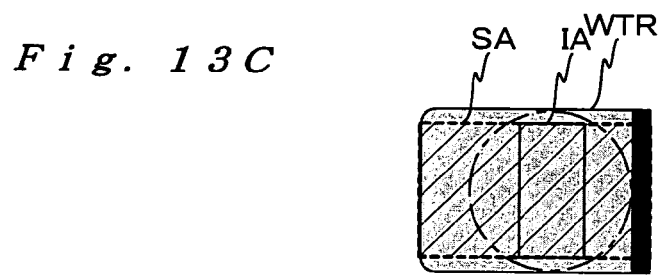
Figure 13D:
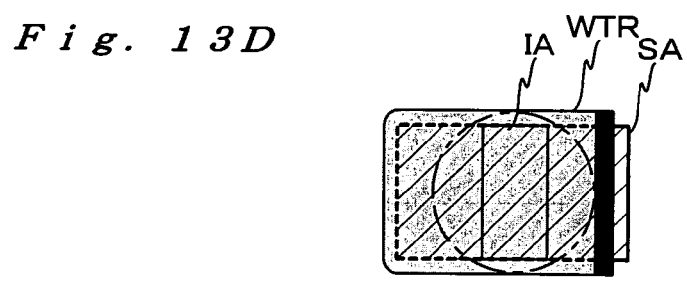
Figure 13E:
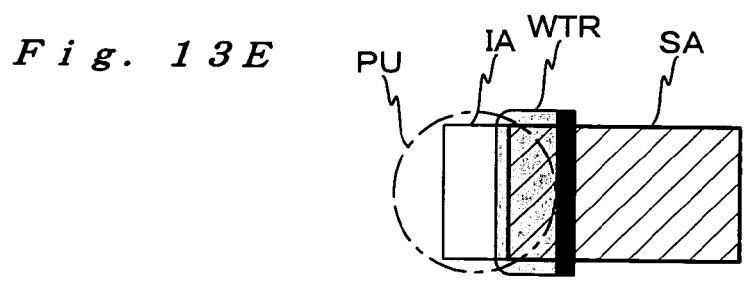
Figure 13F:
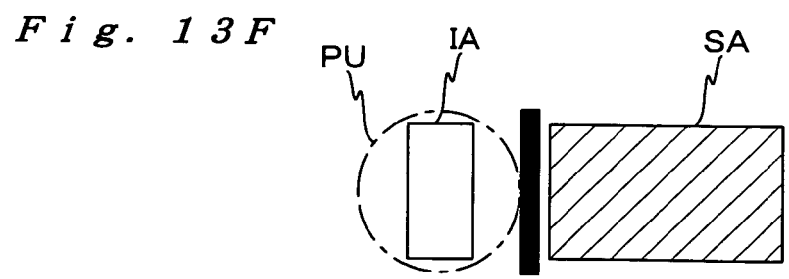

In this case, the processing in FIGS. 13A to 13C is the same as in FIGS. 11A to 11C previously described. However, at the point just before the rear end of shot area SA subject to exposure in the scanning direction moves off irradiation area IA, or to be more specific, at the point where the rear end of shot area SA reaches the supply position (water supply position (the position of supply pipe 58)) shown in FIG. 13D, main controller 20 completely closes valve group 62a, and cuts off all water supply until the exposure operation is over. This reduces the time required to drain the water completely, because the range to which the water is supplied is smaller (refer to FIGS. 13E and 13F) when compared with the case described referring to FIGS. 11A to 11F. Accordingly, in the case vibration generated on water supply/drainage only has a small influence on exposure accuracy, the throughput can be effectively improved. In this case, again, the water is collected by the recovery mechanism, after the pattern has been transferred onto shot area SA and before the stepping operation of wafer stage WST between shots prior to the pattern transfer onto the next shot area begins (refer to FIG. 13F).

As the liquid supply/drainage unit, its arrangement is not limited only to the ones described in the embodiments above, and various types of arrangement can be employed.

Figure 14A:
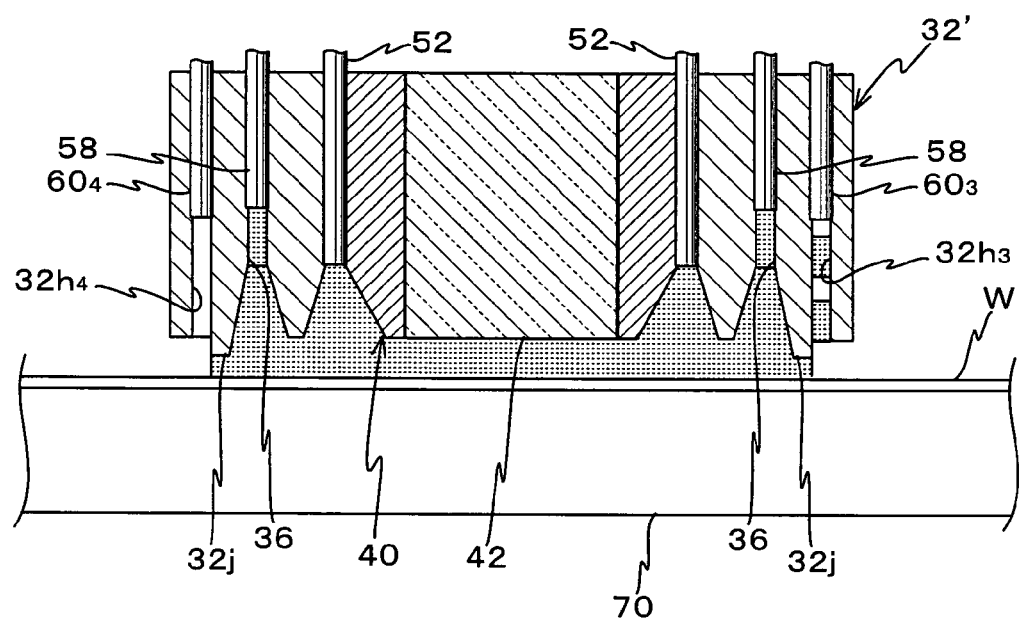
FIGS. 14A and 14B each show a modified example of the liquid supply/drainage unit.

For example, as in a liquid supply/drainage unit 32' shown in FIG. 14A, the unit may be structured without having the bubble recovery mechanism and the full recovery nozzle provided, and comprise only a widened nozzle section, supply nozzles 36, and supply pipes 58 that constitute the supply mechanism for supplying the water, a tapered nozzle section and recovery pipes 52 that constitute the recovery mechanism for collecting the water, and slits $32h_3$ and $32h_4$ that constitute the auxiliary recovery mechanism, and the like. In this case, with lens 42 as the center, the tapered nozzle section and recovery pipes 52 are provided in the periphery of lens 42, and the widened nozzle section, supply nozzles 36, and supply pipes 58 are disposed on the outer side of the tapered nozzle section and recovery pipes 52. In the case when liquid supply/drainage unit 32' shown in FIG. 14A is employed, when, for example, exposure is performed scanning the wafer from left to right, the water is supplied from supply pipes 58 on the left hand side via supply nozzles 36 and the widened nozzle section, and a part of the water supplied is drained and bubbles in the supplied water are exhausted by the tapered nozzle section and recovery pipes 52 on the left side of lens 42, which suppresses the bubbles from passing under lens 42. Meanwhile, the tapered nozzle section and recovery pipes 52 on the right side of lens 42 recover the water flowing below lens 42.

In this case, the tapered nozzle section, recovery pipes, widened nozzle section, supply nozzles 36, supply pipes 58, and the like described above do not necessarily have to be provided covering the entire periphery of lens 42, and for example, each one of them may be provided respectively on both ends in the scanning direction. Regarding this point, the same can be said for liquid supply/drainage unit 32 previously described.

Figure 14B:
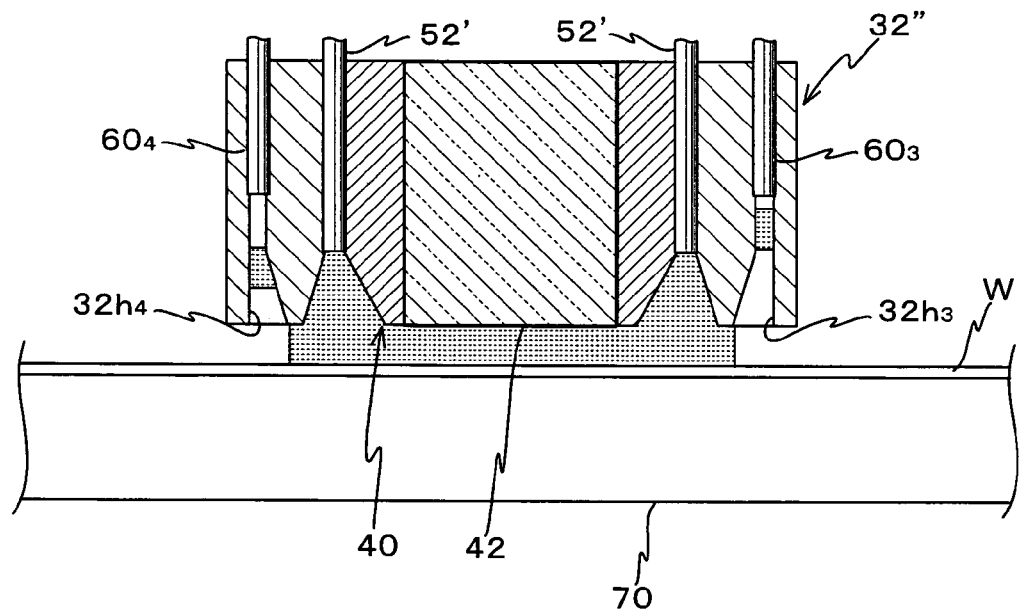

In addition, in each of the embodiments described above, the water supply and drainage by the liquid supply/drainage unit is performed using different nozzles. The present invention, however, is not limited to this, and for example, the water supply and drainage may be performed via water supply/drainage nozzles 52' as in a liquid supply/drainage unit 32" shown in FIG. 14B. In this case, when wafer stage WST is scanned, the water may be supplied from a water supply/drainage nozzle located in the rear side in the scanning direction and collected by a water supply/drainage nozzle located in the front side in the scanning direction. And, in this case, when bubbles are found in the water, they gather in the vicinity of the ceiling inside liquid supply/drainage unit 32" in the front side of lens 42 in the scanning direction, and when the scanning direction is reversed and the nozzles used for water supply and drainage are switched, the bubbles are exhausted from the water supply/drainage nozzle on the drainage side.

Figure 15:
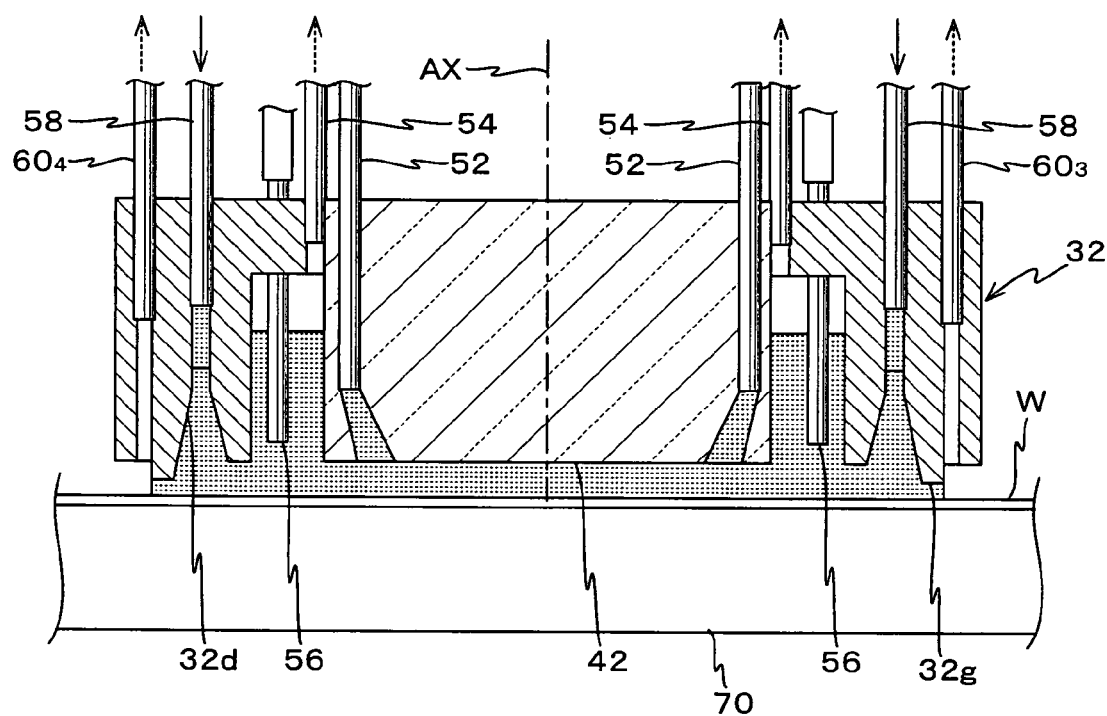
FIG. 15 is a view of a modified example of liquid recovery via a hole provided in a part of a projection lens.

Furthermore, in the exposure apparatus described in each of the embodiments above, in lens 42 located closest to wafer W among the lenses that constitutes projection optical system PL, for example, as is shown in FIG. 15, holes may be formed in the portion that is not used for exposure, and the liquid supply by the supply mechanism, or the liquid recovery or bubble recovery of bubbles in the liquid by the recovery mechanism may be performed via such holes. In the case shown in FIG. 15, the liquid is recovered through the holes formed in lens 42. When such an arrangement is employed, the space can be saved compared to the case when the supply mechanism and recovery mechanism are both arranged completely exterior to the projection optical system.

In each of the embodiments above, the case has been described where ultra pure water (water) is used as the liquid. As a matter of course, however, the present invention is not limited to this, and as the liquid, a liquid that is chemically stable, having high transmittance to illumination light IL, and safe to use, such as a fluorine containing inert liquid may be used. As such as a fluorine-containing inert liquid, for example, Florinert (trade name; manufactured by 3M) can be used. The fluorine-containing inert liquid is also excellent from the point of cooling effect. In addition, as the liquid, a liquid which has high transmittance to illumination light IL and a refractive index as high as possible, and furthermore, a liquid which is stable against the projection optical system and the photoresist coated on the surface of the wafer (for example, cederwood oil or the like) can also be used.

In addition, in the above embodiment, the liquid recovered may be reused, and in this case, a filter that removes impurities from the collected water is desirably provided in the liquid recovery unit, recovery pipes, and the like.

In each of the embodiments above, the case has been described where the optical element closest to the image plane of projection optical system PL is lens 42, however, the optical element is not limited to a lens and it may be an optical plate (plane-parallel plate) for adjusting the optical properties such as aberration (spherical aberration, coma, and the like) of projection optical system PL, or it may simply be a cover plate. The surface of the optical element closest to the image plane of projection optical system PL (lens 42 in each of the embodiments above) may be contaminated by scattered particles generated from the resist with the irradiation of illumination light IL or by coming into contact with the liquid (water in each of the embodiments above) containing impurities. Therefore, the optical element is fixed detachable (exchangeable) to the lowest section of barrel 40, and may be periodically exchanged.

In such a case, however, when the optical element coming into contact with the liquid is lens 42, the price of the exchanged component is high and the time required to complete the exchange operation is long, which increases the maintenance cost (running cost) as well as decreases the throughput. Therefore, the optical element coming into contact with the liquid may be, for example, a plane-parallel plate since it has a more reasonable price than lens 42. In this case, even in the case when matters (such as organic matters containing silicon) that reduce the transmittance of projection optical system PL, the illuminance of illumination light IL on wafer W, the uniformity of the illuminance distribution, or the like adhere to the plane-parallel plate at the time of transportation, assembly, adjustment, or the like of the exposure apparatus, the plane-parallel plate can be exchanged just before the liquid is supplied, and the cost merit also increases due to the less expensive exchange cost when compared with the case when using a lens for the optical element.

In addition, in each of the embodiments described above, the range where the liquid (water) flows can be set covering the entire projection area (irradiation area of illumination light IL) of the pattern area of the reticle, and its size may be optional, however, from the point such as flow speed, flow amount control, the range is preferably kept as small as possible by setting it only slightly larger than the irradiation area.

Furthermore, in each of the embodiments described above, auxiliary plates 22a to 22d are provided in the periphery of the area where wafer W is mounted on wafer holder 70, however, in the present invention, exposure apparatus that do not necessarily require an auxiliary plate or a flat plate that has a similar function on the substrate stage are available. In this case, however, it is preferable to further provide piping on the wafer stage for recovering the liquid so that the supplied liquid is not spilled from the substrate stage. In addition, in each of the embodiments above, the exposure apparatus is employed whose space between projection optical system PL and wafer W is locally filled with liquid. However, in the present invention, there are some parts that are applicable to an immersion exposure apparatus whose details are disclosed in, Japanese Patent Application Laid-open No. H06-124873, where a stage holding a substrate subject to exposure is moved in a liquid bath, or to an immersion exposure apparatus whose details are disclosed in, Japanese Patent Application Laid-open No. H10-303114, where a wafer is held in a liquid pool of a predetermined depth formed on a stage.

In each of the embodiments above, an ArF excimer laser is used as the light source. The present invention, however, is not limited to this, and an ultraviolet light source such as a KrF excimer laser (wavelength 248 nm) may also be used. In addition, for example, the ultraviolet light is not limited only to the laser beams emitted from each of the light sources referred to above, and a harmonic wave (for example, having a wavelength of 193 nm) may also be used that is obtained by amplifying a single-wavelength laser beam in the infrared or visible range emitted by a DFB semiconductor laser or fiber laser, with a fiber amplifier doped with, for example, erbium (Er) (or both erbium and ytterbium (Yb)), and by converting the wavelength into ultraviolet light using a nonlinear optical crystal.

In addition, projection optical system PL is not limited to a dioptric system, and a catadioptric system may also be used. Furthermore, the projection magnification is not limited to magnification such as ¼ or ⅕, and the magnification may also be 1/10 or the like.

In each of the embodiments described above, the case has been described where the present invention is applied to a scanning exposure apparatus based on the step-and-scan method. It is a matter of course, however, that the present invention is not limited to this. More specifically, the present invention can also be suitably applied to a reduction projection exposure apparatus based on a step-and-repeat method. In this case, besides the point that exposure is performed when both the mask (reticle) and the substrate (wafer) are substantially standing still, the exposure apparatus can basically employ a structure similar to the one described in the first embodiment and obtain the same effect. In addition, the present invention can also be applied to an exposure apparatus that comprises two wafer stages (twin stage type exposure apparatus).

The exposure apparatus in each of the embodiments described above can be made, first of all, by incorporating the illumination optical system made up of a plurality of lenses and projection unit PU into the main body of the exposure apparatus, and attaching the liquid supply/drainage unit to projection unit PU. Then, along with the optical adjustment operation, parts such as the reticle stage and the wafer stage made up of multiple mechanical parts are also attached to the main body of the exposure apparatus and the wiring and piping connected. And then, total adjustment (such as electrical adjustment and operation check) is performed, which completes the making of the exposure apparatus. The exposure apparatus is preferably built in a clean room where conditions such as the temperature and the degree of cleanliness are controlled.

In addition, in each of the embodiments described above, the case has been described where the present invention is applied to exposure apparatus used for manufacturing semiconductor devices. The present invention, however, is not limited to this, and it can be widely applied to an exposure apparatus for manufacturing liquid crystal displays which transfers a liquid crystal display deice pattern onto a square shaped glass plate, and to an exposure apparatus for manufacturing thin-film magnetic heads, imaging devices, micromachines, organic EL, DNA chips, or the like.

In addition, the present invention can also be suitably applied to an exposure apparatus that transfers a circuit pattern onto a glass substrate or a silicon wafer not only when producing microdevices such as semiconductors, but also when producing a reticle or a mask used in exposure apparatus such as an optical exposure apparatus, an EUV exposure apparatus, an X-ray exposure apparatus, or an electron beam exposure apparatus. Normally, in the exposure apparatus that uses DUV (deep (far) ultraviolet) light or VUV (vacuum ultraviolet) light, it uses a transmittance type reticle, and as the reticle substrate, materials such as silica glass, fluorine-doped silica glass, fluorite, magnesium fluoride, or crystal are used.

<<Device Manufacturing Method>>

An embodiment is described below of a device manufacturing method in the case where the exposure apparatus described above is used in a lithographic process.

Figure 16:
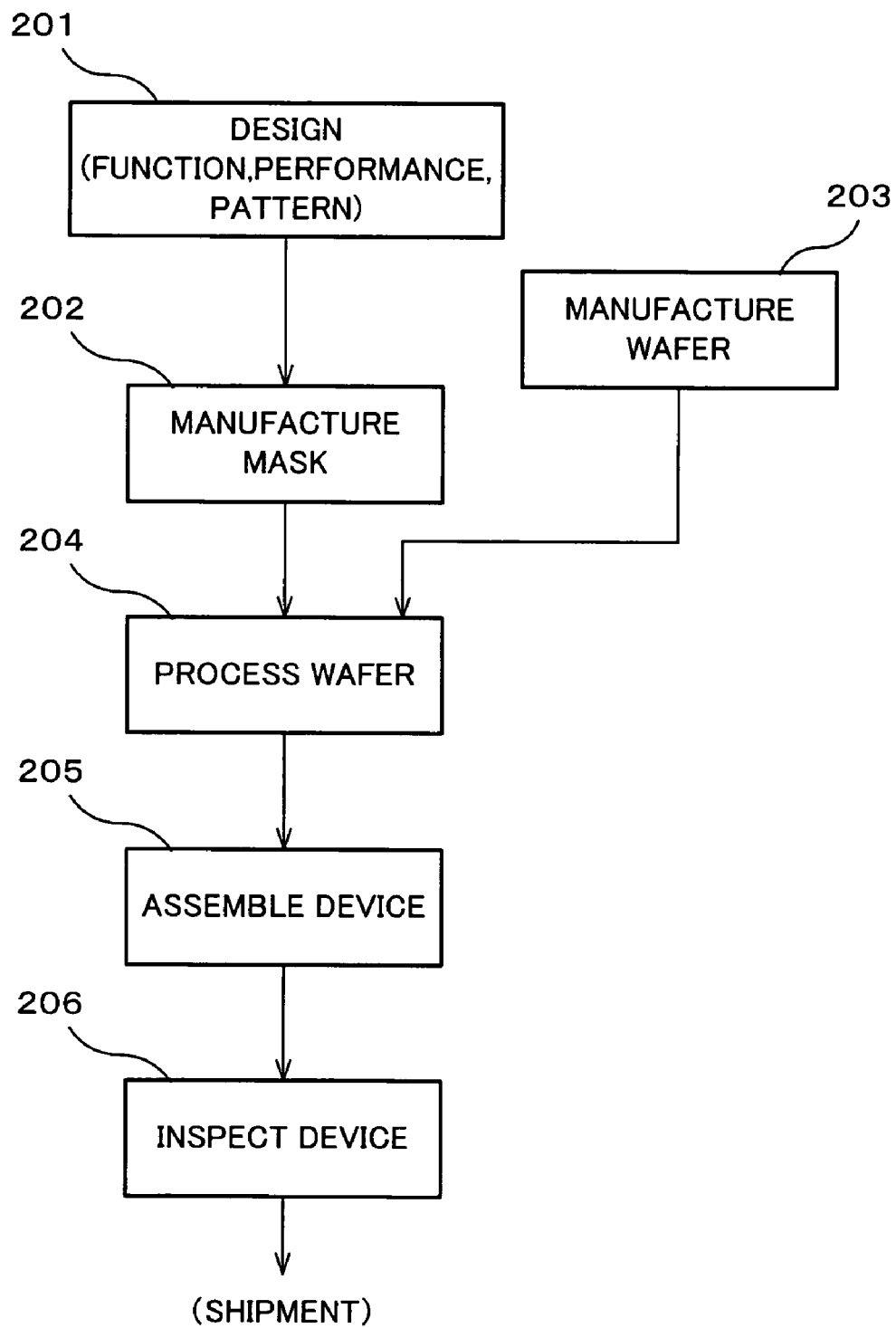
FIG. 16 is a flow chart for explaining an embodiment of a device manufacturing method according to the present invention.

FIG. 16 shows a flow chart of an example when manufacturing a device (like an IC or an LSI as in a semiconductor chip, a liquid crystal panel, a CCD, a thin magnetic head, a micromachine, or the like). As is shown in FIG. 16, in step 201 (design step), the function/performance design of a device (for example, designing a circuit for a semiconductor device) is performed, and pattern design to implement such function is performed. Then, in step 202 (mask manufacturing step), a mask on which the designed circuit pattern is formed is manufactured, whereas, in step 203 (wafer manufacturing step), a wafer is manufactured using materials such as silicon.

Next, in step 204 (wafer processing step), the actual circuit or the like is formed on the wafer by lithography or the like in a manner which will be described later on, using the mask and wafer prepared in steps 201 to 203. Then, in step 205 (device assembly step), device assembly is performed using the wafer processed in step 204. Step 205 includes processes such as the dicing process, the bonding process, and the packaging process (chip encapsulation) when necessary.

Finally, in step 206 (inspection step), tests on operation, durability, and the like are performed on the devices made in step 205. After these steps, the devices are completed and shipped out.

Figure 17:
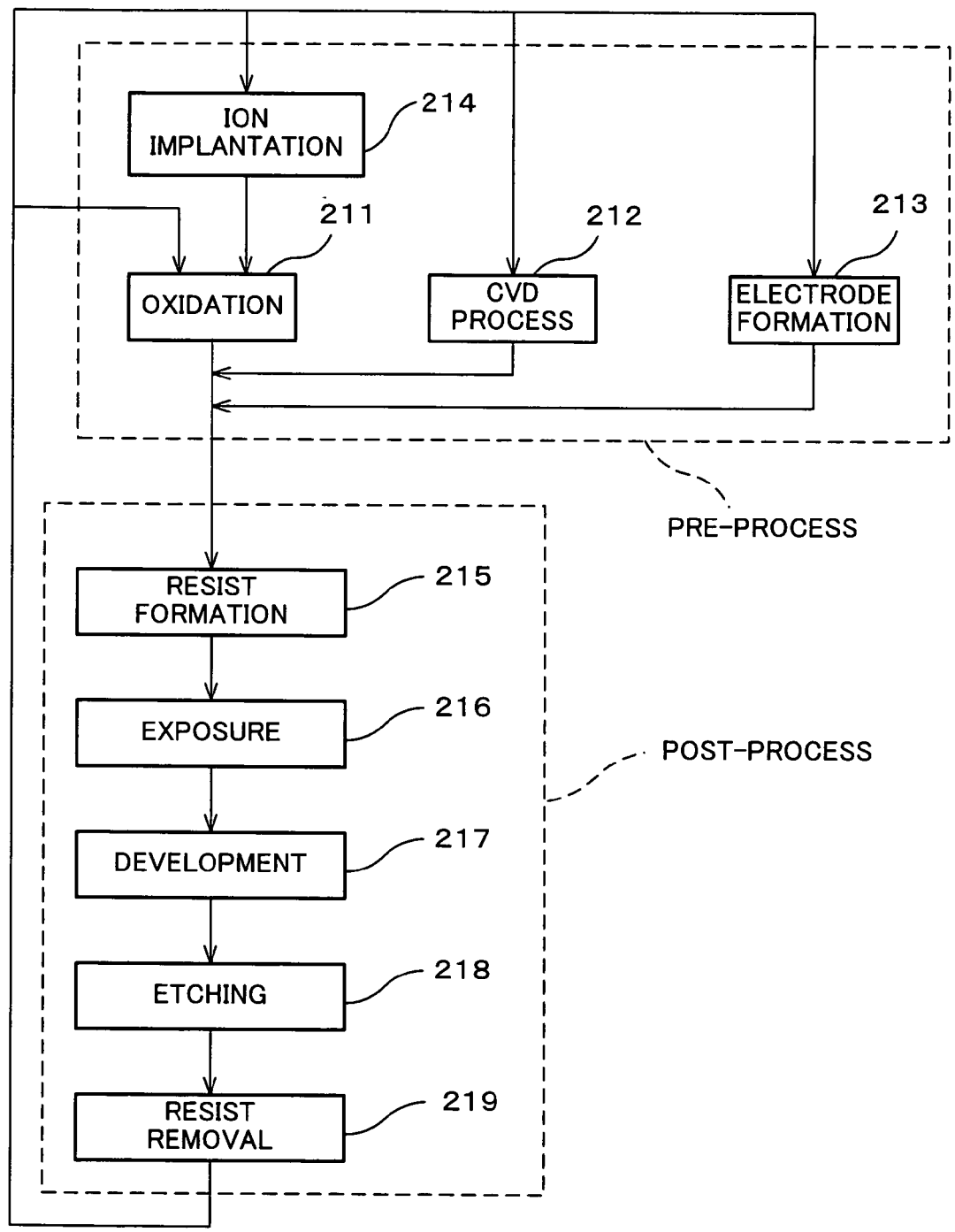
FIG. 17 is a flow chart for showing a process in step 204 in FIG. 16.

FIG. 17 is a flow chart showing a detailed example of step 204 described above when manufacturing a semiconductor device. Referring to FIG. 17, in step 211 (oxidation step), the surface of the wafer is oxidized. In step 212 (CVD step), an insulating film is formed on the wafer surface. In step 213 (electrode formation step), an electrode is formed on the wafer by vapor deposition. In step 214 (ion implantation step), ions are implanted into the wafer. Steps 211 to 214 described above make up a pre-process in each stage of wafer processing, and the necessary processing is chosen and is executed at each stage.

When the above pre-process is completed in each stage of wafer processing, a post-process is executed in the manner described below. In this post-process, first, in step 215 (resist formation step), the wafer is coated with a photosensitive agent. Next, in step 216 (exposure step), the circuit pattern on the mask is transferred onto the wafer by the exposure apparatus and the exposure method described above. And, in step 217 (development step), the wafer that has been exposed is developed. Then, in step 218 (etching step), an exposed member of an area other than the area where the resist remains is removed by etching. Finally, in step 219 (resist removing step), when etching is completed, the resist that is no longer necessary is removed.

By repeatedly performing such pre-process and post-process, multiple circuit patterns are formed on the wafer.

When the device manufacturing method described in this embodiment is used, because the exposure apparatus described in the embodiments above is used in the exposure process (step 216), the pattern of the reticle can be transferred on the wafer with good accuracy. As a consequence, the productivity (including the yield) of highly integrated microdevices can be improved.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure apparatus that illuminates a pattern with an energy beam and transfers the pattern onto a substrate via a projection optical system, the exposure apparatus comprising:

a substrate stage on which the substrate is mounted that moves within a two-dimensional plane holding the substrate;

a supply system that supplies liquid to locally fill a space between the projection optical system and the substrate on the substrate stage with the liquid, so as to form an immersion area having a size smaller than a surface of the substrate that is subjected to exposure;

a recovery system that recovers the liquid; and a plate provided in at least a part of the periphery of a mounted area of the substrate on the substrate stage, the plate having a surface arranged at substantially a same height as a surface of the substrate mounted on said substrate stage, wherein when an exposure operation is suspended, the liquid supplied by the supply system is held between the projection optical system and the surface of the plate.

2. The exposure apparatus of claim 1, wherein a gap formed between the plate and the substrate is set to no more than 3 mm.

3. The exposure apparatus of claim 1, the exposure apparatus further comprising:

an interferometer that measures a position of the substrate stage; and a conditioning system that performs environment conditioning in a periphery of the liquid between the projection optical system and the substrate.

4. The exposure apparatus of claim 1, wherein the liquid supply by the supply system begins on the plate.

5. The exposure apparatus of claim 1, the exposure apparatus further comprising:

a control system that stops both liquid supply operation by the supply system and liquid recovery operation by the recovery system when the substrate stage remains stationary.

6. The exposure apparatus of claim 1, wherein
the supply system supplies liquid to the space between the projection optical system and the substrate on the substrate stage from the front side in a moving direction of the substrate.

7. The exposure apparatus of claim 1, wherein
the supply system supplies liquid to the space between the projection optical system and the substrate on the substrate stage from the rear side in a moving direction of the substrate.

8. The exposure apparatus of claim 1, the exposure apparatus further comprising:
a drive system that drives the substrate stage in a predetermined scanning direction with respect to the energy beam to transfer the pattern onto said substrate in a scanning exposure method.

9. The exposure apparatus of claim 1, the exposure apparatus further comprising:
at least one bubble recovery system that recovers bubbles in the liquid at the rear side of the projection optical system in a moving direction of the substrate.

10. A device manufacturing method including a lithographic process, wherein
in the lithographic process, a device pattern is transferred onto a substrate using an exposure apparatus in claim 1.

11. An exposure apparatus that illuminates a pattern with an energy beam and transfers the pattern onto a substrate via a projection optical system, the exposure apparatus comprising:
a substrate stage on which the substrate is mounted that moves within a two-dimensional plane holding the substrate;
a supply system that supplies liquid to a space between the projection optical system and the substrate on the substrate stage; and
a recovery system that recovers the liquid, wherein
when the substrate stage remains stationary relative to the projection optical system, both liquid supply operation by the supply system and liquid recovery operation by the recovery system are stopped while the liquid remains in contact with the projection optical system.

12. The exposure apparatus of claim 11, wherein
the supply system supplies liquid to the space between the projection optical system and the substrate on the substrate stage from the front side in a moving direction of the substrate.

13. The exposure apparatus of claim 11, wherein
the supply system supplies liquid to the space between the projection optical system and the substrate on the substrate stage from the rear side in a moving direction of the substrate.

14. The exposure apparatus of claim 11, the exposure apparatus further comprising:
a drive system that drives the substrate stage in a predetermined scanning direction with respect to the energy beam to transfer the pattern onto the substrate in a scanning exposure method.

15. The exposure apparatus of claim 11, the exposure apparatus further comprising:
at least one bubble recovery system that recovers bubbles in the liquid at the rear side of the projection optical system in a moving direction of the substrate.

16. The exposure apparatus of claim 11, the exposure apparatus further comprising:
a peripheral wall that surrounds at least an optical element closest to the substrate constituting the projection optical system, and also forms a predetermined clearance with respect to a surface of the substrate on the substrate stage, wherein
the supply system supplies the liquid inside the peripheral wall at a position adjacent to an end section of the projection optical system on the substrate side.

17. A device manufacturing method including a lithographic process, wherein
in the lithographic process, a device pattern is transferred onto a substrate using an exposure apparatus in claim 11.

18. An exposure apparatus that illuminates a pattern with an energy beam and transfers the pattern onto a plurality of divided areas on a substrate respectively, via a projection optical system, the exposure apparatus comprising:
a substrate stage on which the substrate is mounted that moves within a two-dimensional plane holding the substrate;
a peripheral wall that surrounds at least an optical element closest to the substrate constituting the projection optical system, and also forms a predetermined clearance with respect to a surface of the substrate on the substrate stage;
at least one supply system that supplies liquid inside the peripheral wall from a rear side in a moving direction of the substrate, the liquid contacting the substrate and the optical element closest to the substrate; and
a recovery system that recovers the liquid at a front side of the projection optical system in the moving direction of the substrate.

19. The exposure apparatus of claim 18, wherein
the supply system has a plurality of supply ports in the periphery of an irradiation area on the substrate where the energy beam is irradiated via the pattern and the projection optical system during exposure, and switches the supply port used for supplying the liquid in accordance with the moving direction of the substrate.

20. The exposure apparatus of claim 18, the exposure apparatus further comprising:
a drive system that drives the substrate stage in a predetermined scanning direction with respect to the energy beam to transfer the pattern onto the substrate in a scanning exposure method.

21. The exposure apparatus of claim 20, wherein
the supply system has first and second liquid inlets provided on first and second opposite sides of the irradiation area in the scanning direction, respectively, and
the supply system switches between the first and second inlets that supply the liquid in accordance with the scanning direction of the substrate.

22. The exposure apparatus of claim 18, the exposure apparatus further comprising:
a plate provided in at least a part of the periphery of a mounted area of the substrate on the substrate stage, the plate having a surface arranged at substantially a same height as a surface of the substrate mounted on the substrate stage.

23. The exposure apparatus of claim 18, the exposure apparatus further comprising:
at least one bubble recovery system that recovers bubbles in the liquid at the rear side of the projection optical system in the moving direction of the substrate.

24. A device manufacturing method including a lithographic process, wherein
in the lithographic process, a device pattern is transferred onto a substrate using an exposure apparatus in claim 18.

25. An exposure apparatus that illuminates a pattern with an energy beam, moves a substrate in a predetermined scanning direction, and transfers the pattern onto a plurality of divided areas on the substrate via a projection optical system in a scanning exposure method, the exposure apparatus comprising:

a substrate stage on which the substrate is mounted that moves within a two-dimensional plane holding the substrate;

a peripheral wall that surrounds at least an optical element closest to the substrate constituting the projection optical system, and also forms a predetermined clearance with respect to a surface of the substrate on the substrate stage;

a supply system that supplies liquid inside the peripheral wall, the liquid contacting the substrate and the optical element closest to the substrate; and a recovery system that recovers at least a part of the liquid from an inside of the peripheral wall.

26. The exposure apparatus of claim 25, wherein a chamber defined inside of the peripheral wall and above the liquid has a negative pressure.

27. The exposure apparatus of claim 25, wherein when the substrate stage holding the substrate is moving, the liquid supply by the supply system and the liquid recovery by the recovery system are performed.

28. The exposure apparatus of claim 25, wherein when the substrate stage holding the substrate is stationary, liquid supply operation by the supply system and liquid recovery operation by the recovery system are suspended, and a state where the liquid is held within the peripheral wall is maintained.

29. The exposure apparatus of claim 25, wherein the predetermined clearance is set to no more than 3 mm.

30. A device manufacturing method including a lithographic process, wherein in the lithographic process, a device pattern is transferred onto a substrate using an exposure apparatus in claim 25.

31. An exposure apparatus that transfers a predetermined pattern on a substrate via a projection optical system in a state where a space between the projection optical system and the substrate is filled with liquid, wherein in the case multiple exposure is performed, a first pattern is transferred onto a divided area on the substrate, and subsequently a second pattern is also transferred onto the divided area on the substrate, the liquid being held between the projection optical system and the substrate during a time period between the transfer of the first and second patterns.

32. A device manufacturing method including a lithographic process, wherein in the lithographic process, a device pattern is transferred onto a substrate using an exposure apparatus in claim 31.

33. An exposure apparatus that illuminates a pattern with an energy beam and transfers the pattern onto a substrate via a projection optical system and liquid while locally holding the liquid on an image plane side of the projection optical system, the exposure apparatus comprising:

a supply system that supplies liquid to the image plane side of the projection optical system so as to form an immersion area having a size smaller than a surface of the substrate that is subjected to exposure;

a recovery system that recovers the liquid supplied by the supply system;

a substrate stage on which the substrate is mounted that moves within a two-dimensional plane holding the substrate, wherein the substrate stage has a flat section which is substantially flush with a surface of the substrate held on the substrate stage, and the liquid supplied by the supply system is held between the projection optical system and the flat section of the substrate stage during a time period between exposures of substrates.

34. The exposure apparatus of claim 33, wherein the flat section is made up of a plurality of members.

35. The exposure apparatus of claim 33, wherein the substrate stage has a reference member on which reference marks are formed, and an upper surface of the reference member is substantially flush with the flat section.

36. The exposure apparatus of claim 33, wherein the projection optical system and the flat section face each other to keep on holding the liquid on the image plane side of the projection optical system when exposure operation for the substrate is suspended.

37. The exposure apparatus of claim 33, wherein:

the substrate stage is moved to a predetermined position after exposure has been completed for the substrate held on the substrate stage to make the projection optical system and the flat section face each other, and then at the position, liquid recovery by the recovery system is performed and after the liquid has been recovered, the substrate for which exposure has been completed is unloaded from the substrate stage.

38. The exposure apparatus of claim 33, the exposure apparatus further comprising:

an exhaust system that exhausts gas on an image plane side of the projection optical system, wherein the supply system begins supplying the liquid in parallel with exhausting operation of the exhaust system.

39. The exposure apparatus of claim 33, wherein the supply system begins supplying the liquid in a state where the projection optical system and the flat section are facing each other.

40. The exposure apparatus of claim 33, the exposure apparatus further comprising:

a control system that controls movement of the substrate stage based on at least one of temperature information of the liquid and pressure information of the liquid.

41. The exposure apparatus of claim 40, wherein the control system controls movement of the substrate stage based on at least one of temperature information of the liquid and pressure information of the liquid to make an image plane formed by the projection optical system and a surface of the substrate substantially coincide with each other.

42. A device manufacturing method including a lithographic process, wherein in the lithographic process, a device pattern is transferred onto a substrate using an exposure apparatus in claim 33.

43. An exposure apparatus that illuminates a pattern with an energy beam and transfers the pattern onto a substrate via a projection optical system and liquid while locally holding the liquid on an image plane side of the projection optical system so as to form an immersion area having a size smaller than a surface of the substrate that is subjected to exposure, the exposure apparatus comprising:

a substrate stage on which the substrate is mounted that moves within a two-dimensional plane holding the substrate, wherein the substrate stage has a flat section substantially flush with a surface of the substrate held on the substrate stage, and when exposure operation is suspended, the projection optical system and the flat section face each other to keep on holding the liquid on the image plane side of the projection optical system.

44. The exposure apparatus of claim 43, wherein
the liquid is held between the projection optical system and the flat section when a substrate is loaded onto the substrate stage.

45. The exposure apparatus of claim 43, wherein
the liquid is held between the projection optical system and the flat section when a substrate is unloaded from the substrate stage.

46. A device manufacturing method including a lithographic process, wherein
in the lithographic process, a device pattern is transferred onto a substrate using an exposure apparatus in claim 43.

* * * * *